(12) United States Patent
Sakhnini et al.

(10) Patent No.: US 11,677,491 B2
(45) Date of Patent: Jun. 13, 2023

(54) CODING TECHNIQUES FOR REFERENCE SIGNAL INDEX MODULATION COMMUNICATIONS

(71) Applicant: QUALCOMM Incorporated, San Diego, CA (US)

(72) Inventors: Iyab Issam Sakhnini, San Diego, CA (US); Tao Luo, San Diego, CA (US); Peter Gaal, San Diego, CA (US); Wanshi Chen, San Diego, CA (US); Juan Montojo, San Diego, CA (US); Junyi Li, Chester, NJ (US); Mahmoud Taherzadeh Boroujeni, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 210 days.

(21) Appl. No.: 17/111,404

(22) Filed: Dec. 3, 2020

(65) Prior Publication Data

US 2022/0182171 A1  Jun. 9, 2022

(51) Int. Cl.
*H04L 1/00* (2006.01)
*H04L 5/00* (2006.01)
*H04L 27/26* (2006.01)
*H03M 13/13* (2006.01)
*H04L 1/08* (2006.01)

(52) U.S. Cl.
CPC .......... *H04L 1/0005* (2013.01); *H03M 13/13* (2013.01); *H04L 1/0061* (2013.01); *H04L 1/08* (2013.01); *H04L 5/0023* (2013.01); *H04L 5/0048* (2013.01); *H04L 5/0051* (2013.01); *H04L 27/265* (2013.01)

(58) Field of Classification Search
None
See application file for complete search history.

(56) References Cited

U.S. PATENT DOCUMENTS

| | | | |
|---|---|---|---|
| 2013/0301434 A1* | 11/2013 | Krishnamurthy | H04L 5/0053 370/252 |
| 2015/0288483 A1* | 10/2015 | Sun | H04L 5/0048 370/329 |
| 2020/0021393 A1* | 1/2020 | Noh | H04L 1/0057 |
| 2020/0021414 A1* | 1/2020 | Ding | H04L 1/00 |
| 2022/0007400 A1* | 1/2022 | Zhang | H04L 5/0053 |

\* cited by examiner

*Primary Examiner* — Walter J Divito
(74) *Attorney, Agent, or Firm* — Holland & Hart LLP

(57) ABSTRACT

Methods, systems, and devices for wireless communication are described that support communication of information buts based on reference signal index modulation (RS-IM). A base station and a UE may transmit a number of downlink and uplink information bits (e.g., downlink control bits, uplink control bits) using index modulation schemes applied on references signals. A base station and a UE may transmit reference signal transmissions using reference signal index modulation, in which a set of information bits may be encoded using one or more coding techniques, in conjunction with RS-IM techniques, to enhance reliability of some or all of the information bits. Error detection bits may be added to the information bits, and included when coding is performed. Coding may include channel coding, repetition of reference signals for combining at a receiving device, or any combinations thereof.

30 Claims, 25 Drawing Sheets

CODING TECHNIQUES FOR REFERENCE SIGNAL INDEX MODULATION COMMUNICATIONS

FIELD OF TECHNOLOGY

The following relates to wireless communication, including coding techniques for reference signal index modulation communications.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform spread orthogonal frequency division multiplexing (DFT-S-OFDM).

A wireless multiple-access communications system may include one or more base stations or one or more network access nodes, each simultaneously supporting communication for multiple communication devices, which may be otherwise known as user equipment (UE). In some systems, one or more UEs may be configured to support wireless communication of information bits using various index modulation schemes. When using index modulation schemes, the UEs may use resources for embedding information bits into a signal. The resources may be physical resources (e.g., antenna, subcarrier, time slot, and frequency carrier) or virtual resources (e.g., virtual parallel channels, signal constellation, space-time matrix, and antenna activation orders). In some cases, the information bits may have reliability targets related to the type of information that is being transmitted. It therefore may be desirable to provide index modulation schemes with reliable wireless communication of information bits, among other aspects.

SUMMARY

Various aspects of the present disclosure relate to configuring a communication device, for example, a base station (e.g., a NodeB, an eNodeB (eNB), a next-generation NodeB (gNB) or a UE, to support transmitting and receiving information bits according to one or more index modulation schemes. For example, the communication device may support conveying information bits using a reference signal index modulation scheme, which uses reference signals transmissions using particular resources or reference signal sequences, or both, to convey the information bits. The communication device may improve reliability and flexibility of information transmission using a reference signal index modulation scheme by providing coding of information bits that are transmitted. By using enhanced reliability multimode reference signal index modulation schemes as discussed herein, the communication device may, as a result, include features for improvements to conveying information bits and, in some examples, may promote enhanced efficiency for higher reliability and lower latency wireless communications in wireless systems (e.g., 5G systems), among other benefits.

A method for wireless communication at a transmitting device is described. The method may include identifying a set of information bits to be transmitted to a receiving device via one or more reference signals using a reference signal index modulation scheme, where the reference signal index modulation scheme uses one or more activation states of the one or more reference signal transmissions to indicate one or more transmitted bits, coding the set of information bits to generate an encoded set of bits for transmission using the reference signal index modulation scheme, and transmitting the encoded set of bits to the receiving device using the reference signal index modulation scheme.

An apparatus for wireless communication at a transmitting device is described. The apparatus may include a processor, memory in electronic communication with the processor, and instructions stored in the memory. The instructions may be executable by the processor to cause the apparatus to identify a set of information bits to be transmitted to a receiving device via one or more reference signals using a reference signal index modulation scheme, where the reference signal index modulation scheme uses one or more activation states of the one or more reference signal transmissions to indicate one or more transmitted bits, code the set of information bits to generate an encoded set of bits for transmission using the reference signal index modulation scheme, and transmit the encoded set of bits to the receiving device using the reference signal index modulation scheme.

Another apparatus for wireless communication at a transmitting device is described. The apparatus may include means for identifying a set of information bits to be transmitted to a receiving device via one or more reference signals using a reference signal index modulation scheme, where the reference signal index modulation scheme uses one or more activation states of the one or more reference signal transmissions to indicate one or more transmitted bits, means for coding the set of information bits to generate an encoded set of bits for transmission using the reference signal index modulation scheme, and means for transmitting the encoded set of bits to the receiving device using the reference signal index modulation scheme.

A non-transitory computer-readable medium storing code for wireless communication at a transmitting device is described. The code may include instructions executable by a processor to identify a set of information bits to be transmitted to a receiving device via one or more reference signals using a reference signal index modulation scheme, where the reference signal index modulation scheme uses one or more activation states of the one or more reference signal transmissions to indicate one or more transmitted bits, code the set of information bits to generate an encoded set of bits for transmission using the reference signal index modulation scheme, and transmit the encoded set of bits to the receiving device using the reference signal index modulation scheme.

In some examples of the method, apparatuses, and non-transitory computer-readable medium described herein, the coding may include operations, features, means, or instructions for channel coding the set of information bits to generate the encoded set of bits and providing the encoded set of bits to a reference signal index modulator to generate the one or more reference signal transmissions that indicate the encoded set of bits. In some examples of the method, apparatuses, and non-transitory computer-readable medium described herein, the channel coding includes polar coding, convolutional coding, block coding, repetition coding, or any combinations thereof. In some examples of the method, apparatuses, and non-transitory computer-readable medium described herein, the coding may include operations, features, means, or instructions for mapping the encoded set of bits into two or more subsets of encoded bits including a first subset of encoded bits that may be conveyed implicitly based on an index usage or activation pattern of the one or more reference signals, and a second subset of encoded bits that may be modulated on the one or more reference signals.

In some examples of the method, apparatuses, and non-transitory computer-readable medium described herein, the coding may include operations, features, means, or instructions for determining a repetition pattern for the set of information bits, where the repetition pattern includes one or more of time repetition, repetition in different spatial resources, repetition in different frequency resources, or any combinations thereof and mapping the set of information bits to an index usage or activation pattern of the one or more reference signals according to the repetition pattern.

In some examples of the method, apparatuses, and non-transitory computer-readable medium described herein, the one or more reference signals may be transmitted using a set of reference signal resources, and where a first instance of a first subset of the set of information bits may be transmitted using a first subset of the set of reference signal resources and a second instance of the first subset of the set of information bits may be transmitted using a second subset of the set of reference signal resources.

In some examples of the method, apparatuses, and non-transitory computer-readable medium described herein, the coding may include operations, features, means, or instructions for interleaving the encoded set of bits across a set of reference signal resources. In some examples of the method, apparatuses, and non-transitory computer-readable medium described herein, the coding may include operations, features, means, or instructions for appending one or more error detection bits to the set of information bits.

In some examples of the method, apparatuses, and non-transitory computer-readable medium described herein, the coding may include operations, features, means, or instructions for coding a first subset of the set of information bits using a first coding scheme that may be selected based on a first reliability target of the first subset and coding a second subset of the set of information bits using a second coding scheme that may be selected based on a second reliability target of the second subset. In some examples of the method, apparatuses, and non-transitory computer-readable medium described herein, the first subset of the set of information bits further include one or more error detection bits that may be determined based on the first reliability target and the second subset of the set of information bits further include one or more error detection bits that are determined based on the second reliability target.

In some examples of the method, apparatuses, and non-transitory computer-readable medium described herein, the coding may include operations, features, means, or instructions for segmenting the encoded set of bits into two or more subsets of encoded bits and providing the two or more subsets of encoded bits to an index modulator for transmission to the receiving device using the reference signal index modulation scheme.

Some examples of the method, apparatuses, and non-transitory computer-readable medium described herein may further include operations, features, means, or instructions for receiving, from the receiving device, an indication of a requested mapping of the set of information bits into two or more subsets of information bits, a requested level of coding for the two or more subsets of information bits, or any combinations thereof.

A method for wireless communication at a receiving device is described. The method may include receiving, from a transmitting device, one or more reference signal transmissions that are modulated according to a reference signal index modulation scheme, where the reference signal index modulation scheme uses one or more activation states of the one or more reference signal transmissions to indicate one or more information bits, demodulating an encoded set of bits from the one or more reference signal transmissions based on the reference signal index modulation scheme, and decoding the encoded set of bits to determine a set of information bits from the transmitting device.

An apparatus for wireless communication at a receiving device is described. The apparatus may include a processor, memory in electronic communication with the processor, and instructions stored in the memory. The instructions may be executable by the processor to cause the apparatus to receive, from a transmitting device, one or more reference signal transmissions that are modulated according to a reference signal index modulation scheme, where the reference signal index modulation scheme uses one or more activation states of the one or more reference signal transmissions to indicate one or more information bits, demodulate an encoded set of bits from the one or more reference signal transmissions based on the reference signal index modulation scheme, and decode the encoded set of bits to determine a set of information bits from the transmitting device.

Another apparatus for wireless communication at a receiving device is described. The apparatus may include means for receiving, from a transmitting device, one or more reference signal transmissions that are modulated according to a reference signal index modulation scheme, where the reference signal index modulation scheme uses one or more activation states of the one or more reference signal transmissions to indicate one or more information bits, means for demodulating an encoded set of bits from the one or more reference signal transmissions based on the reference signal index modulation scheme, and means for decoding the encoded set of bits to determine a set of information bits from the transmitting device.

A non-transitory computer-readable medium storing code for wireless communication at a receiving device is described. The code may include instructions executable by a processor to receive, from a transmitting device, one or more reference signal transmissions that are modulated according to a reference signal index modulation scheme, where the reference signal index modulation scheme uses one or more activation states of the one or more reference signal transmissions to indicate one or more information bits, demodulate an encoded set of bits from the one or more reference signal transmissions based on the reference signal index modulation scheme, and decode the encoded set of bits to determine a set of information bits from the transmitting device.

In some examples of the method, apparatuses, and non-transitory computer-readable medium described herein, the decoding may be based on a channel coding scheme applied to the set of information bits prior to being modulated according to the reference signal index modulation scheme. In some examples of the method, apparatuses, and non-transitory computer-readable medium described herein, the channel coding scheme includes polar coding, convolutional coding, block coding, repetition coding, or any combinations thereof.

In some examples of the method, apparatuses, and non-transitory computer-readable medium described herein, the decoding may include operations, features, means, or instructions for determining the set of information bits based on a mapping between a first subset of the encoded set of bits and an index usage or activation pattern of the one or more reference signals and determining a second subset of encoded bits that may be modulated on the one or more reference signals.

In some examples of the method, apparatuses, and non-transitory computer-readable medium described herein, the decoding may include operations, features, means, or instructions for determining a repetition pattern for the set of information bits, where the repetition pattern includes one or more of time repetition, repetition in different spatial resources, repetition in different frequency resources, or any combinations thereof and determining the set of information bits based on a mapping between the set of information bits and an index usage or activation pattern of the one or more reference signals according to the repetition pattern.

In some examples of the method, apparatuses, and non-transitory computer-readable medium described herein, the one or more reference signals may be transmitted using a set of reference signal resources, and where a first instance of a first subset of the set of information bits may be transmitted using a first subset of the set of reference signal resources and a second instance of the first subset of the set of information bits may be transmitted using a second subset of the set of reference signal resources.

In some examples of the method, apparatuses, and non-transitory computer-readable medium described herein, the decoding may include operations, features, means, or instructions for deinterleaving the encoded set of bits that are interleaved across a set of reference signal resources. In some examples of the method, apparatuses, and non-transitory computer-readable medium described herein, the decoding may include operations, features, means, or instructions for identifying one or more error detection bits that are appended to the set of information bits and determining that the set of information bits are successfully decoded based on the one or more error detection bits.

In some examples of the method, apparatuses, and non-transitory computer-readable medium described herein, the decoding may include operations, features, means, or instructions for decoding a first subset of the set of information bits using a first coding scheme that is identified based on a first reliability target of the first subset and decoding a second subset of the set of information bits using a second coding scheme that is identified based on a second reliability target of the second subset. In some examples of the method, apparatuses, and non-transitory computer-readable medium described herein, the first subset of the set of information bits further include one or more error detection bits that are based on the first reliability target and the second subset of the set of information bits further include one or more error detection bits that are based on the second reliability target.

In some examples of the method, apparatuses, and non-transitory computer-readable medium described herein, the encoded set of bits may be segmented into two or more subsets of encoded bits that are modulated according to the reference signal index modulation scheme. Some examples of the method, apparatuses, and non-transitory computer-readable medium described herein may further include operations, features, means, or instructions for transmitting, to the transmitting device, an indication of a requested mapping of the set of information bits into two or more subsets of information bits, a requested level of coding for the two or more subsets of information bits, or any combinations thereof.

DETAILED DESCRIPTION

Figure 1:
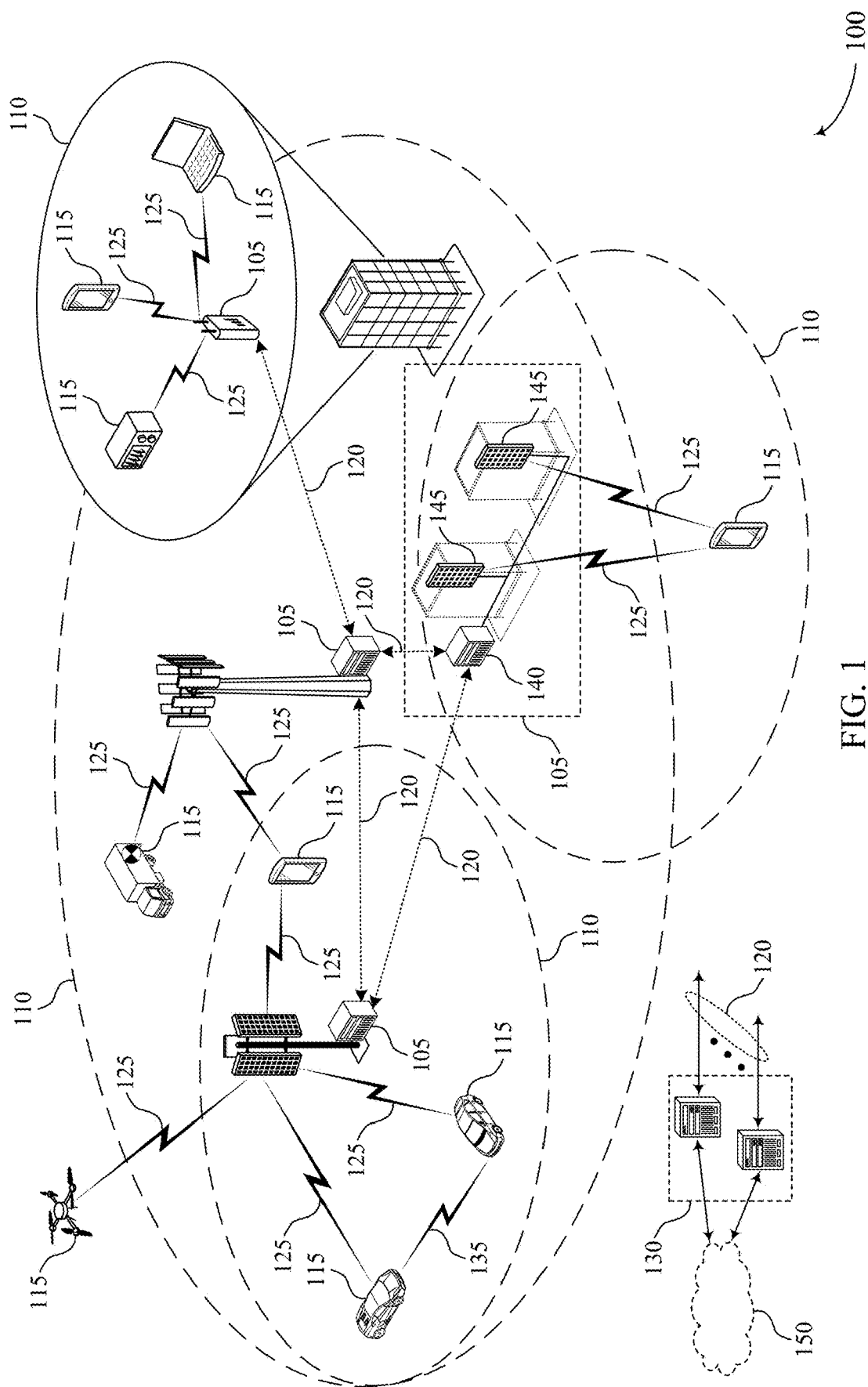
FIGS. 1 and 2 illustrate examples of a wireless communications system that supports coding techniques for reference signal index modulation communications in accordance with aspects of the present disclosure.

Various aspects of the present disclosure relate to configuring communication devices, such as a UEs, base stations, other network components, or combinations thereof, in a wireless communication system to support wireless communication using reference signal index modulation (RS-IM), in which information to be transmitted using RS-IM is coded to enhance reliability. A communication device may transmit reference signal transmissions (e.g., sounding reference signals (SRS), channel state information reference signals (CSI-RS), demodulation reference signals (DMRS), physical random access channel (PRACH), sidelink reference signals (SL-RS), etc.) using reference signal index modulation, in which a set of information bits are indicated based on reference signal resources, reference signal sequences, or combinations thereof. In some cases, information bits to be transmitted using RS-IM may be segmented into multiple subsets of information bits. A first subset may be conveyed implicitly via activation of subcarriers using frequency domain index modulation, activation of antennas via spatial domain index modulation, and/or activation of symbol periods in a time domain. In some cases, a second subset may be modulated using amplitude and phase modulation schemes, among other examples. In some cases, some or all of the information bits that are to be transmitted using RS-IM may have reliability targets that may not be achievable using RS-IM techniques alone. For example, certain higher-reliability bits may have a target block error rate (BLER) that is relatively low. Thus, RS-IM communications may have to be made reliable enough to meet such reliability targets. However, some index modulation schemes may not provide sufficient reliability.

In various aspects of the present disclosure, reliability of transmission of information bits using RS-IM may be enhanced by providing coding of information bits prior to index modulation using RS-IM techniques. In some cases, information bits may be channel coded prior to being provided to an RS-IM modulator. Further, in some cases, the channel coded bits may be interleaved in order to enhance time and/or frequency diversity, and further enhance reliability of the communication. In some aspects, the coding of the information bits may include time repetition of some or all of the information bits. For example, a transmitting device may map the information bits into the first subset of bits and/or second subset of bits, and repeat all of some of the reference signals. The receiver may combine (coherently or incoherently) the repeated reference signal(s) to improve the likelihood of successfully demodulating and decoding the information bits. Additionally or alternatively, the transmitting device may use spatial diversity (e.g., using multiple beams), time diversity, frequency diversity, or any combinations thereof, to provide multiple repetitions of some or all of the information bits. In some cases, the first subset of bits and the second subset of bits may use different coding techniques based on associated reliability targets. The communication device may, as a result, provide information bits using RS-IM transmissions that have a reliability that may be adjusted to meet associated reliability targets.

Additionally or alternatively, a receiving device may be configured to receive the reference signals (e.g., CSI-RS, DMRS, PRACH, SRS, SL-RS) and identify a sequence associated with the reference signals. The communication device may be configured to decode the reference signals to determine the information bits encoded in the reference signals using RS-IM. In some cases, the receiving device may decode the communications based on the type of coding used by the transmitting device. In some cases, the transmitting device and receiving device may exchange configuration communications that enables the coding technique(s), interleaving, error correction, or any combinations thereof. Further, in some cases, a receiving device may provide a request to the transmitting device for a preferred RS-IM mapping (e.g., a mapping of the first and second subsets of information bits), and a preferred level of coding for the information bits or each subset of information bits.

Aspects of the present disclosure may be implemented to realize one or more of the following potential improvements, among others. The present disclosure may provide benefits and enhancements to the operation of the communication device. For example, operations performed by the communication device may provide improvements to reliability of communications using reference signal index modulation. In some examples, by configuring the communication device to efficiently use reference signal resources, the communication device may lower latency for conveying information bits using multi-mode reference signal index modulation. In some other examples, configuring the communication device to support coding of information transmitted using reference signal index modulation may support improvements to power saving for the communication device. For example, the communication device may increase its battery life by providing efficient wireless communication (e.g., conveying information bits with fewer retransmissions), as a result of enhancing reliability for multi-mode reference signal index modulation.

Aspects of the disclosure are initially described in the context of wireless communications systems. Aspects of the disclosure are further illustrated by and described with reference to apparatus diagrams, system diagrams, and flowcharts that relate to coding techniques for reference signal index modulation communications.

FIG. 1 illustrates an example of a wireless communications system 100 that supports coding techniques for reference signal index modulation communications in accordance with aspects of the present disclosure. The wireless communications system 100 may include one or more base stations 105, one or more UEs 115, and a core network 130. In some examples, the wireless communications system 100 may be a Long Term Evolution (LTE) network, an LTE-Advanced (LTE-A) network, an LTE-A Pro network, or a New Radio (NR) network. In some examples, the wireless communications system 100 may support enhanced broadband communications, ultra-reliable (e.g., mission critical) communications, low latency communications, communications with low-cost and low-complexity devices, or any combination thereof.

The base stations 105 may be dispersed throughout a geographic area to form the wireless communications system 100 and may be devices in different forms or having different capabilities. The base stations 105 and the UEs 115 may wirelessly communicate via one or more communication links 125. Each base station 105 may provide a coverage area 110 over which the UEs 115 and the base station 105 may establish one or more communication links 125. The coverage area 110 may be an example of a geographic area over which a base station 105 and a UE 115 may support the communication of signals according to one or more radio access technologies.

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115, the base stations 105, or network equipment (e.g., core network nodes, relay devices, integrated access and backhaul (IAB) nodes, or other network equipment), as shown in FIG. 1.

The base stations 105 may communicate with the core network 130, or with one another, or both. For example, the base stations 105 may interface with the core network 130 through one or more backhaul links 120 (e.g., via an S1, N2, N3, or other interface). The base stations 105 may communicate with one another over the backhaul links 120 (e.g., via an X2, Xn, or other interface) either directly (e.g., directly between base stations 105), or indirectly (e.g., via core network 130), or both. In some examples, the backhaul links 120 may be or include one or more wireless links.

One or more of the base stations 105 described herein may include or may be referred to by a person having ordinary skill in the art as a base transceiver station, a radio base station, an access point, a radio transceiver, a NodeB, an eNodeB (eNB), a next-generation NodeB or a giga-NodeB (either of which may be referred to as a gNB), a Home NodeB, a Home eNodeB, or other suitable terminology.

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the base stations 105 and the network equipment including macro eNBs or gNBs, small cell eNBs or gNBs, or relay base stations, among other examples, as shown in FIG. 1.

The UEs 115 and the base stations 105 may wirelessly communicate with one another via one or more communication links 125 over one or more carriers. The term "carrier" may refer to a set of radio frequency spectrum resources having a defined physical layer structure for supporting the communication links 125. For example, a carrier used for a communication link 125 may include a portion of a radio frequency spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers.

In some examples (e.g., in a carrier aggregation configuration), a carrier may also have acquisition signaling or control signaling that coordinates operations for other carriers. A carrier may be associated with a frequency channel (e.g., an evolved universal mobile telecommunication system terrestrial radio access (E-UTRA) absolute radio frequency channel number (EARFCN)) and may be positioned according to a channel raster for discovery by the UEs 115. A carrier may be operated in a standalone mode where initial acquisition and connection may be conducted by the UEs 115 via the carrier, or the carrier may be operated in a non-standalone mode where a connection is anchored using a different carrier (e.g., of the same or a different radio access technology).

The communication links 125 shown in the wireless communications system 100 may include uplink transmissions from a UE 115 to a base station 105, or downlink transmissions from a base station 105 to a UE 115. Carriers may carry downlink or uplink communications (e.g., in an FDD mode) or may be configured to carry downlink and uplink communications (e.g., in a TDD mode).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of determined bandwidths for carriers of a particular radio access technology (e.g., 1.4, 3, 5, 10, 15, 20, 40, or 80 megahertz (MHz)). Devices of the wireless communications system 100 (e.g., the base stations 105, the UEs 115, or both) may have hardware configurations that support communications over a particular carrier bandwidth or may be configurable to support communications over one of a set of carrier bandwidths. In some examples, the wireless communications system 100 may include base stations 105 or UEs 115 that support simultaneous communications via carriers associated with multiple carrier bandwidths. In some examples, each served UE 115 may be configured for operating over portions (e.g., a sub-band, a BWP) or all of a carrier bandwidth.

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme, the coding rate of the modulation scheme, or both). Thus, the more resource elements that a UE 115 receives and the higher the order of the modulation scheme, the higher the data rate may be for the UE 115. A wireless communications resource may refer to a combination of a radio frequency spectrum resource, a time resource, and a spatial resource (e.g., spatial layers or beams), and the use of multiple spatial layers may further increase the data rate or data integrity for communications with a UE 115.

One or more numerologies for a carrier may be supported, where a numerology may include a subcarrier spacing ($\Delta f$) and a cyclic prefix. A carrier may be divided into one or more BWPs having the same or different numerologies. In some examples, a UE 115 may be configured with multiple BWPs. In some examples, a single BWP for a carrier may be active at a given time and communications for the UE 115 may be restricted to one or more active BWPs.

The time intervals for the base stations 105 or the UEs 115 may be expressed in multiples of a basic time unit which may, for example, refer to a sampling period of $T_s=1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a number of slots. Alternatively, each frame may include a variable number of slots, and the number of slots may depend on subcarrier spacing. Each slot may include a number of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., the number of symbol periods in a TTI) may be variable. Additionally or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a number of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to a number of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

Each base station 105 may provide communication coverage via one or more cells, for example a macro cell, a small cell, a hot spot, or other types of cells, or any combination thereof. The term "cell" may refer to a logical communication entity used for communication with a base station 105 (e.g., over a carrier) and may be associated with an identifier for distinguishing neighboring cells (e.g., a physical cell identifier (PCID), a virtual cell identifier (VCID), or others). In some examples, a cell may also refer to a geographic coverage area 110 or a portion of a geographic coverage area 110 (e.g., a sector) over which the logical communication entity operates. Such cells may range from smaller areas (e.g., a structure, a subset of structure) to larger areas depending on various factors such as the capabilities of the base station 105. For example, a cell may be or include a building, a subset of a building, or exterior spaces between or overlapping with geographic coverage areas 110, among other examples.

A macro cell generally covers a relatively large geographic area (e.g., several kilometers in radius) and may allow unrestricted access by the UEs 115 with service subscriptions with the network provider supporting the macro cell. A small cell may be associated with a lower-powered base station 105, as compared with a macro cell, and a small cell may operate in the same or different (e.g., licensed, unlicensed) frequency bands as macro cells. Small cells may provide unrestricted access to the UEs 115 with service subscriptions with the network provider or may provide restricted access to the UEs 115 having an association with the small cell (e.g., the UEs 115 in a closed subscriber group (CSG), the UEs 115 associated with users in a home or office). A base station 105 may support one or multiple cells and may also support communications over the one or more cells using one or multiple component carriers.

In some examples, a carrier may support multiple cells, and different cells may be configured according to different protocol types (e.g., MTC, narrowband IoT (NB-IoT), enhanced mobile broadband (eMBB)) that may provide access for different types of devices.

In some examples, a base station 105 may be movable and therefore provide communication coverage for a moving geographic coverage area 110. In some examples, different geographic coverage areas 110 associated with different technologies may overlap, but the different geographic coverage areas 110 may be supported by the same base station 105. In other examples, the overlapping geographic coverage areas 110 associated with different technologies may be supported by different base stations 105. The wireless communications system 100 may include, for example, a heterogeneous network in which different types of the base stations 105 provide coverage for various geographic coverage areas 110 using the same or different radio access technologies.

Some UEs 115, such as MTC or IoT devices, may be low cost or low complexity devices and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay such information to a central server or application program that makes use of the information or presents the information to humans interacting with the application program. Some UEs 115 may be designed to collect information or enable automated behavior of machines or other devices. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples, half-duplex communications may be performed at a reduced peak rate. Other power conservation techniques for the UEs 115 include entering a power saving deep sleep mode when not engaging in active communications, operating over a limited bandwidth (e.g., according to narrowband communications), or a combination of these techniques. For example, some UEs 115 may be configured for operation using a narrowband protocol type that is associated with a defined portion or range (e.g., set of subcarriers or resource blocks (RBs)) within a carrier, within a guard-band of a carrier, or outside of a carrier.

The wireless communications system 100 may be configured to support ultra-reliable communications or low-latency communications, or various combinations thereof. For example, the wireless communications system 100 may be configured to support ultra-reliable low-latency communications (URLLC) or mission critical communications. The UEs 115 may be designed to support ultra-reliable, low-latency, or critical functions (e.g., mission critical functions). Ultra-reliable communications may include private communication or group communication and may be supported by one or more mission critical services such as mission critical push-to-talk (MCPTT), mission critical video (MCVideo), or mission critical data (MCData). Support for mission critical functions may include prioritization of services, and mission critical services may be used for public safety or general commercial applications. The terms ultra-reliable, low-latency, mission critical, and ultra-reliable low-latency may be used interchangeably herein.

In some examples, a UE 115 may also be able to communicate directly with other UEs 115 over a device-to-device (D2D) communication link 135 (e.g., using a peer-to-peer (P2P) or D2D protocol). One or more UEs 115 utilizing D2D communications may be within the geographic coverage area 110 of a base station 105. Other UEs 115 in such a group may be outside the geographic coverage area 110 of a base station 105 or be otherwise unable to receive transmissions from a base station 105. In some examples, groups of the UEs 115 communicating via D2D communications may utilize a one-to-many (1:M) system in which each UE 115 transmits to every other UE 115 in the group. In some examples, a base station 105 facilitates the scheduling of resources for D2D communications. In other cases, D2D communications are carried out between the UEs 115 without the involvement of a base station 105.

In some systems, the D2D communication link 135 may be an example of a communication channel, such as a sidelink communication channel, between vehicles (e.g., UEs 115). In some examples, vehicles may communicate using vehicle-to-everything (V2X) communications, vehicle-to-vehicle (V2V) communications, or some combination of these. A vehicle may signal information related to traffic conditions, signal scheduling, weather, safety, emergencies, or any other information relevant to a V2X system. In some examples, vehicles in a V2X system may communicate with roadside infrastructure, such as roadside units, or with the network via one or more network nodes (e.g., base stations 105) using vehicle-to-network (V2N) communications, or with both.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the base stations 105 associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

Some of the network devices, such as a base station 105, may include subcomponents such as an access network entity 140, which may be an example of an access node controller (ANC). Each access network entity 140 may communicate with the UEs 115 through one or more other access network transmission entities 145, which may be referred to as radio heads, smart radio heads, or transmission/reception points (TRPs). Each access network transmission entity 145 may include one or more antenna panels. In some configurations, various functions of each access network entity 140 or base station 105 may be distributed across various network devices (e.g., radio heads and ANCs) or consolidated into a single network device (e.g., a base station 105).

The wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The wireless communications system 100 may also operate in a super high frequency (SHF) region using frequency bands from 3 GHz to 30 GHz, also known as the centimeter band, or in an extremely high frequency (EHF) region of the spectrum (e.g., from 30 GHz to 300 GHz), also known as the millimeter band. In some examples, the wireless communications system 100 may support millimeter wave (mmW) communications between the UEs 115 and the base stations 105, and EHF antennas of the respective devices may be smaller and more closely spaced than UHF antennas. In some examples, this may facilitate use of antenna arrays within a device. The propagation of EHF transmissions, however, may be subject to even greater atmospheric attenuation and shorter range than SHF or UHF transmissions. The techniques disclosed herein may be employed across transmissions that use one or more different frequency regions, and designated use of bands across these frequency regions may differ by country or regulating body.

The wireless communications system 100 may utilize both licensed and unlicensed radio frequency spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. When operating in unlicensed radio frequency spectrum bands, devices such as the base stations 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A base station 105 or a UE 115 may be equipped with multiple antennas, which may be used to employ techniques such as transmit diversity, receive diversity, multiple-input multiple-output (MIMO) communications, or beamforming. The antennas of a base station 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations. Additionally or alternatively, an antenna panel may support radio frequency beamforming for a signal transmitted via an antenna port.

The base stations 105 or the UEs 115 may use MIMO communications to exploit multipath signal propagation and increase the spectral efficiency by transmitting or receiving multiple signals via different spatial layers. Such techniques may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry bits associated with the same data stream (e.g., the same codeword) or different data streams (e.g., different codewords). Different spatial layers may be associated with different antenna ports used for channel measurement and reporting. MIMO techniques include single-user MIMO (SU-MIMO), where multiple spatial layers are transmitted to the same receiving device, and multiple-user MIMO (MU-MIMO), where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

A base station 105 or a UE 115 may use beam sweeping techniques as part of beam forming operations. For example, a base station 105 may use multiple antennas or antenna arrays (e.g., antenna panels) to conduct beamforming operations for directional communications with a UE 115. Some signals (e.g., synchronization signals, reference signals, beam selection signals, or other control signals) may be transmitted by a base station 105 multiple times in different directions. For example, the base station 105 may transmit a signal according to different beamforming weight sets associated with different directions of transmission. Transmissions in different beam directions may be used to identify (e.g., by a transmitting device, such as a base station 105, or by a receiving device, such as a UE 115) a beam direction for later transmission or reception by the base station 105.

Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based on a signal that was transmitted in one or more beam directions. For example, a UE 115 may receive one or more of the signals transmitted by the base station 105 in different directions and may report to the base station 105 an indication of the signal that the UE 115 received with a highest signal quality or an otherwise acceptable signal quality.

In some examples, transmissions by a device (e.g., by a base station 105 or a UE 115) may be performed using multiple beam directions, and the device may use a combination of digital precoding or radio frequency beamforming to generate a combined beam for transmission (e.g., from a base station 105 to a UE 115). The UE 115 may report feedback that indicates precoding weights for one or more beam directions, and the feedback may correspond to a configured number of beams across a system bandwidth or one or more sub-bands. The base station 105 may transmit a reference signal (e.g., a cell-specific reference signal (CRS), a channel state information reference signal (CSI-RS)), which may be precoded or unprecoded. The UE 115 may provide feedback for beam selection, which may be a precoding matrix indicator (PMI) or codebook-based feedback (e.g., a multi-panel type codebook, a linear combination type codebook, a port selection type codebook). Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115) or for transmitting a signal in a single direction (e.g., for transmitting data to a receiving device).

A receiving device (e.g., a UE 115) may try multiple receive configurations (e.g., directional listening) when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets (e.g., different directional listening weight sets) applied to signals received at multiple antenna elements of an antenna array, or by processing received signals according to different receive beamforming weight sets applied to signals received at multiple antenna elements of an antenna array, any of which may be referred to as "listening" according to different receive configurations or receive directions. In some examples, a receiving device may use a single receive configuration to receive along a single beam direction (e.g., when receiving a data signal). The single receive configuration may be aligned in a beam direction determined based on listening according to different receive configuration directions (e.g., a beam direction determined to have a highest signal strength, highest signal-to-noise ratio (SNR), or otherwise acceptable signal quality based on listening according to multiple beam directions).

The wireless communications system 100 may be a packet-based network that operates according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use error detection techniques, error correction techniques, or both to support retransmissions at the MAC layer to improve link efficiency. In the control plane, the Radio Resource Control (RRC) protocol layer may provide establishment, configuration, and maintenance of an RRC connection between a UE 115 and a base station 105 or a core network 130 supporting radio bearers for user plane data. At the physical layer, transport channels may be mapped to physical channels.

The UEs 115 and the base stations 105 may support retransmissions of data to increase the likelihood that data is received successfully. Hybrid automatic repeat request (HARQ) feedback is one technique for increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., low signal-to-noise conditions). In some examples, a device may support same-slot HARQ feedback, where the device may provide HARQ feedback in a specific slot for data received in a previous symbol in the slot. In other cases, the device may provide HARQ feedback in a subsequent slot, or according to some other time interval.

The wireless communications system 100 may support reference signal-based information using index modulation (RS-IM). A base station 105 and a UE 115 may thus transmit a number of downlink and uplink information bits (e.g., downlink control bits, uplink control bits) using index modulation schemes applied on references signals (e.g., DMRS, SRS, CSI-RS, PRACH, SL-RS). In some cases, a base station 105 and a UE 115 may transmit reference signal transmissions (e.g., DMRS, SRS, CSI-RS, PRACH, SL-RS) using reference signal index modulation, in which a set of information bits (e.g., downlink control bits, uplink control bits) may be transmitted using coding techniques to enhance reliability of some or all of the information bits.

Figure 2:
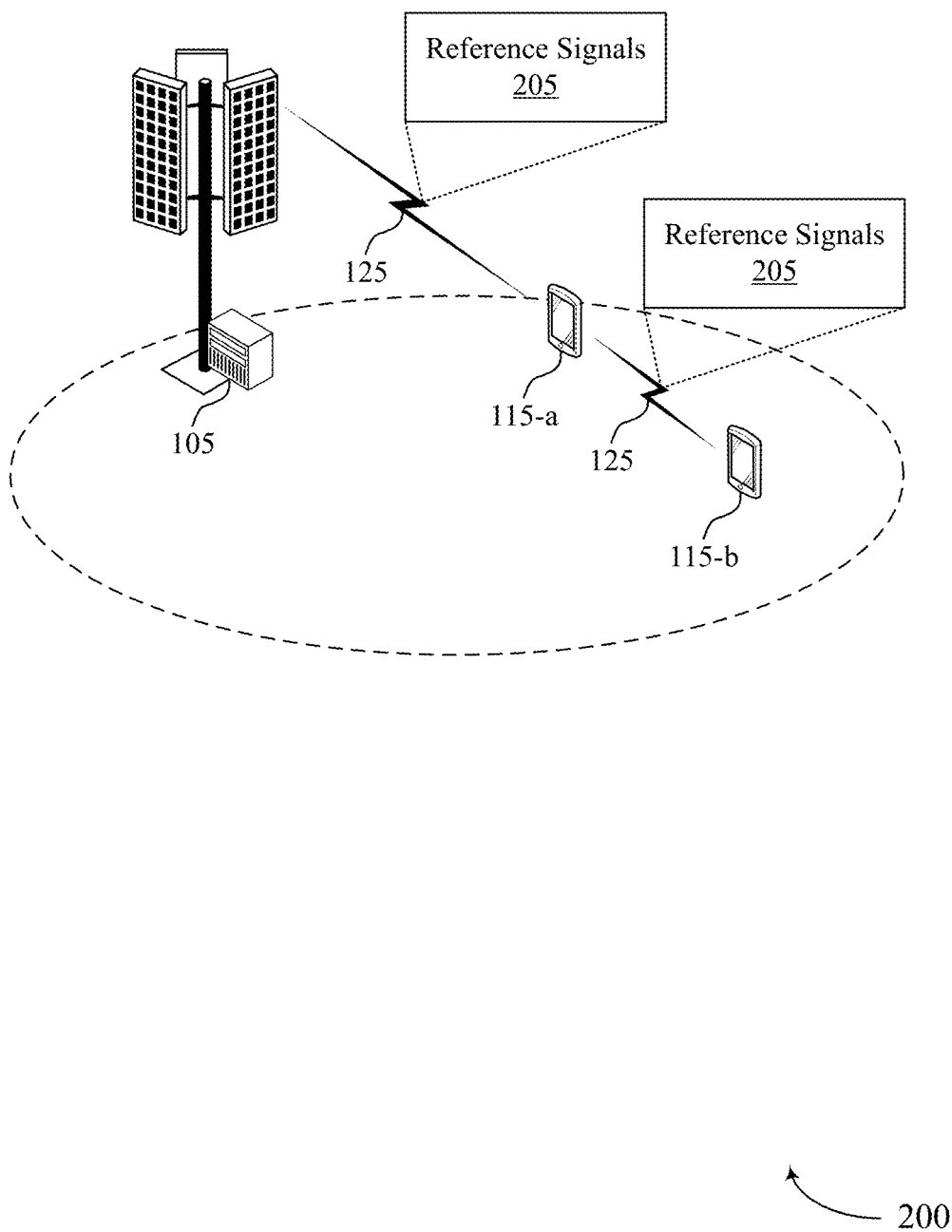

FIG. 2 illustrates an example of a portion of a wireless communications system 200 that supports coding techniques for reference signal index modulation communications in accordance with aspects of the present disclosure. The wireless communications system 200 may support multiple radio access technologies including 4G systems such as LTE systems, LTE-A systems, or LTE-A Pro systems, 5G systems, which may be referred to as NR systems, other systems, or any combinations thereof. The wireless communications system 200 may implement aspects of the wireless communications system 100. For example, the wireless communications system 200 may include a base station 105, a UE 115-$a$, and a UE 115-$b$, which may be examples of the corresponding devices described with reference to FIG. 1. The base station 105 and the UEs 115 may be configured to support wireless communications using an index modulation scheme. For example, the base station 105 and the UEs 115 may convey information bits (e.g., downlink control bits, uplink control bits) using a RS-IM scheme. In some cases, the UE 115-$a$ may be in sidelink communication with the UE 115-$b$, and techniques as discussed herein may be used in the sidelink communications. Thus, techniques discussed in various examples for communications between the base station 105 and the UE 115-$a$ may also be used for sidelink communications, or for communications between other types of nodes in the wireless communications system 200.

As part of index modulation, the base station 105 and/or the UE 115-$a$ may generate a bit sequence (also referred to as bit stream) including a set of information bits that is to be transmitted using RS-IM. In some cases, the information bits may be divided into multiple subsets of information bits. The base station 105 and the UE 115-$a$ may convey a first subset of information bits using source-based index modulation. In some examples, the first subset of information bits can be conveyed implicitly by the base station 105 and the UE 115-$a$ via activation of subcarriers using frequency domain index modulation. In some other examples, the first subset of information bits can be conveyed implicitly by the base station 105 and the UE 115-$a$ via activation of antennas via spatial domain index modulation. In other examples, the first subset of information bits can be conveyed implicitly by the base station 105 and the UE 115-$a$ via activation of symbol periods in a time domain. Additional information bits may be conveyed implicitly by the index usage or activation patterns.

Alternatively, the base station 105 and the UE 115-$a$ may convey the first subset of information bits using media-based index modulation. For example, the first subset of information bits can be conveyed implicitly by the base station 105 and the UE 115-$a$ via channel domain index modulation. In some cases, only a subset of resources, for example, subcarriers, antennas, time slots or channel states, are used for conveying the information bits. The base station 105 and the UE 115-$a$ may convey the second subset of information bits by modulating the second subset of information bits using a modulation and coding scheme. For example, the second subset of information bits can be modulated using an amplitude and phase modulation and coding schemes, among other examples (e.g., any other means of orthogonality).

The base station 105 and the UE 115-$a$ may support conveying information bits using a reference signal index modulation scheme, which uses reference signal transmissions (e.g., reference signals 205) using particular resources or reference signal sequences, or both, to convey the information bits. Examples of reference signals 205 include CSI-RS, SRS, DMRS, PRACH, SL-RS, and the like. In some cases, the base station 105 and the UE 115-$a$ may support an on-off-keying operation to convey information bits. For example, the base station 105 and the UE 115-$a$ may modulate one or more subcarriers via a modulation and coding scheme (e.g., quadrature amplitude modulation (QAM)), and indices of these activated one or more subcarriers in each time resource (e.g., symbol) may be determined by corresponding bit values of an on-off keying bit sequence (or stream).

The base station 105 and the UE 115-$a$ may use reference signal resources, for example CSI-RS resources, SRS resources, or other reference signals, to support an on-off-keying operation to convey information bits. In an on-off-keying operation, the base station 105 and the UE 115-$a$ may activate only a subset of reference signal resources (e.g., CSI-RS resources, SRS resources, etc.) based on the first subset of information bits. The subset of reference signal resources may also be used for the respective reference signal transmission (e.g., reference signal 205 transmission). The base station 105 and the UE 115-$a$ may refrain from activating other configured resources. As such, the other configured resources are not activated and are kept unused by the associated reference signal 205 transmission. The activated reference signal resources (e.g., CSI-RS resources, SRS resources, etc.) may include a combination of one or more of the following: transmission configuration indicator (TCI) states (e.g., one or more directional beams) in a spatial domain, subcarriers or resource blocks in a frequency domain, and symbol periods in a time domain (e.g., if symbol period repetition is enabled).

Within the active reference signal resources (e.g., CSI-RS resources, SRS resources, etc.), the base station 105 and the UE 115-a may transmit additional information bits based on, for example, a reference signal sequence (e.g., a CSI-RS sequence, an SRS sequence). The base station 105 and the UE 115-a may use the reference signal sequence based on an initialization equation used for a reference signal sequence generator (e.g., a CSI-RS sequence generator, an SRS sequence generator, etc.). In some examples, the base station 105 and the UE 115-a may transmit additional information bits based on, for example, a reference signal port (e.g., a CSI-RS port, an SRS port). In other examples, the base station 105 and the UE 115-a may transmit additional information bits based on, for example, a reference signal density in a frequency domain.

For example, the base station 105 may transmit additional information bits based on a CSI-RS density in a frequency domain. The UE 115-a may also transmit additional information bits based on an SRS and SL-RS density in a frequency domain, among other examples. The base station 105 and the UE 115-a may alternatively transmit additional information bits based on, for example, a time domain or frequency domain resource allocation within a resource block. In some examples, the base station 105 and the UE 115-a may alternatively transmit additional information bits based on, for example on a bandwidth allocation. The base station 105 and the UE 115-a may transmit additional information bits based on, for example, a resource mapping in a resource grid (e.g., 2 symbols in 1 or 2 slots).

As discussed herein, in order to enhance reliability of RS-IM communications, base station 105 and UE 115-a may be enhanced through coding techniques on transmitted bits. Various examples of coding techniques, and other techniques for enhancing reliability of communications, are discussed in more detail with reference to FIGS. 3 through 6.

Figure 3:
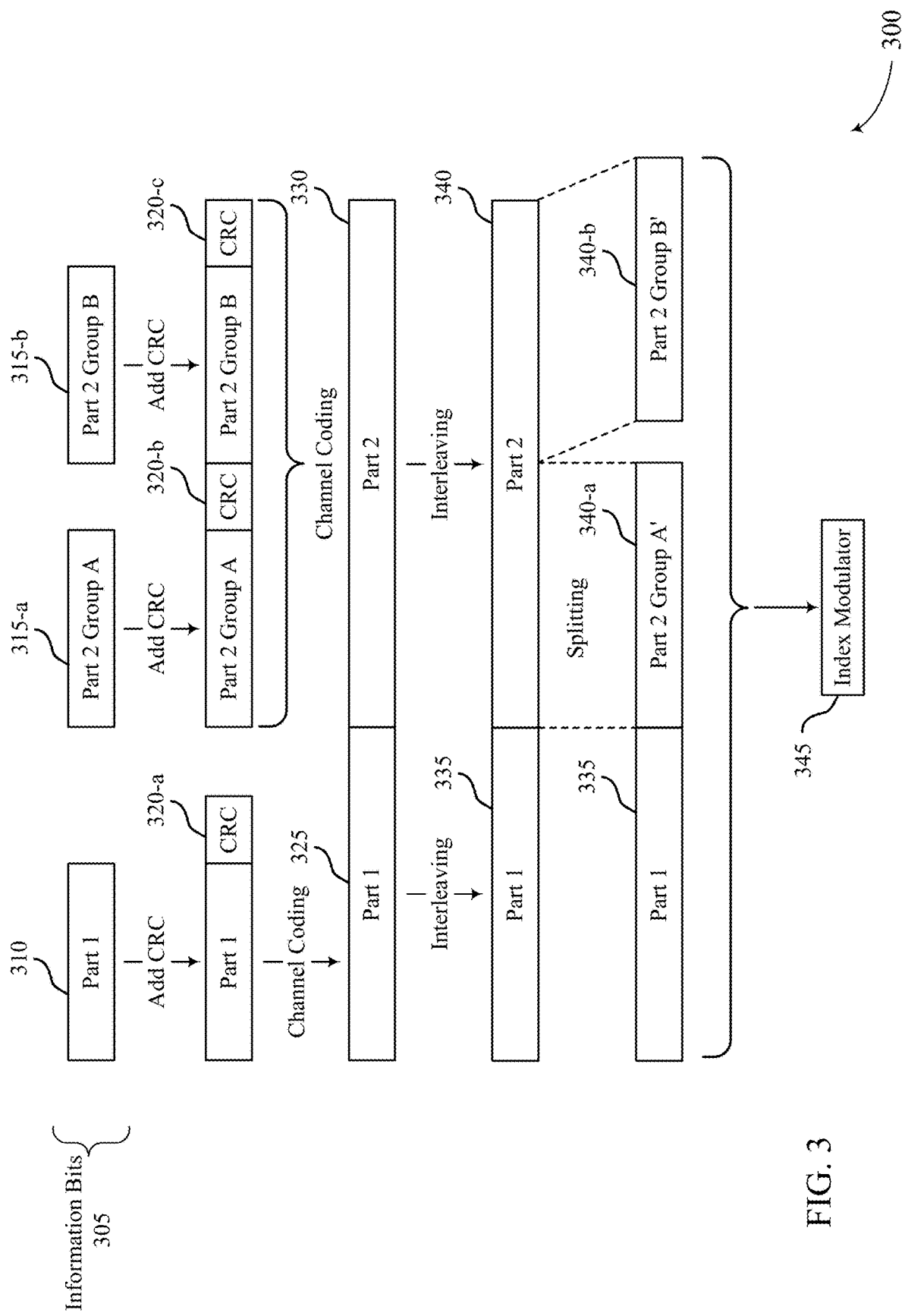
FIGS. 3 through 5 illustrate examples of coding schemes for reference signal index modulation communications in accordance with aspects of the present disclosure.

FIG. 3 illustrates an example of a coding scheme 300 that supports coding techniques for reference signal index modulation communications in accordance with aspects of the present disclosure. In some examples, the coding scheme 300 may implement aspects of the wireless communications system 100 and the wireless communications system 200 as described in FIGS. 1 and 2, respectively. For example, the coding scheme 300 may be a channel coding scheme that is used in conjunction with a RS-IM scheme to transmit information bits from a transmitter to a receiver.

In the example of FIG. 3, a set of information bits 305 may be identified by the transmitter. For example, a base station or UE may identify control information (e.g., downlink control information (DCI), uplink control information (UCI), etc.) that is to be transmitted in the set of information bits 305. In some cases, multiple subsets of the set of information bits 305 may be identified, including a first subset of information bits 310 (e.g., Part 1) that may include a first type of information (e.g., transmit control information (TCI)), and a second subset of information bits 315 (e.g., Part 2) that may include a second type of information (e.g., transmitter power control (TPC) commands). In some cases, such as illustrated in FIG. 3, the second subset of information bits 315 may be divided into different groups, in which group A is included in a first portion of the second subset of information bits 315-a, and group B is included in a second portion of the second subset of information bits 315-b.

In the example of FIG. 3, error detection may be used for the set of information bits 305, and may include the determination of a cyclic redundancy check (CRC) for each of the first subset of information bits 310 and each portion of the second subset of information bits 315, where the corresponding CRC value 320 may be appended to the information bits (e.g., a first CRC 320-a may be appended to the first subset of information bits 310, a second CRC 320-b may be appended to the first portion of the second subset of information bits 315-a, and a third CRC 320-c may be appended to the second portion of the second subset of information bits 315-b). In other examples, the determination and appending of the CRC may be skipped. Channel coding may then be performed to generate a first subset of channel coded set of bits 325 corresponding to the first subset of information bits 310 and associated first CRC 320-a, and a second subset of channel coded bits 330 corresponding to the second subset of information bits 315 and associated CRC values 320. In this example, interleaving may be performed on the channel coded bits to generate a first subset of interleaved bits 335 and a second subset of interleaved bits 340. In some cases, the second subset of interleaved bits 340 may be split into multiple groups, including a first group 340-a and a second group 340-b. The interleaved bits 335 and 340 may be provided to an index modulator 345 for RS-IM and transmission to a receiver. The receiver may then demodulate, de-interleave (if needed), and decode the information bits 305. In cases where CRC is used, the receiver may check the CRC as part of an error detection process. Example of channel coding techniques include, for example, polar coding, convolutional coding, block coding, repetition coding, (e.g., with simple majority decision), and the like.

As indicated in the example of FIG. 3, interleaving may be used, and may help prevent bursts of errors. Interleaving may include, for example, block or convolutional interleaver/deinterleaver techniques. In some cases, if channel coding is used, the interleaving may be performed done on the coded bits. In other cases, if one or more repetition techniques are used, such as techniques discussed with reference to FIGS. 4 and 5, the reference signal resources or information bits are interleaved.

In cases where an error detection scheme is used (e.g., CRC, parity bit, etc.), error check values may be added to the information bits 305 for error detection (e.g., before channel coding or index modulation). In some cases, the transmitter may use the same RS-IM to convey multiple types of information, and if there are some information types that are more important than others (e.g., TCI state updates may have a higher reliability target or priority than TPC commands), then information associated with that information type may be transmitted with higher reliability techniques (e.g., TCI state updates may be transmitted in the first subset of information bits 310, which may use CRC, channel coding, and interleaving, and TPC commands for one or more channels may be transmitted in the second subset of information bits 315 which may use different or no error detection, different or no channel coding, and different to no interleaving, or any combinations thereof). In some cases, the level of reliability, the length (and existence) of error detection, the interleaving, or any combinations thereof, may be the same for all subsets of the set of information bits 305 (e.g., same for part 1 and part 2 (and all its groups)), or different and dependent on the information bit parts (e.g., part 1, part 2 group A, part 2 group B, etc.). For example, a number of RS repetitions may be different for the first subset of information bits 310 and the second subset of information bits 315.

In other cases, additionally or alternatively, two levels of error detection lengths may be added to the first subset of information bits 310 or the second subset of information bits 310 (e.g., a short error detection length), or the complete set of information bits 305 may have a different error detection length (e.g., a longer error detection length). In some cases, the error detection length used for one of the subsets may be determined based on a priority or reliability target of the information that is transmitted using the particular subset. In the event that the same channel coding, error detection, or interleaving is done to more than one subset of information bits, additional segmentation and/or splitting may be performed before the index modulator, which may define new parts of the bits (and all groups). Additionally, in some cases (e.g., due to channel changes), the receiver may have a specific preference as seen from its side for the combination of coding, information type, part 1 or 2 mapping, and the like. In such cases, the receiver may be configured to transmit a request that indicates a preferred part 1 or 2 mapping, level of coding is needed per part, or any combinations thereof.

Figure 4:
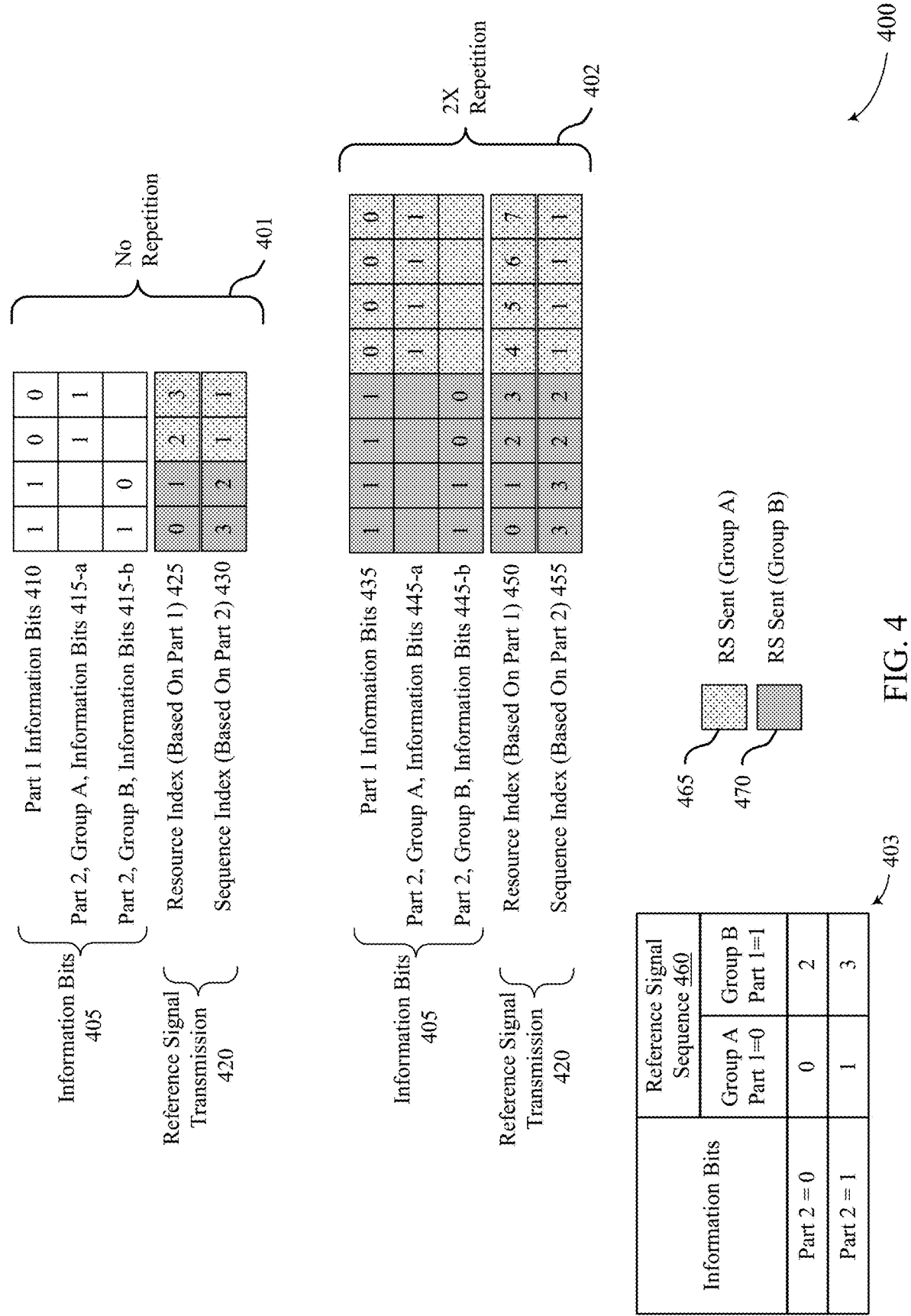

FIG. 4 illustrates an example of a coding scheme 400 that supports coding techniques for reference signal index modulation communications in accordance with aspects of the present disclosure. In some examples, the coding scheme 400 may implement aspects of the wireless communications system 100 and the wireless communications system 200 as described in FIGS. 1 and 2, respectively. For example, the coding scheme 400 may be used in conjunction with an index modulation scheme (e.g., RS-IM).

In the example of FIG. 4, a first reference signal resource set 401 (e.g., a downlink resource set or an uplink resource set) may be configured with one instance of one or more reference signal resources (e.g., downlink reference signal resources or uplink reference signal resources, which may correspond to time resources (e.g., symbol location), frequency resources, spatial resources (e.g., one or more beams), or combinations thereof. In some examples, the reference signal resource set 401 may be, for example, a CSI-RS resource set and the reference signal resources may be CSI-RS resources, in which no repetitions of reference signals are provided. In this case, a set of information bits 405 may include a first subset of information bits 410 that may correspond to a Part 1 of information bits, and may include a second subset of information bits 415 that may correspond to a Part 2 of information bits and include a first group of bits (e.g., group A of a second subset of information bits 415-*a*) and a second group of bits (e.g., group B of the second subset of information bits 415-*b*). In this example, information bits for part 1 may be mapped to a resource index 425, and information bits for part 2 may be mapped to a sequence index 430. Further, information bits for Part 2 groups A and B may be mapped in accordance with table 403, in which different reference signal sequence 460 indices used in the different Part 1 resources may be used to map part 2 group A and B bits.

The receiver thus may identify bits for the first subset of information bits 410 based on activated beams associated with the received downlink reference signal. When conveying the second subset of information bits 415, the transmitter may use different reference signal sequences. The receiver may thereby detect a downlink reference signal associated with a respective reference signal sequence and determine bits for the second subset of information bits 415 based on the respective sequence, and the resource that was used to transmit the reference signal. The reference signal may be any reference signal that may be transmitted between a transmitter and a receiver, such as a CSI-RS, SRS, SL-RS, etc. In some cases, prior to RS-IM, the information bits 405 may have been channel coded, may include error detection bits, may be interleaved, or any combinations thereof, to help enhance the reliability of successful reception of the information bits 405, in accordance with techniques as discussed herein.

In some cases, in order to enhance reliability, additionally or alternatively to one or more other techniques as discussed herein, one or more repetitions of information bits may be transmitted using RS-IM. For example, a second reference signal resource set 402 (e.g., a downlink resource set or an uplink resource set) may be configured with two repetitions of the information bits 405. In this example, the transmitter may transmit reference signals 470 associated with group B followed by reference signals 465 associate with group A, in which reference signals 470 are mapped to a first number of bits (e.g., the first two bits of a first subset of information bits 435) and to group A of a second subset of information bits 415-*a*, and reference signals 470 are mapped to a second number of bits (e.g., the second two bits of the first subset of information bits 435) and to group B of the second subset of information bits 415-*b*. In this example, the transmitter may repeat all or some of the reference signals, and the receiver may combine (coherently or incoherently) the repeated reference signal(s) to improve the likelihood of successful reception.

Figure 5:
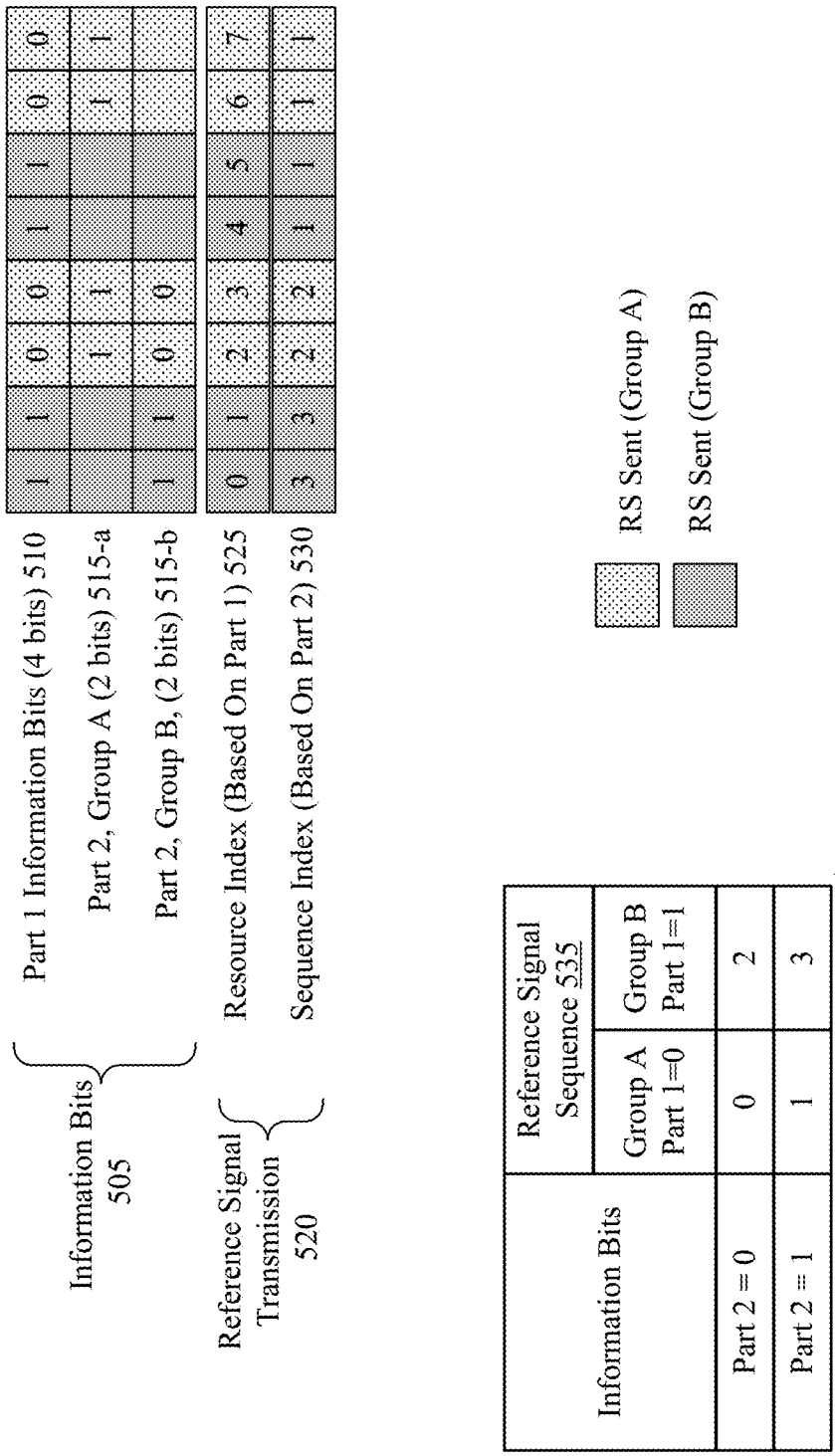

FIG. 5 illustrates an example of a coding scheme 500 that supports coding techniques for reference signal index modulation communications in accordance with aspects of the present disclosure. In some examples, the coding scheme 500 may implement aspects of the wireless communications system 100 and the wireless communications system 200 as described in FIGS. 1 and 2, respectively. For example, the coding scheme 500 may be used in conjunction with an index modulation scheme (e.g., RS-IM).

In the example of FIG. 5, a reference signal resource set (e.g., a downlink resource set or an uplink resource set) may be configured and may use spatial diversity, time diversity, frequency diversity, of combinations thereof. In some examples, the reference signal resource set may be, for example, a CSI-RS resource set and the reference signal resources may be CSI-RS resources. In this case, a set of information bits 505 may include a first subset of information bits 510 that may correspond to a Part 1 of information bits, and may include a second subset of information bits 515 that may correspond to a Part 2 of information bits and include a first group 515-*a* and a second group 515-*b* of bits. In this example, information bits for part 1 may be mapped to a resource index 525, and information bits for part 2 may be mapped to a sequence index 530. Further, information bits for Part 2 groups A and B may be mapped in accordance with table 501, in which different reference signal sequence 535 indices used in the different Part 1 resources may be used to map part 2 group A and B bits.

The receiver may identify bits for the first subset of information bits 510 based on activated beams associated with the received downlink reference signal. When conveying the second subset of information bits 515, the transmitter may use different reference signal sequences. The receiver may thereby detect a downlink reference signal associated with a respective reference signal sequence and determine bits for the second subset of information bits 415 based on the respective sequence, and the resource that was used to transmit the reference signal. The reference signal may be any reference signal that may be transmitted between a transmitter and a receiver, such as a CSI-RS, SRS, SL-RS, etc. In some cases, prior to RS-IM, the information bits 505 may have been channel coded, may include error detection bits, may be interleaved, or any combinations thereof, to help enhance the reliability of successful reception of the information bits 505, in accordance with techniques as discussed herein.

In this example, in order to enhance reliability, additionally or alternatively to one or more other techniques as discussed herein, one or more repetitions of information bits may be transmitted using different spatial resources, time resources, frequency resources, or any combinations thereof, for RS-IM. For example, the transmitter may send the same information bit using one or more RS resource across space (beams), time, and/or frequency. In some cases, the RS resources in a set may be divided into multiple subsets, and subsets are orthogonal in time, space, and/or frequency. The same bits may be mapped into the multiple subsets, and the receiver can combine (coherently or incoherently) the RS(s) across subsets to improve the likelihood of successful reception.

Figure 6:
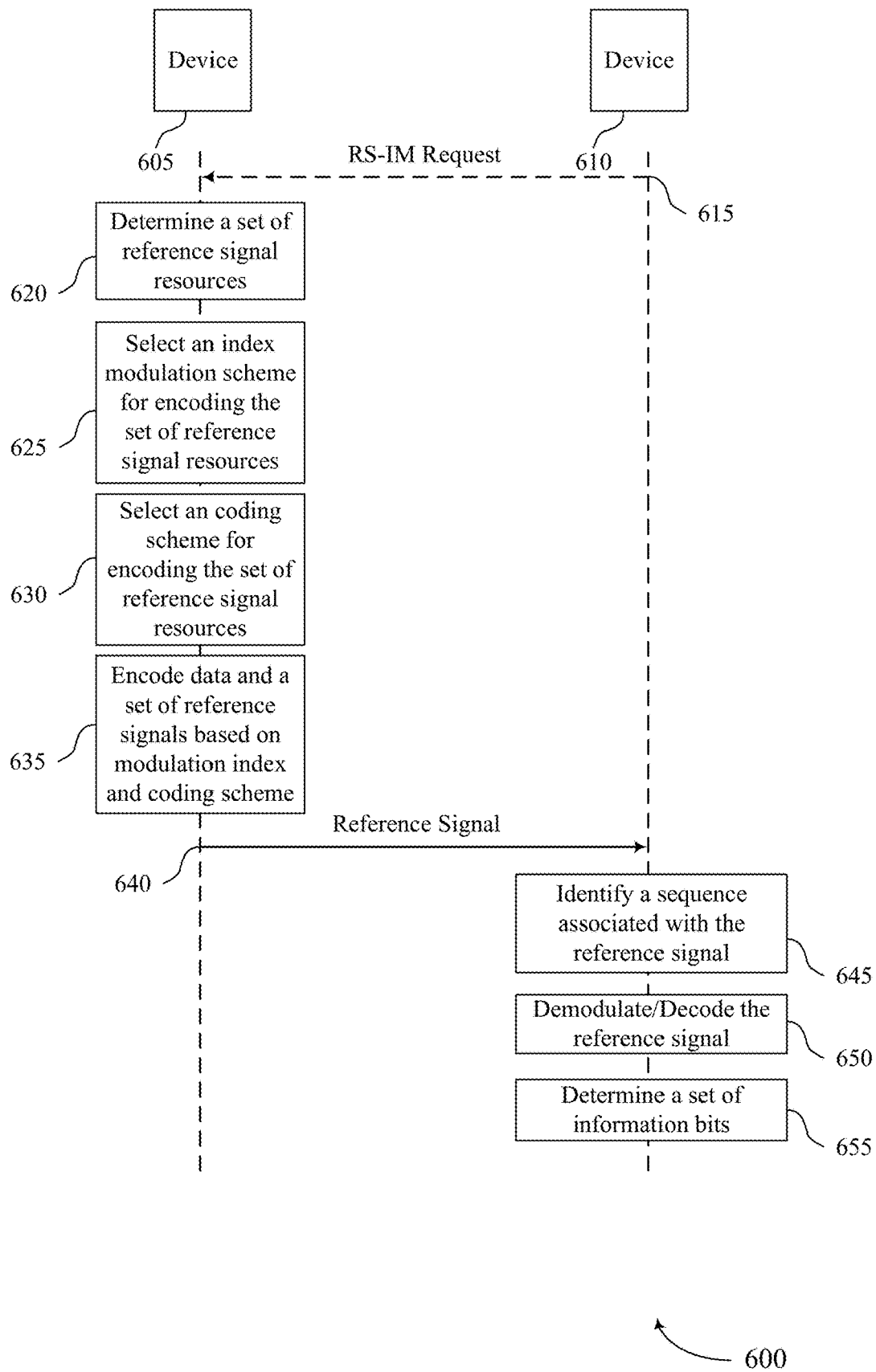
FIG. 6 illustrates an example of a process flow that supports coding techniques for reference signal index modulation communications in accordance with aspects of the present disclosure.

FIG. 6 illustrates an example of a process flow 600 that supports coding techniques for reference signal index modulation communications in accordance with aspects of the present disclosure. The process flow 600 may implement aspects of the wireless communications system 100 and the wireless communications system 200 described with reference to FIGS. 1 and 2, respectively. The process flow 600 may also implement aspects of the various coding schemes described with reference to FIGS. 3 through 5, respectively. The process flow 600 may be based on a configuration by a base station 105 and implemented by a UE 115 to promote enhanced reliability and reduced latency for the UE 115 by performing wireless communication RS-IM. The process flow 600 may also be based on a configuration by the base station 105 and implemented by the UE 115 to promote higher reliability and lower latency wireless communications (e.g., higher data rates, higher channel capacity, higher spectral efficiency) for one or more types of information, and power savings through reduced retransmissions, among other benefits.

In the following description of the process flow 600, the operations between the device 605 and the device 610 may be transmitted in a different order than the example order shown, or the operations performed by the device 605 and the device 610 may be performed in different orders or at different times. Some operations may also be omitted from the process flow 600, and other operations may be added to the process flow 600. The device 605 and the device 610 may be examples of a base station 105 and a UE 115 as described with reference to FIGS. 1 and 2, respectively. Alternatively, the device 605 and the device 610 may be examples of at least two UEs 115 in wireless communication, for example, of a D2D communication link, or may be examples of other nodes in a wireless communications network (e.g., integrated access and backhaul (IAB) nodes, relay nodes, etc.).

Optionally, at 615, the device 610 may transmit a request for a RS-IM configuration to device 605. In some cases, the request may include a request for a particular coding scheme, error detection scheme, interleaving scheme, or any combinations thereof. In some cases, the device 610 may determine the RS-IM request based on a type of information to be provided with RS-IM communications. For example, if TCI state information is to be provided using RS-IM, and based on a current channel condition measured at the device 610, a request for a higher reliability coding scheme may be provided. In other cases, if TPC commands and TCI state information are to be provided using RS-IM, the device 610 may request that the TCI state information be provided in part 1 of RS-IM information using a first coding scheme, first error detection scheme, and first interleaving scheme, and may request that TPC commands be provided in part 2 of RS-IM information (e.g., in one or more groups of part 2 information), which may be requested with the same or different coding scheme, error detection scheme, interleaving scheme, or combinations thereof. In some cases, the RS-IM request may be provided in signaling, such as RRC signaling, in a medium access control (MAC) control element (CE), in uplink control information (UCI), or any combinations thereof. In some cases, the device 605 may configure the device 610 to transmit the RS-IM request, to monitor for RS-IM communications, or any combinations thereof (e.g., through RRC signaling to the device 610).

At 620, the device 605 may determine a set of reference signal resources. For example, the device 605 may determine a set of reference signal resources to convey a set of information bits to the device 610 via one or more reference signals. Examples of set of reference signal resources may include SRS resources, PRACH resources, DMRS resources, CSI-RS resources, or SL-RS resources, etc. In some examples, the reference signal resources may be orthogonal in a time domain, a frequency domain, or a spatial domain, or any combination thereof. As described herein, the device 605 may convey the set of information bits using index modulation and encoding the reference signal resources. The device 605 may split the set of information bits into a first subset of information bits and a second subset of information bits to convey the set of information bits.

At 625, the device 605 may select an index modulation scheme for encoding the set of reference signal resources (e.g., SRS resources, PRACH resources, DMRS resources, CSI-RS resources, or SL-RS resources, etc.). For example, the device 605 may select a first index modulation scheme or a second index modulation scheme for encoding the set of reference signal resources to include the second subset of information bits based on values of the first subset of information bits.

At 630, the device 605 may select a coding scheme for encoding the information bits onto the set of reference signal resources (e.g., channel coding, repetition schemes, etc.). For example, the device 605 may select channel coding for encoding the information bits. In some cases, different coding, error detection, or interleaving schemes may be selected for different subsets of the information bits.

At 635, the device 605 may encode the information bits and a set of reference signals (e.g., SRS, PRACH, DMRS, CSI-RS, or SL-RS, etc.) to include the encoded set of information bits using the selected coding scheme and index modulation scheme. At 640, the device 605 may transmit one or more reference signals (e.g., SRS, PRACH, DMRS, CSI-RS, or SL-RS, etc.) that are encoded to include the set of information bits to the device 610.

At 645, the device 610 may identify a sequence associated with the reference signal (e.g., SRS, PRACH, DMRS, CSI-RS, or SL-RS, etc.). At 650, the device 610 may demodulate and decode the reference signal. At 655, the device 610 may determine the set of information bits, for example, a first subset of information bits of the set of information bits encoded in the reference signal and a second subset of information bits of the set of information bits encoded in the reference signal based on identifying the sequence. The first subset of information bits may be encoded in the reference signal based on the sequence corresponding to a first group of sequences or a second group of sequences and the second subset of information bits may be encoded in the reference signal based on a mapping between the sequence and one or more values of the second subset of information bits, for example. The information bits may be decoded based on the coding used to encode the information bits (e.g., channel coding). In some cases, the device 610 may combine (e.g., coherently or incoherently) multiple repetitions of reference signals to determine the information bits.

Figure 7:
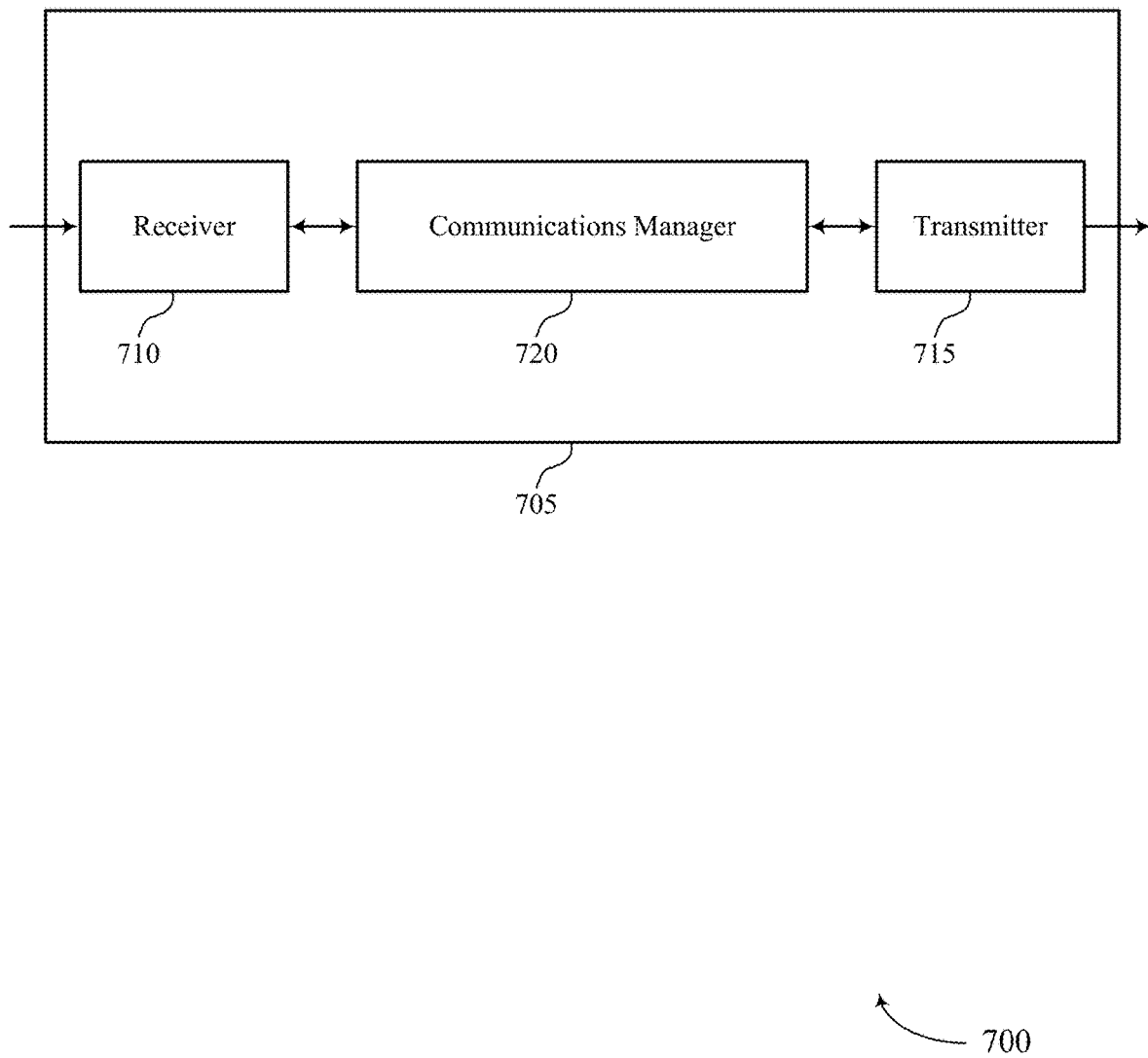
FIGS. 7 and 8 show block diagrams of devices that support coding techniques for reference signal index modulation communications in accordance with aspects of the present disclosure.

FIG. 7 shows a block diagram 700 of a device 705 that supports coding techniques for reference signal index modulation communications in accordance with aspects of the present disclosure. The device 705 may be an example of aspects of a UE 115 or a base station 105 as described herein. The device 705 may include a receiver 710, a transmitter 715, and a communications manager 720. The device 705 may also include a processor. Each of these components may be in communication with one another (e.g., via one or more buses).

The receiver 710 may provide a means for receiving information such as packets, user data, control information, or any combination thereof associated with various information channels (e.g., control channels, data channels, information channels related to coding techniques for reference signal index modulation communications). Information may be passed on to other components of the device 705. The receiver 710 may utilize a single antenna or a set of multiple antennas.

The transmitter 715 may provide a means for transmitting signals generated by other components of the device 705. For example, the transmitter 715 may transmit information such as packets, user data, control information, or any combination thereof associated with various information channels (e.g., control channels, data channels, information channels related to coding techniques for reference signal index modulation communications). In some examples, the transmitter 715 may be co-located with a receiver 710 in a transceiver module. The transmitter 715 may utilize a single antenna or a set of multiple antennas.

The communications manager 720, the receiver 710, the transmitter 715, or various combinations thereof or various components thereof may be examples of means for performing various aspects of coding techniques for reference signal index modulation communications as described herein. For example, the communications manager 720, the receiver 710, the transmitter 715, or various combinations or components thereof may support a method for performing one or more of the functions described herein.

In some examples, the communications manager 720, the receiver 710, the transmitter 715, or various combinations or components thereof may be implemented in hardware (e.g., in communications management circuitry). The hardware may include a processor, a digital signal processor (DSP), an application-specific integrated circuit (ASIC), a field-programmable gate array (FPGA) or other programmable logic device, a discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally or alternatively, in some examples, the communications manager 720, the receiver 710, the transmitter 715, or various combinations or components thereof may be implemented in code (e.g., as communications management software or firmware) executed by a processor. If implemented in code executed by a processor, the functions of the communications manager 720, the receiver 710, the transmitter 715, or various combinations or components thereof may be performed by a general-purpose processor, a DSP, a central processing unit (CPU), an ASIC, an FPGA, or any combination of these or other programmable logic devices (e.g., configured as or otherwise supporting a means for performing the functions described in the present disclosure).

In some examples, the communications manager 720 may be configured to perform various operations (e.g., receiving, monitoring, transmitting) using or otherwise in cooperation with the receiver 710, the transmitter 715, or both. For example, the communications manager 720 may receive information from the receiver 710, send information to the transmitter 715, or be integrated in combination with the receiver 710, the transmitter 715, or both to receive information, transmit information, or perform various other operations as described herein.

The communications manager 720 may support wireless communication at a transmitting device in accordance with examples as disclosed herein. For example, the communications manager 720 may be configured as or otherwise support a means for identifying a set of information bits to be transmitted to a receiving device via one or more reference signals using a reference signal index modulation scheme, where the reference signal index modulation scheme uses one or more activation states of the one or more reference signal transmissions to indicate one or more transmitted bits. The communications manager 720 may be configured as or otherwise support a means for coding the set of information bits to generate an encoded set of bits for transmission using the reference signal index modulation scheme. The communications manager 720 may be configured as or otherwise support a means for transmitting the encoded set of bits to the receiving device using the reference signal index modulation scheme.

Additionally or alternatively, the communications manager 720 may support wireless communication at a receiving device in accordance with examples as disclosed herein. For example, the communications manager 720 may be configured as or otherwise support a means for receiving, from a transmitting device, one or more reference signal transmissions that are modulated according to a reference signal index modulation scheme, where the reference signal index modulation scheme uses one or more activation states of the one or more reference signal transmissions to indicate one or more information bits. The communications manager 720 may be configured as or otherwise support a means for demodulating an encoded set of bits from the one or more reference signal transmissions based on the reference signal index modulation scheme. The communications manager 720 may be configured as or otherwise support a means for decoding the encoded set of bits to determine a set of information bits from the transmitting device.

By including or configuring the communications manager 720 in accordance with examples as described herein, the device 705 (e.g., a processor controlling or otherwise coupled to the receiver 710, the transmitter 715, the communications manager 720, or a combination thereof) may support efficient techniques for conveying information bits. At least one implementation may enable the communications manager 720 to improve reliability of communications for the device 705 by using coding techniques that enhance the likelihood of successful communications. Based on implementing coding for communications that use reference signal index modulation, one or more processors of the device 705 (for example, processor(s) controlling or incorporated with the communications manager 720) may promote improvements to power consumption, spectral efficiency, higher data rates and, in some examples, may promote enhanced efficiency for high reliability and low latency data communications, among other benefits.

Figure 8:
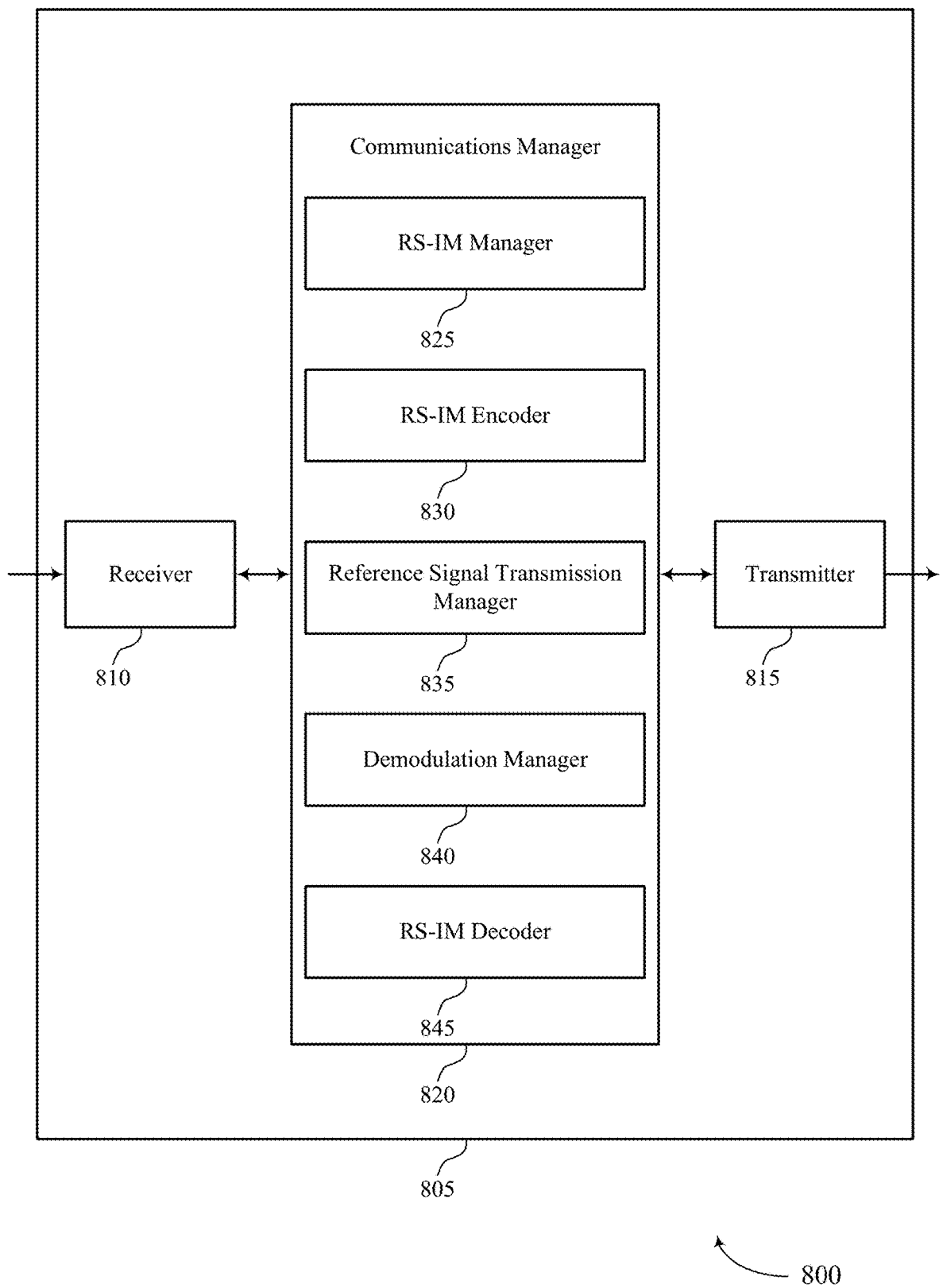

FIG. 8 shows a block diagram 800 of a device 805 that supports coding techniques for reference signal index modulation communications in accordance with aspects of the present disclosure. The device 805 may be an example of aspects of a device 705, a UE 115, or a base station 105 as described herein. The device 805 may include a receiver 810, a transmitter 815, and a communications manager 820. The device 805 may also include a processor. Each of these components may be in communication with one another (e.g., via one or more buses).

The receiver 810 may provide a means for receiving information such as packets, user data, control information, or any combination thereof associated with various information channels (e.g., control channels, data channels, information channels related to coding techniques for reference signal index modulation communications). Information may be passed on to other components of the device 805. The receiver 810 may utilize a single antenna or a set of multiple antennas.

The transmitter 815 may provide a means for transmitting signals generated by other components of the device 805. For example, the transmitter 815 may transmit information such as packets, user data, control information, or any combination thereof associated with various information channels (e.g., control channels, data channels, information channels related to coding techniques for reference signal index modulation communications). In some examples, the transmitter 815 may be co-located with a receiver 810 in a transceiver module. The transmitter 815 may utilize a single antenna or a set of multiple antennas.

The device 805, or various components thereof, may be an example of means for performing various aspects of coding techniques for reference signal index modulation communications as described herein. For example, the communications manager 820 may include an RS-IM manager 825, an RS-IM encoder 830, a reference signal transmission manager 835, a demodulation manager 840, an RS-IM decoder 845, or any combination thereof. The communications manager 820 may be an example of aspects of a communications manager 720 as described herein. In some examples, the communications manager 820, or various components thereof, may be configured to perform various operations (e.g., receiving, monitoring, transmitting) using or otherwise in cooperation with the receiver 810, the transmitter 815, or both. For example, the communications manager 820 may receive information from the receiver 810, send information to the transmitter 815, or be integrated in combination with the receiver 810, the transmitter 815, or both to receive information, transmit information, or perform various other operations as described herein.

The communications manager 820 may support wireless communication at a transmitting device in accordance with examples as disclosed herein. The RS-IM manager 825 may be configured as or otherwise support a means for identifying a set of information bits to be transmitted to a receiving device via one or more reference signals using a reference signal index modulation scheme, where the reference signal index modulation scheme uses one or more activation states of the one or more reference signal transmissions to indicate one or more transmitted bits. The RS-IM encoder 830 may be configured as or otherwise support a means for coding the set of information bits to generate an encoded set of bits for transmission using the reference signal index modulation scheme. The reference signal transmission manager 835 may be configured as or otherwise support a means for transmitting the encoded set of bits to the receiving device using the reference signal index modulation scheme.

Additionally or alternatively, the communications manager 820 may support wireless communication at a receiving device in accordance with examples as disclosed herein. The RS-IM manager 825 may be configured as or otherwise support a means for receiving, from a transmitting device, one or more reference signal transmissions that are modulated according to a reference signal index modulation scheme, where the reference signal index modulation scheme uses one or more activation states of the one or more reference signal transmissions to indicate one or more information bits. The demodulation manager 840 may be configured as or otherwise support a means for demodulating an encoded set of bits from the one or more reference signal transmissions based on the reference signal index modulation scheme. The RS-IM decoder 845 may be configured as or otherwise support a means for decoding the encoded set of bits to determine a set of information bits from the transmitting device.

Figure 9:
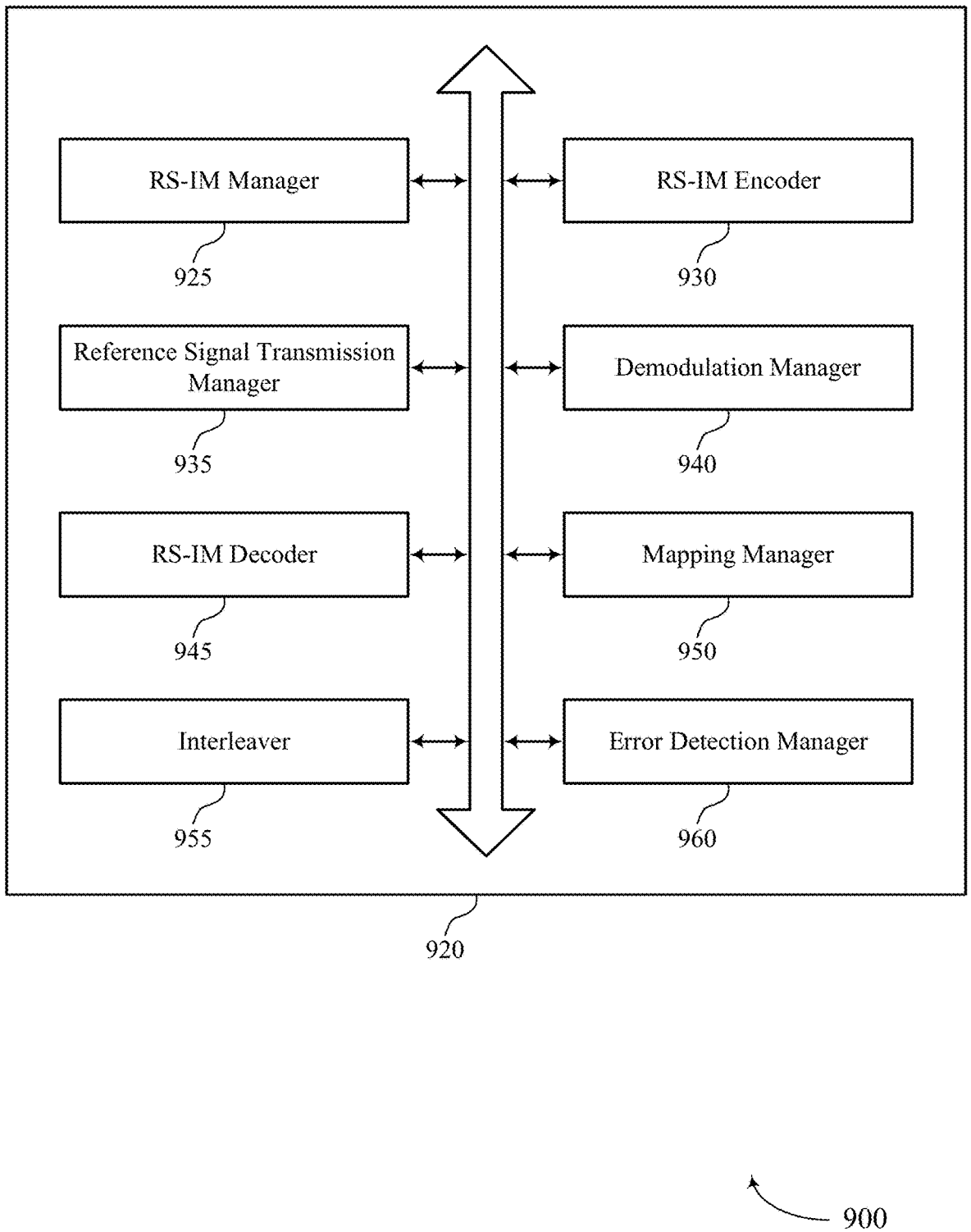
FIG. 9 shows a block diagram of a communications manager that supports coding techniques for reference signal index modulation communications in accordance with aspects of the present disclosure.

FIG. 9 shows a block diagram 900 of a communications manager 920 that supports coding techniques for reference signal index modulation communications in accordance with aspects of the present disclosure. The communications manager 920 may be an example of aspects of a communications manager 720, a communications manager 820, or both, as described herein. The communications manager 920, or various components thereof, may be an example of means for performing various aspects of coding techniques for reference signal index modulation communications as described herein. For example, the communications manager 920 may include an RS-IM manager 925, an RS-IM encoder 930, a reference signal transmission manager 935, a demodulation manager 940, an RS-IM decoder 945, a mapping manager 950, an interleaver 955, an error detection manager 960, or any combination thereof. Each of these components may communicate, directly or indirectly, with one another (e.g., via one or more buses).

The communications manager 920 may support wireless communication at a transmitting device in accordance with examples as disclosed herein. The RS-IM manager 925 may be configured as or otherwise support a means for identifying a set of information bits to be transmitted to a receiving device via one or more reference signals using a reference signal index modulation scheme, where the reference signal index modulation scheme uses one or more activation states of the one or more reference signal transmissions to indicate one or more transmitted bits. The RS-IM encoder 930 may be configured as or otherwise support a means for coding the set of information bits to generate an encoded set of bits for transmission using the reference signal index modulation scheme. The reference signal transmission manager 935 may be configured as or otherwise support a means for transmitting the encoded set of bits to the receiving device using the reference signal index modulation scheme.

In some examples, to support coding, the RS-IM encoder 930 may be configured as or otherwise support a means for channel coding the set of information bits to generate the encoded set of bits. In some examples, to support coding, the RS-IM encoder 930 may be configured as or otherwise support a means for providing the encoded set of bits to a reference signal index modulator to generate the one or more reference signal transmissions that indicate the encoded set of bits. In some examples, the channel coding includes polar coding, convolutional coding, block coding, repetition coding, or any combinations thereof.

In some examples, to support coding, the mapping manager 950 may be configured as or otherwise support a means for mapping the encoded set of bits into two or more subsets of encoded bits including a first subset of encoded bits that are conveyed implicitly based on an index usage or activation pattern of the one or more reference signals, and a second subset of encoded bits that are modulated on the one or more reference signals.

In some examples, to support coding, the mapping manager 950 may be configured as or otherwise support a means for determining a repetition pattern for the set of information bits, where the repetition pattern includes one or more of time repetition, repetition in different spatial resources, repetition in different frequency resources, or any combinations thereof. In some examples, to support coding, the mapping manager 950 may be configured as or otherwise support a means for mapping the set of information bits to an index usage or activation pattern of the one or more reference signals according to the repetition pattern. In some examples, the one or more reference signals are transmitted using a set of reference signal resources, and where a first instance of a first subset of the set of information bits is transmitted using a first subset of the set of reference signal resources and a second instance of the first subset of the set of information bits is transmitted using a second subset of the set of reference signal resources.

In some examples, to support coding, the interleaver 955 may be configured as or otherwise support a means for interleaving the encoded set of bits across a set of reference signal resources. In some examples, to support coding, the error detection manager 960 may be configured as or otherwise support a means for appending one or more error detection bits to the set of information bits.

In some examples, to support coding, the RS-IM encoder 930 may be configured as or otherwise support a means for coding a first subset of the set of information bits using a first coding scheme that is selected based on a first reliability target of the first subset. In some examples, to support coding, the RS-IM encoder 930 may be configured as or otherwise support a means for coding a second subset of the set of information bits using a second coding scheme that is selected based on a second reliability target of the second subset. In some examples, the first subset of the set of information bits further include one or more error detection bits that are determined based on the first reliability target. In some examples, the second subset of the set of information bits further include one or more error detection bits that are determined based on the second reliability target.

In some examples, to support coding, the RS-IM encoder 930 may be configured as or otherwise support a means for segmenting the encoded set of bits into two or more subsets of encoded bits. In some examples, to support coding, the RS-IM encoder 930 may be configured as or otherwise support a means for providing the two or more subsets of encoded bits to an index modulator for transmission to the receiving device using the reference signal index modulation scheme.

In some examples, the mapping manager 950 may be configured as or otherwise support a means for receiving, from the receiving device, an indication of a requested mapping of the set of information bits into two or more subsets of information bits, a requested level of coding for the two or more subsets of information bits, or any combinations thereof.

Additionally or alternatively, the communications manager 920 may support wireless communication at a receiving device in accordance with examples as disclosed herein. In some examples, the RS-IM manager 925 may be configured as or otherwise support a means for receiving, from a transmitting device, one or more reference signal transmissions that are modulated according to a reference signal index modulation scheme, where the reference signal index modulation scheme uses one or more activation states of the one or more reference signal transmissions to indicate one or more information bits. The demodulation manager 940 may be configured as or otherwise support a means for demodulating an encoded set of bits from the one or more reference signal transmissions based on the reference signal index modulation scheme. The RS-IM decoder 945 may be configured as or otherwise support a means for decoding the encoded set of bits to determine a set of information bits from the transmitting device.

In some examples, the decoding is based on a channel coding scheme applied to the set of information bits prior to being modulated according to the reference signal index modulation scheme. In some examples, the channel coding scheme includes polar coding, convolutional coding, block coding, repetition coding, or any combinations thereof.

In some examples, to support decoding, the mapping manager 950 may be configured as or otherwise support a means for determining the set of information bits based on a mapping between a first subset of the encoded set of bits and an index usage or activation pattern of the one or more reference signals. In some examples, to support decoding, the mapping manager 950 may be configured as or otherwise support a means for determining a second subset of encoded bits that are modulated on the one or more reference signals.

In some examples, to support decoding, the mapping manager 950 may be configured as or otherwise support a means for determining a repetition pattern for the set of information bits, where the repetition pattern includes one or more of time repetition, repetition in different spatial resources, repetition in different frequency resources, or any combinations thereof. In some examples, to support decoding, the mapping manager 950 may be configured as or otherwise support a means for determining the set of information bits based on a mapping between the set of information bits and an index usage or activation pattern of the one or more reference signals according to the repetition pattern. In some examples, the one or more reference signals are transmitted using a set of reference signal resources, and where a first instance of a first subset of the set of information bits is transmitted using a first subset of the set of reference signal resources and a second instance of the first subset of the set of information bits is transmitted using a second subset of the set of reference signal resources.

In some examples, to support decoding, the interleaver 955 may be configured as or otherwise support a means for deinterleaving the encoded set of bits that are interleaved across a set of reference signal resources. In some examples, to support decoding, the error detection manager 960 may be configured as or otherwise support a means for identifying one or more error detection bits that is appended to the set of information bits. In some examples, to support decoding, the error detection manager 960 may be configured as or otherwise support a means for determining that the set of information bits is successfully decoded based on the one or more error detection bits.

In some examples, to support decoding, the RS-IM decoder 945 may be configured as or otherwise support a means for decoding a first subset of the set of information bits using a first coding scheme that is identified based on a first reliability target of the first subset. In some examples, to support decoding, the RS-IM decoder 945 may be configured as or otherwise support a means for decoding a second subset of the set of information bits using a second coding scheme that is identified based on a second reliability target of the second subset. In some examples, the first subset of the set of information bits further include one or more error detection bits that are based on the first reliability target. In some examples, the second subset of the set of information bits further include one or more error detection bits that are based on the second reliability target. In some examples, the encoded set of bits are segmented into two or more subsets of encoded bits that are modulated according to the reference signal index modulation scheme.

In some examples, the mapping manager 950 may be configured as or otherwise support a means for transmitting, to the transmitting device, an indication of a requested mapping of the set of information bits into two or more subsets of information bits, a requested level of coding for the two or more subsets of information bits, or any combinations thereof.

Figure 10:
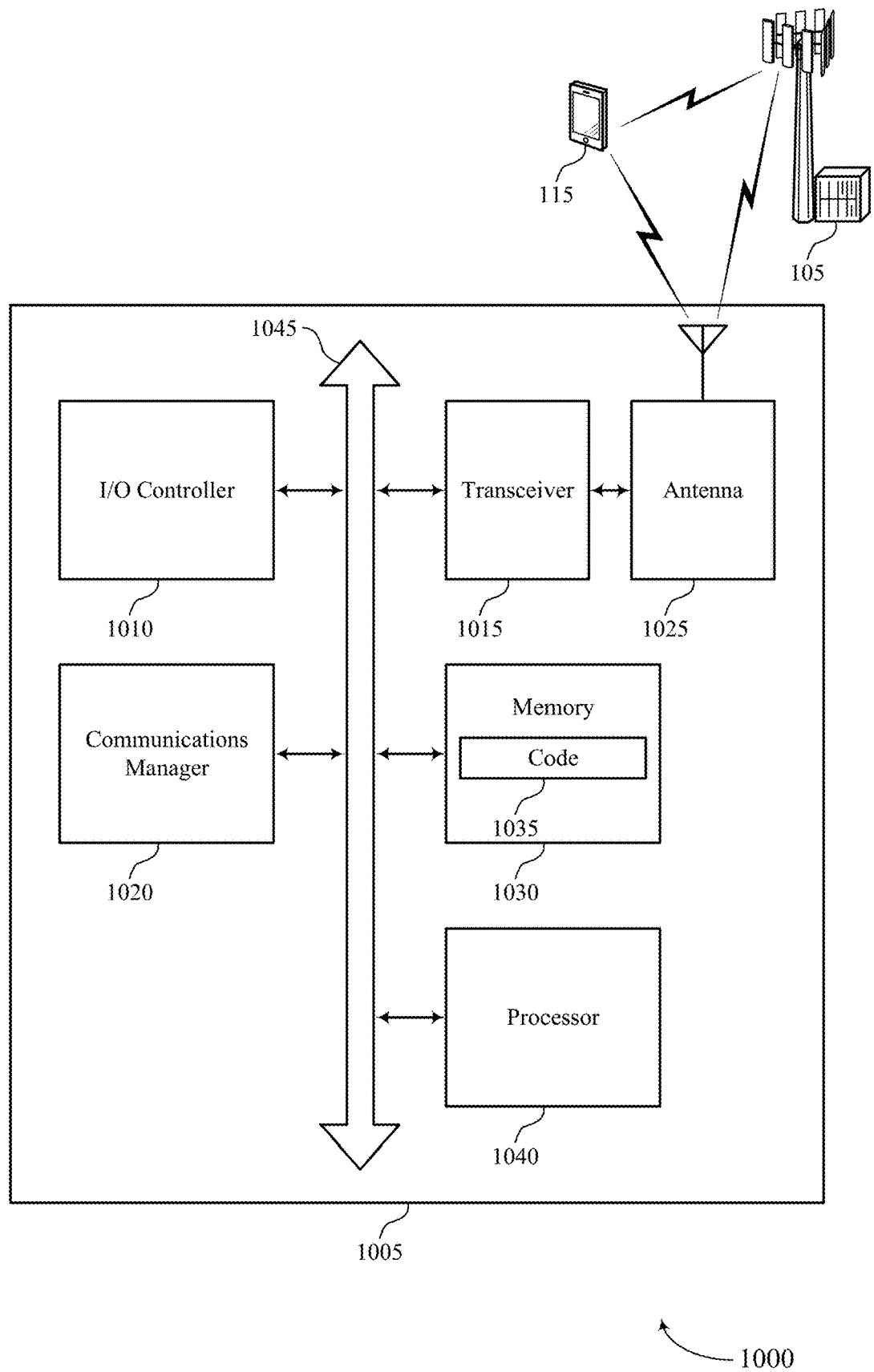
FIG. 10 shows a diagram of a system including a UE that supports coding techniques for reference signal index modulation communications in accordance with aspects of the present disclosure.

FIG. 10 shows a diagram of a system 1000 including a device 1005 that supports coding techniques for reference signal index modulation communications in accordance with aspects of the present disclosure. The device 1005 may be an example of or include the components of a device 705, a device 805, or a UE 115 as described herein. The device 1005 may communicate wirelessly with one or more base stations 105, UEs 115, or any combination thereof. The device 1005 may include components for bi-directional voice and data communications including components for transmitting and receiving communications, such as a communications manager 1020, an input/output (I/O) controller 1010, a transceiver 1015, an antenna 1025, a memory 1030, code 1035, and a processor 1040. These components may be in electronic communication or otherwise coupled (e.g., operatively, communicatively, functionally, electronically, electrically) via one or more buses (e.g., a bus 1045).

The I/O controller 1010 may manage input and output signals for the device 1005. The I/O controller 1010 may also manage peripherals not integrated into the device 1005. In some cases, the I/O controller 1010 may represent a physical connection or port to an external peripheral. In some cases, the I/O controller 1010 may utilize an operating system such as iOS®, ANDROID®, MS-DOS®, MS-WINDOWS®, OS/2®, UNIX®, LINUX®, or another known operating system. Additionally or alternatively, the I/O controller 1010 may represent or interact with a modem, a keyboard, a mouse, a touchscreen, or a similar device. In some cases, the I/O controller 1010 may be implemented as part of a processor, such as the processor 1040. In some cases, a user may interact with the device 1005 via the I/O controller 1010 or via hardware components controlled by the I/O controller 1010.

In some cases, the device 1005 may include a single antenna 1025. However, in some other cases, the device 1005 may have more than one antenna 1025, which may be capable of concurrently transmitting or receiving multiple wireless transmissions. The transceiver 1015 may communicate bi-directionally, via the one or more antennas 1025, wired, or wireless links as described herein. For example, the transceiver 1015 may represent a wireless transceiver and may communicate bi-directionally with another wireless transceiver. The transceiver 1015 may also include a modem to modulate the packets, to provide the modulated packets to one or more antennas 1025 for transmission, and to demodulate packets received from the one or more antennas 1025. The transceiver 1015, or the transceiver 1015 and one or more antennas 1025, may be an example of a transmitter 715, a transmitter 815, a receiver 710, a receiver 810, or any combination thereof or component thereof, as described herein.

The memory 1030 may include random access memory (RAM) and read-only memory (ROM). The memory 1030 may store computer-readable, computer-executable code 1035 including instructions that, when executed by the processor 1040, cause the device 1005 to perform various functions described herein. The code 1035 may be stored in a non-transitory computer-readable medium such as system memory or another type of memory. In some cases, the code 1035 may not be directly executable by the processor 1040 but may cause a computer (e.g., when compiled and executed) to perform functions described herein. In some cases, the memory 1030 may contain, among other things, a basic I/O system (BIOS) which may control basic hardware or software operation such as the interaction with peripheral components or devices.

The processor 1040 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1040 may be configured to operate a memory array using a memory controller. In some other cases, a memory controller may be integrated into the processor 1040. The processor 1040 may be configured to execute computer-readable instructions stored in a memory (e.g., the memory 1030) to cause the device 1005 to perform various functions (e.g., functions or tasks supporting coding techniques for reference signal index modulation communications). For example, the device 1005 or a component of the device 1005 may include a processor 1040 and memory 1030 coupled to the processor 1040, the processor 1040 and memory 1030 configured to perform various functions described herein.

The communications manager 1020 may support wireless communication at a transmitting device in accordance with examples as disclosed herein. For example, the communications manager 1020 may be configured as or otherwise support a means for identifying a set of information bits to be transmitted to a receiving device via one or more reference signals using a reference signal index modulation scheme, where the reference signal index modulation scheme uses one or more activation states of the one or more reference signal transmissions to indicate one or more transmitted bits. The communications manager 1020 may be configured as or otherwise support a means for coding the set of information bits to generate an encoded set of bits for transmission using the reference signal index modulation scheme. The communications manager 1020 may be configured as or otherwise support a means for transmitting the encoded set of bits to the receiving device using the reference signal index modulation scheme.

Additionally or alternatively, the communications manager 1020 may support wireless communication at a receiving device in accordance with examples as disclosed herein. For example, the communications manager 1020 may be configured as or otherwise support a means for receiving, from a transmitting device, one or more reference signal transmissions that are modulated according to a reference signal index modulation scheme, where the reference signal index modulation scheme uses one or more activation states of the one or more reference signal transmissions to indicate one or more information bits. The communications manager 1020 may be configured as or otherwise support a means for demodulating an encoded set of bits from the one or more reference signal transmissions based on the reference signal index modulation scheme. The communications manager 1020 may be configured as or otherwise support a means for decoding the encoded set of bits to determine a set of information bits from the transmitting device.

By including or configuring the communications manager 1020 in accordance with examples as described herein, the device 1005 may support techniques for conveying coded information bits using RS-IM. At least one implementation may enable the communications manager 1020 to provide more efficient utilization of communication resources for the device 1005 by configuring the device 1005 to provide higher reliability communications through channel coding, error detection, and interleaving. At least another implementation may enable the communications manager 1020 to provide improved coordination between devices including the device 1005 by configuring the device 1005 to convey information bits via RS-IM using coding techniques as discussed herein. Based on implementing reference signal index modulation with techniques described herein, the device 1005 may experience longer battery life as a result of improved communication reliability and reduced latency of conveying information bits to other devices.

In some examples, the communications manager 1020 may be configured to perform various operations (e.g., receiving, monitoring, transmitting) using or otherwise in cooperation with the transceiver 1015, the one or more antennas 1025, or any combination thereof. Although the communications manager 1020 is illustrated as a separate component, in some examples, one or more functions described with reference to the communications manager 1020 may be supported by or performed by the processor 1040, the memory 1030, the code 1035, or any combination thereof. For example, the code 1035 may include instructions executable by the processor 1040 to cause the device 1005 to perform various aspects of coding techniques for reference signal index modulation communications as described herein, or the processor 1040 and the memory 1030 may be otherwise configured to perform or support such operations.

Figure 11:
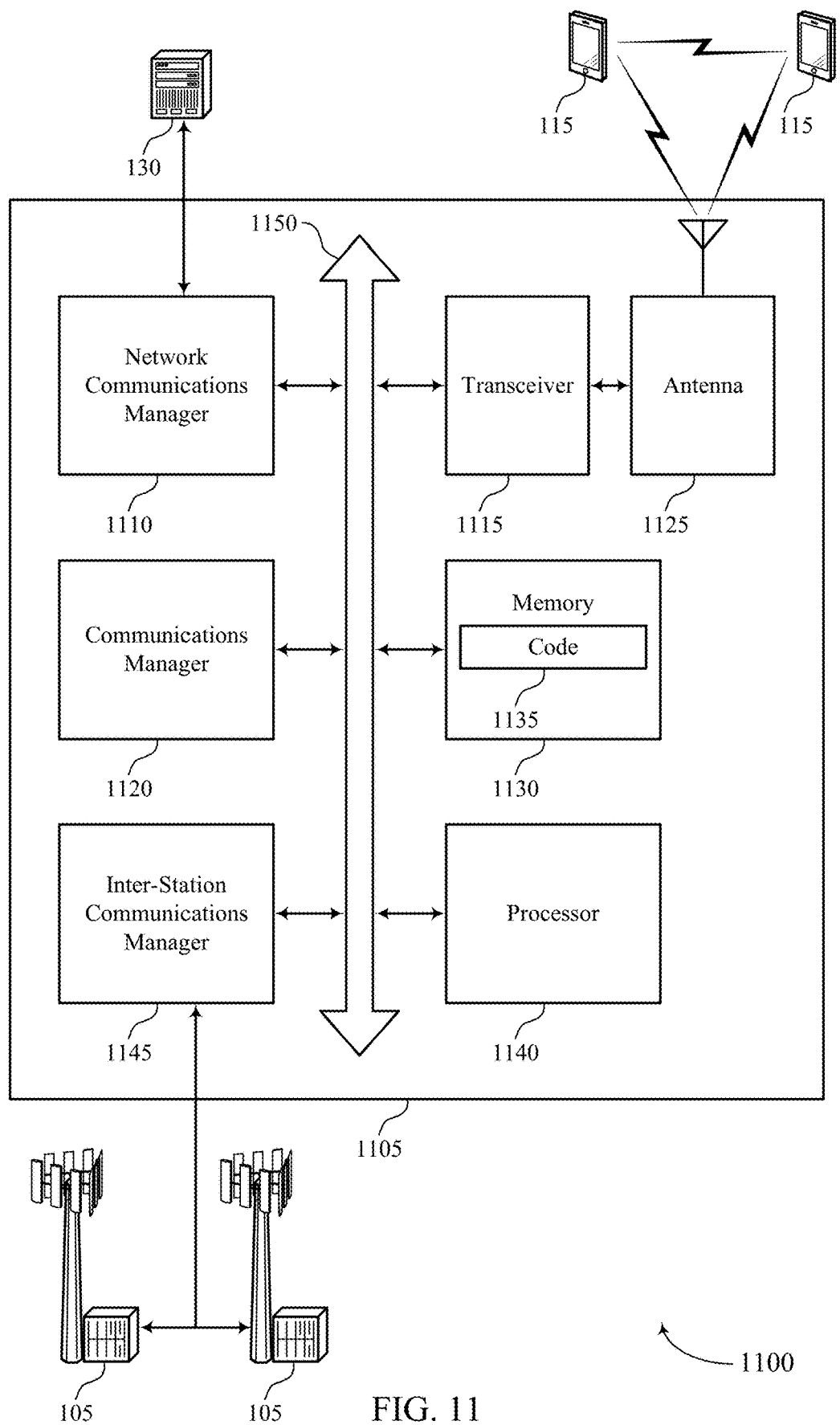
FIG. 11 shows a diagram of a system including a base station that supports coding techniques for reference signal index modulation communications in accordance with aspects of the present disclosure.

FIG. 11 shows a diagram of a system 1100 including a device 1105 that supports coding techniques for reference signal index modulation communications in accordance with aspects of the present disclosure. The device 1105 may be an example of or include the components of a device 705, a device 805, or a base station 105 as described herein. The device 1105 may communicate wirelessly with one or more base stations 105, UEs 115, or any combination thereof. The device 1105 may include components for bi-directional voice and data communications including components for transmitting and receiving communications, such as a communications manager 1120, a network communications manager 1110, a transceiver 1115, an antenna 1125, a memory 1130, code 1135, a processor 1140, and an inter-station communications manager 1145. These components may be in electronic communication or otherwise coupled (e.g., operatively, communicatively, functionally, electronically, electrically) via one or more buses (e.g., a bus 1150).

The network communications manager 1110 may manage communications with a core network 130 (e.g., via one or more wired backhaul links). For example, the network communications manager 1110 may manage the transfer of data communications for client devices, such as one or more UEs 115.

In some cases, the device 1105 may include a single antenna 1125. However, in some other cases the device 1105 may have more than one antenna 1125, which may be capable of concurrently transmitting or receiving multiple wireless transmissions. The transceiver 1115 may communicate bi-directionally, via the one or more antennas 1125, wired, or wireless links as described herein. For example, the transceiver 1115 may represent a wireless transceiver and may communicate bi-directionally with another wireless transceiver. The transceiver 1115 may also include a modem to modulate the packets, to provide the modulated packets to one or more antennas 1125 for transmission, and to demodulate packets received from the one or more antennas 1125. The transceiver 1115, or the transceiver 1115 and one or more antennas 1125, may be an example of a transmitter 715, a transmitter 815, a receiver 710, a receiver 810, or any combination thereof or component thereof, as described herein.

The memory 1130 may include RAM and ROM. The memory 1130 may store computer-readable, computer-executable code 1135 including instructions that, when executed by the processor 1140, cause the device 1105 to perform various functions described herein. The code 1135 may be stored in a non-transitory computer-readable medium such as system memory or another type of memory. In some cases, the code 1135 may not be directly executable by the processor 1140 but may cause a computer (e.g., when compiled and executed) to perform functions described herein. In some cases, the memory 1130 may contain, among other things, a BIOS which may control basic hardware or software operation such as the interaction with peripheral components or devices.

The processor 1140 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1140 may be configured to operate a memory array using a memory controller. In some other cases, a memory controller may be integrated into the processor 1140. The processor 1140 may be configured to execute computer-readable instructions stored in a memory (e.g., the memory 1130) to cause the device 1105 to perform various functions (e.g., functions or tasks supporting coding techniques for reference signal index modulation communications). For example, the device 1105 or a component of the device 1105 may include a processor 1140 and memory 1130 coupled to the processor 1140, the processor 1140 and memory 1130 configured to perform various functions described herein.

The inter-station communications manager 1145 may manage communications with other base stations 105, and may include a controller or scheduler for controlling communications with UEs 115 in cooperation with other base stations 105. For example, the inter-station communications manager 1145 may coordinate scheduling for transmissions to UEs 115 for various interference mitigation techniques such as beamforming or joint transmission. In some examples, the inter-station communications manager 1145 may provide an X2 interface within an LTE/LTE-A wireless communications network technology to provide communication between base stations 105.

The communications manager 1120 may support wireless communication at a transmitting device in accordance with examples as disclosed herein. For example, the communications manager 1120 may be configured as or otherwise support a means for identifying a set of information bits to be transmitted to a receiving device via one or more reference signals using a reference signal index modulation scheme, where the reference signal index modulation scheme uses one or more activation states of the one or more reference signal transmissions to indicate one or more transmitted bits. The communications manager 1120 may be configured as or otherwise support a means for coding the set of information bits to generate an encoded set of bits for transmission using the reference signal index modulation scheme. The communications manager 1120 may be configured as or otherwise support a means for transmitting the encoded set of bits to the receiving device using the reference signal index modulation scheme.

Additionally or alternatively, the communications manager 1120 may support wireless communication at a receiving device in accordance with examples as disclosed herein. For example, the communications manager 1120 may be configured as or otherwise support a means for receiving, from a transmitting device, one or more reference signal transmissions that are modulated according to a reference signal index modulation scheme, where the reference signal index modulation scheme uses one or more activation states of the one or more reference signal transmissions to indicate one or more information bits. The communications manager 1120 may be configured as or otherwise support a means for demodulating an encoded set of bits from the one or more reference signal transmissions based on the reference signal index modulation scheme. The communications manager 1120 may be configured as or otherwise support a means for decoding the encoded set of bits to determine a set of information bits from the transmitting device.

In some examples, the communications manager 1120 may be configured to perform various operations (e.g., receiving, monitoring, transmitting) using or otherwise in cooperation with the transceiver 1115, the one or more antennas 1125, or any combination thereof. Although the communications manager 1120 is illustrated as a separate component, in some examples, one or more functions described with reference to the communications manager 1120 may be supported by or performed by the processor 1140, the memory 1130, the code 1135, or any combination thereof. For example, the code 1135 may include instructions executable by the processor 1140 to cause the device 1105 to perform various aspects of coding techniques for reference signal index modulation communications as described herein, or the processor 1140 and the memory 1130 may be otherwise configured to perform or support such operations.

Figure 12:
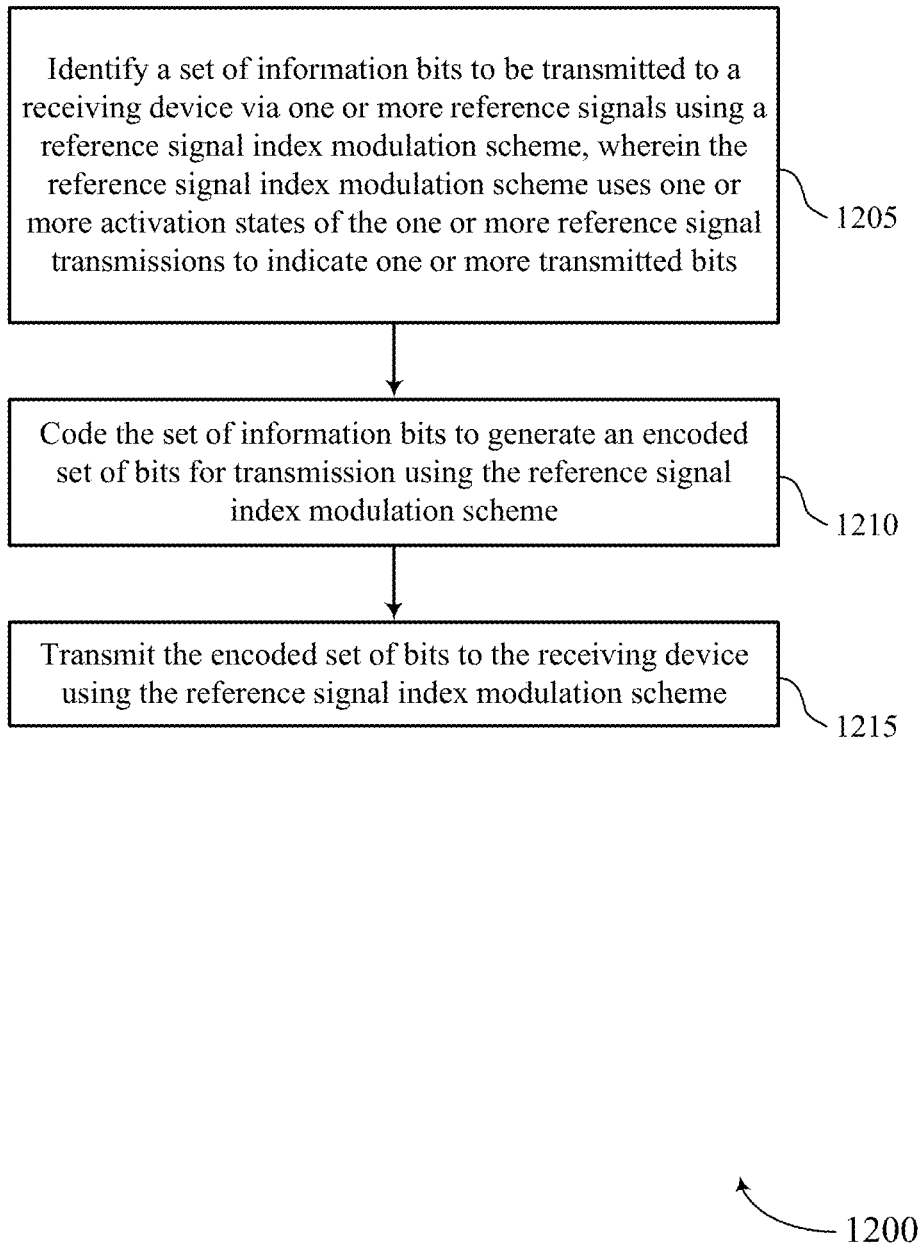
FIGS. 12 through 25 show flowcharts illustrating methods that support coding techniques for reference signal index modulation communications in accordance with aspects of the present disclosure.

FIG. 12 shows a flowchart illustrating a method 1200 that supports coding techniques for reference signal index modulation communications in accordance with aspects of the present disclosure. The operations of the method 1200 may be implemented by a UE or a base station or its components as described herein. For example, the operations of the method 1200 may be performed by a UE 115 or a base station 105 as described with reference to FIGS. 1 through 11. In some examples, a UE or a base station may execute a set of instructions to control the functional elements of the UE or the base station to perform the described functions. Additionally or alternatively, the UE or the base station may perform aspects of the described functions using special-purpose hardware.

At 1205, the method may include identifying a set of information bits to be transmitted to a receiving device via one or more reference signals using a reference signal index modulation scheme, where the reference signal index modulation scheme uses one or more activation states of the one or more reference signal transmissions to indicate one or more transmitted bits. The operations of 1205 may be performed in accordance with examples as disclosed herein. In some examples, aspects of the operations of 1205 may be performed by an RS-IM manager 925 as described with reference to FIG. 9.

At 1210, the method may include coding the set of information bits to generate an encoded set of bits for transmission using the reference signal index modulation scheme. The operations of 1210 may be performed in accordance with examples as disclosed herein. In some examples, aspects of the operations of 1210 may be performed by an RS-IM encoder 930 as described with reference to FIG. 9.

At 1215, the method may include transmitting the encoded set of bits to the receiving device using the reference signal index modulation scheme. The operations of 1215 may be performed in accordance with examples as disclosed herein. In some examples, aspects of the operations of 1215 may be performed by a reference signal transmission manager 935 as described with reference to FIG. 9.

Figure 13:
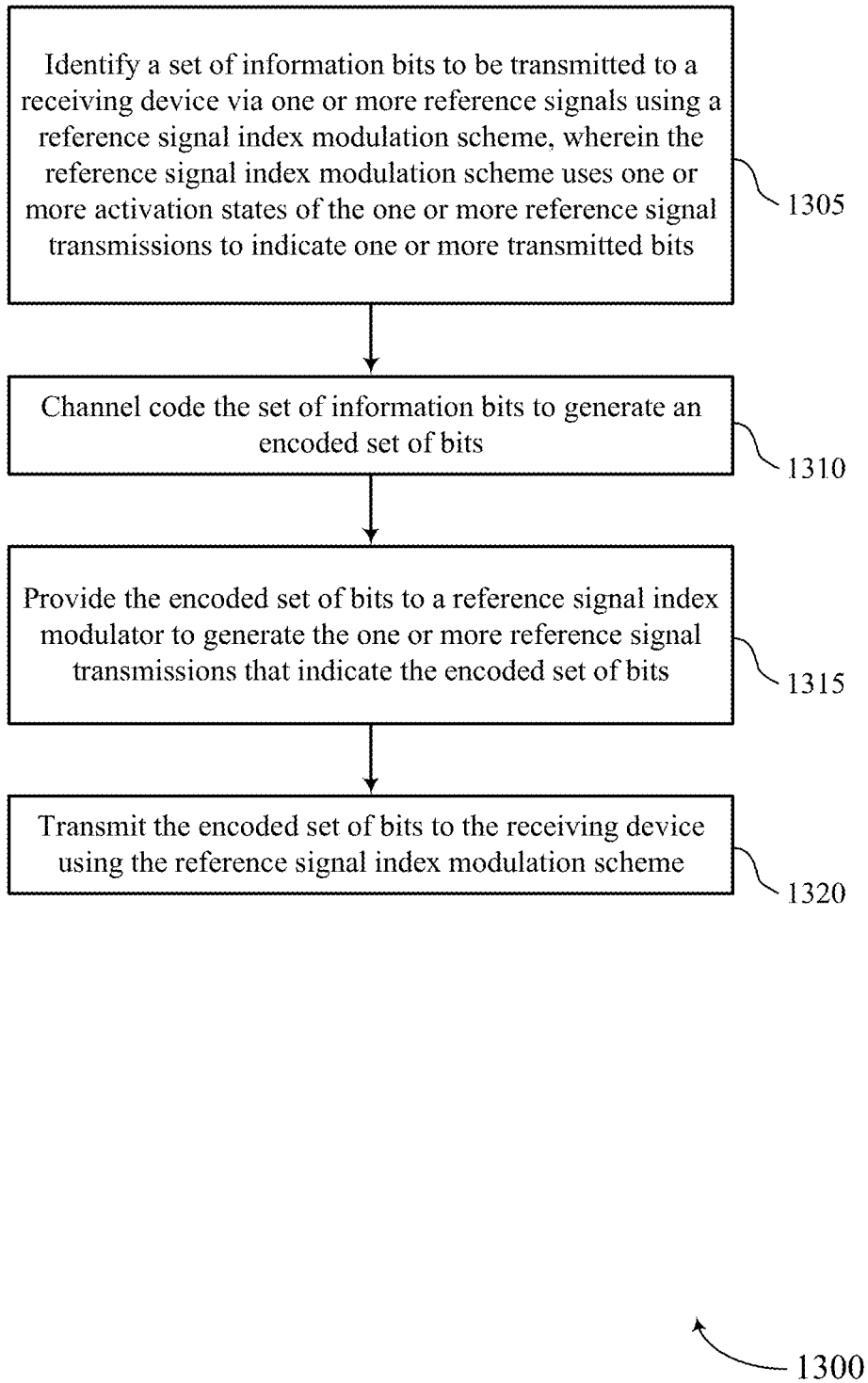

FIG. 13 shows a flowchart illustrating a method 1300 that supports coding techniques for reference signal index modulation communications in accordance with aspects of the present disclosure. The operations of the method 1300 may be implemented by a UE or a base station or its components as described herein. For example, the operations of the method 1300 may be performed by a UE 115 or a base station 105 as described with reference to FIGS. 1 through 11. In some examples, a UE or a base station may execute a set of instructions to control the functional elements of the UE or the base station to perform the described functions. Additionally or alternatively, the UE or the base station may perform aspects of the described functions using special-purpose hardware.

At 1305, the method may include identifying a set of information bits to be transmitted to a receiving device via one or more reference signals using a reference signal index modulation scheme, where the reference signal index modulation scheme uses one or more activation states of the one or more reference signal transmissions to indicate one or more transmitted bits. The operations of 1305 may be performed in accordance with examples as disclosed herein. In some examples, aspects of the operations of 1305 may be performed by an RS-IM manager 925 as described with reference to FIG. 9.

At 1310, the method may include channel coding the set of information bits to generate an encoded set of bits. The operations of 1310 may be performed in accordance with examples as disclosed herein. In some examples, aspects of the operations of 1310 may be performed by an RS-IM encoder 930 as described with reference to FIG. 9.

At 1315, the method may include providing the encoded set of bits to a reference signal index modulator to generate the one or more reference signal transmissions that indicate the encoded set of bits. The operations of 1315 may be performed in accordance with examples as disclosed herein. In some examples, aspects of the operations of 1315 may be performed by an RS-IM encoder 930 as described with reference to FIG. 9.

At 1320, the method may include transmitting the encoded set of bits to the receiving device using the reference signal index modulation scheme. The operations of 1320 may be performed in accordance with examples as disclosed herein. In some examples, aspects of the operations of 1320 may be performed by a reference signal transmission manager 935 as described with reference to FIG. 9.

Figure 14:
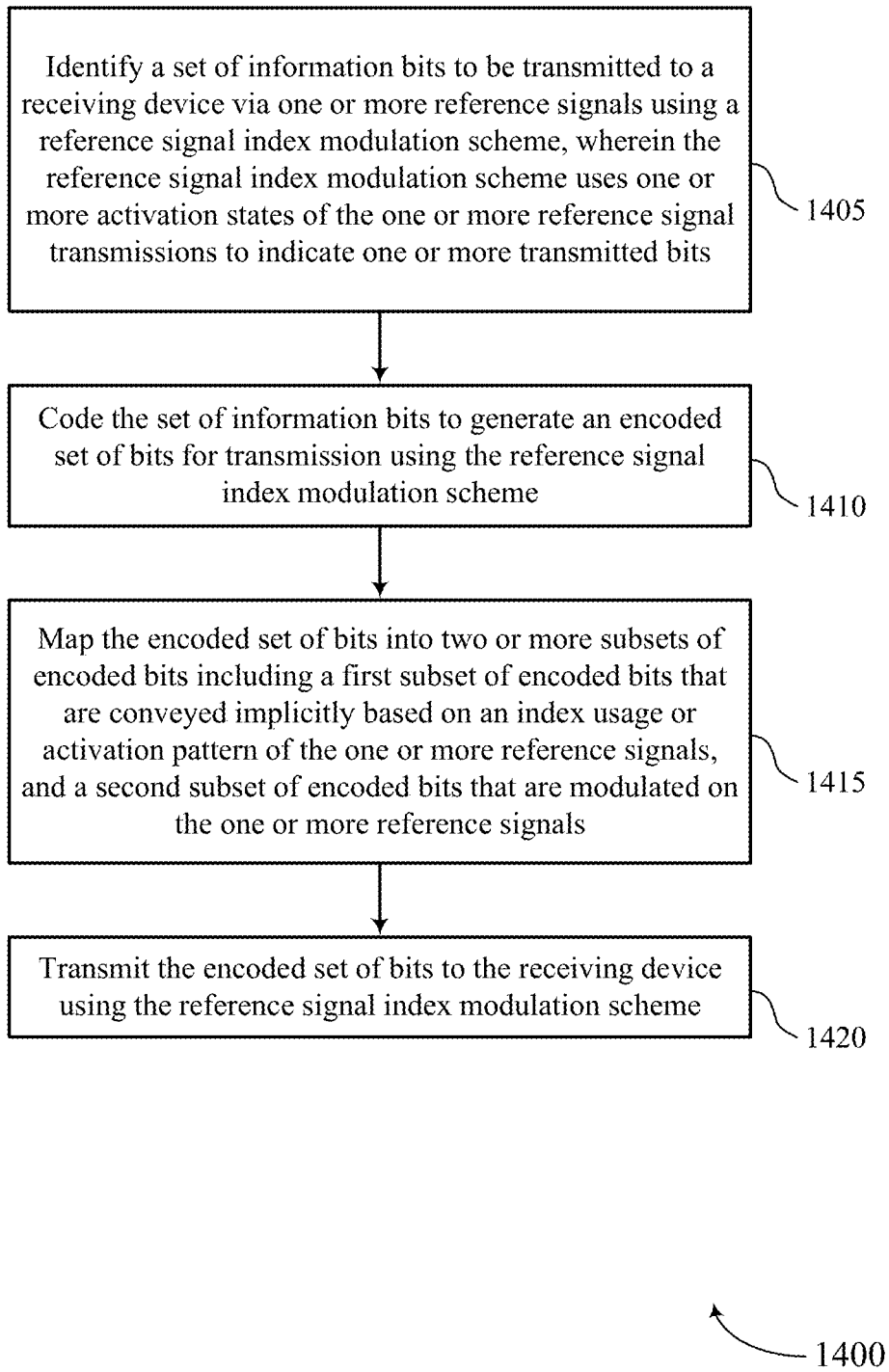

FIG. 14 shows a flowchart illustrating a method 1400 that supports coding techniques for reference signal index modulation communications in accordance with aspects of the present disclosure. The operations of the method 1400 may be implemented by a UE or a base station or its components as described herein. For example, the operations of the method 1400 may be performed by a UE 115 or a base station 105 as described with reference to FIGS. 1 through 11. In some examples, a UE or a base station may execute a set of instructions to control the functional elements of the UE or the base station to perform the described functions. Additionally or alternatively, the UE or the base station may perform aspects of the described functions using special-purpose hardware.

At 1405, the method may include identifying a set of information bits to be transmitted to a receiving device via one or more reference signals using a reference signal index modulation scheme, where the reference signal index modulation scheme uses one or more activation states of the one or more reference signal transmissions to indicate one or more transmitted bits. The operations of 1405 may be performed in accordance with examples as disclosed herein. In some examples, aspects of the operations of 1405 may be performed by an RS-IM manager 925 as described with reference to FIG. 9.

At 1410, the method may include coding the set of information bits to generate an encoded set of bits for transmission using the reference signal index modulation scheme. The operations of 1410 may be performed in accordance with examples as disclosed herein. In some examples, aspects of the operations of 1410 may be performed by an RS-IM encoder 930 as described with reference to FIG. 9.

At 1415, the method may include mapping the encoded set of bits into two or more subsets of encoded bits including a first subset of encoded bits that are conveyed implicitly based on an index usage or activation pattern of the one or more reference signals, and a second subset of encoded bits that are modulated on the one or more reference signals. The operations of 1415 may be performed in accordance with examples as disclosed herein. In some examples, aspects of the operations of 1415 may be performed by a mapping manager 950 as described with reference to FIG. 9.

At 1420, the method may include transmitting the encoded set of bits to the receiving device using the reference signal index modulation scheme. The operations of 1420 may be performed in accordance with examples as disclosed herein. In some examples, aspects of the operations of 1420 may be performed by a reference signal transmission manager 935 as described with reference to FIG. 9.

Figure 15:
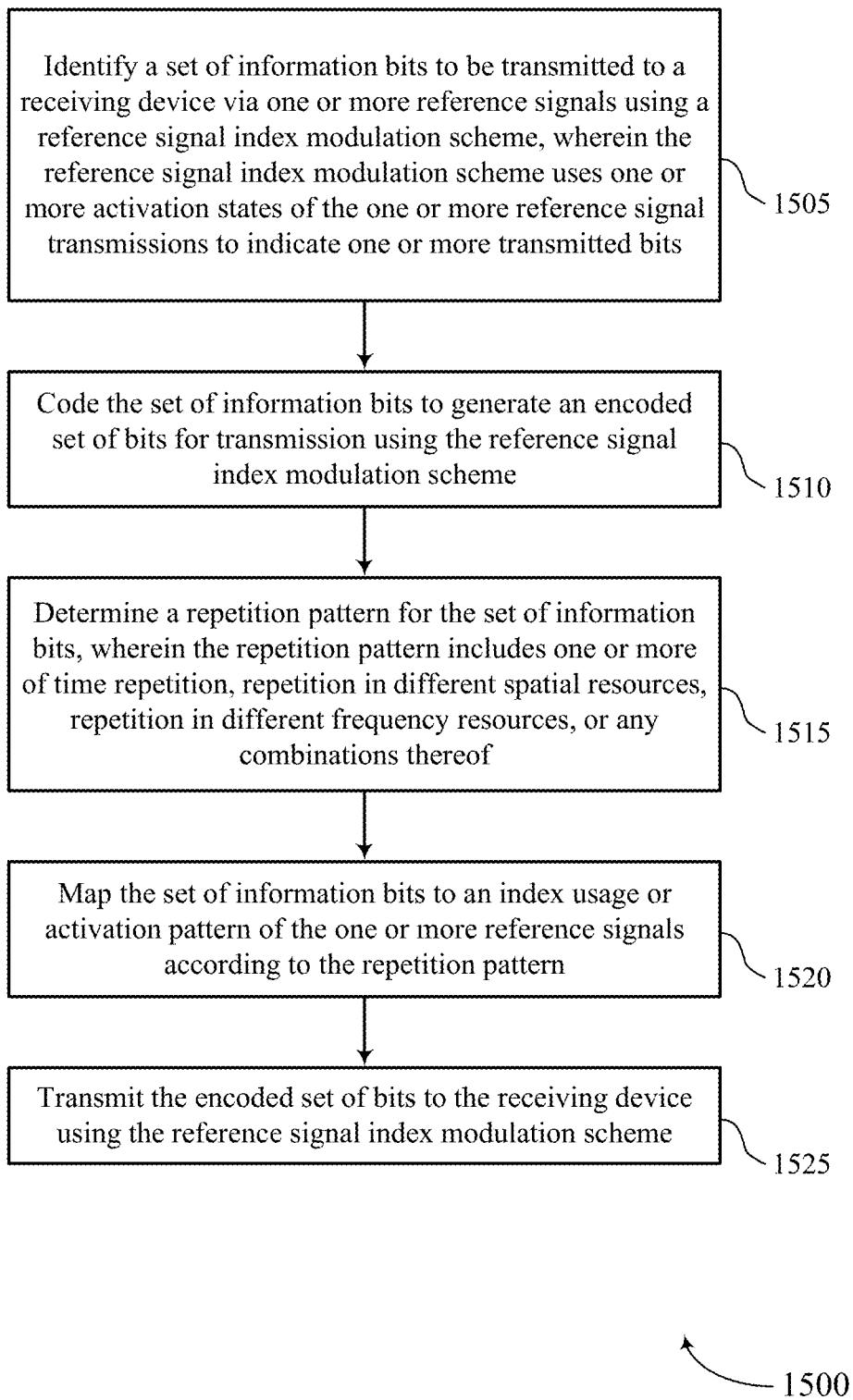

FIG. 15 shows a flowchart illustrating a method 1500 that supports coding techniques for reference signal index modulation communications in accordance with aspects of the present disclosure. The operations of the method 1500 may be implemented by a UE or a base station or its components as described herein. For example, the operations of the method 1500 may be performed by a UE 115 or a base station 105 as described with reference to FIGS. 1 through 11. In some examples, a UE or a base station may execute a set of instructions to control the functional elements of the UE or the base station to perform the described functions. Additionally or alternatively, the UE or the base station may perform aspects of the described functions using special-purpose hardware.

At 1505, the method may include identifying a set of information bits to be transmitted to a receiving device via one or more reference signals using a reference signal index modulation scheme, where the reference signal index modulation scheme uses one or more activation states of the one or more reference signal transmissions to indicate one or more transmitted bits. The operations of 1505 may be performed in accordance with examples as disclosed herein. In some examples, aspects of the operations of 1505 may be performed by an RS-IM manager 925 as described with reference to FIG. 9.

At 1510, the method may include coding the set of information bits to generate an encoded set of bits for transmission using the reference signal index modulation scheme. The operations of 1510 may be performed in accordance with examples as disclosed herein. In some examples, aspects of the operations of 1510 may be performed by an RS-IM encoder 930 as described with reference to FIG. 9.

At 1515, the method may include determining a repetition pattern for the set of information bits, where the repetition pattern includes one or more of time repetition, repetition in different spatial resources, repetition in different frequency resources, or any combinations thereof. The operations of 1515 may be performed in accordance with examples as disclosed herein. In some examples, aspects of the operations of 1515 may be performed by a mapping manager 950 as described with reference to FIG. 9.

At 1520, the method may include mapping the set of information bits to an index usage or activation pattern of the one or more reference signals according to the repetition pattern. The operations of 1520 may be performed in accordance with examples as disclosed herein. In some examples, aspects of the operations of 1520 may be performed by a mapping manager 950 as described with reference to FIG. 9.

At 1525, the method may include transmitting the encoded set of bits to the receiving device using the reference signal index modulation scheme. The operations of 1525 may be performed in accordance with examples as disclosed herein. In some examples, aspects of the operations of 1525 may be performed by a reference signal transmission manager 935 as described with reference to FIG. 9.

Figure 16:
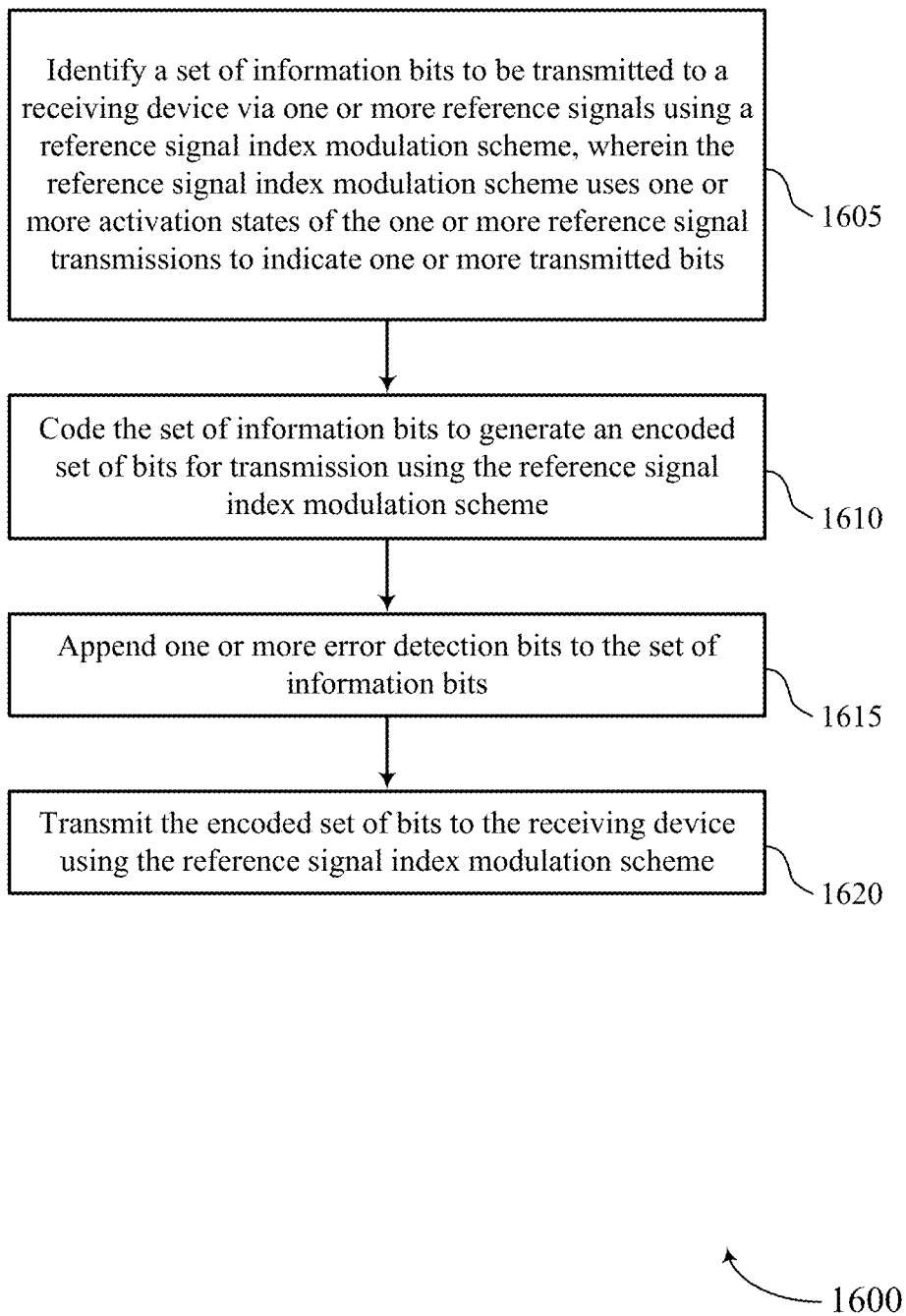

FIG. 16 shows a flowchart illustrating a method 1600 that supports coding techniques for reference signal index modulation communications in accordance with aspects of the present disclosure. The operations of the method 1600 may be implemented by a UE or a base station or its components as described herein. For example, the operations of the method 1600 may be performed by a UE 115 or a base station 105 as described with reference to FIGS. 1 through 11. In some examples, a UE or a base station may execute a set of instructions to control the functional elements of the UE or the base station to perform the described functions. Additionally or alternatively, the UE or the base station may perform aspects of the described functions using special-purpose hardware.

At 1605, the method may include identifying a set of information bits to be transmitted to a receiving device via one or more reference signals using a reference signal index modulation scheme, where the reference signal index modulation scheme uses one or more activation states of the one or more reference signal transmissions to indicate one or more transmitted bits. The operations of 1605 may be performed in accordance with examples as disclosed herein. In some examples, aspects of the operations of 1605 may be performed by an RS-IM manager 925 as described with reference to FIG. 9.

At 1610, the method may include coding the set of information bits to generate an encoded set of bits for transmission using the reference signal index modulation scheme. The operations of 1610 may be performed in accordance with examples as disclosed herein. In some examples, aspects of the operations of 1610 may be performed by an RS-IM encoder 930 as described with reference to FIG. 9.

At 1615, the method may include appending one or more error detection bits to the set of information bits. The operations of 1615 may be performed in accordance with examples as disclosed herein. In some examples, aspects of the operations of 1615 may be performed by an error detection manager 960 as described with reference to FIG. 9.

At 1620, the method may include transmitting the encoded set of bits to the receiving device using the reference signal index modulation scheme. The operations of 1620 may be performed in accordance with examples as disclosed herein. In some examples, aspects of the operations of 1620 may be performed by a reference signal transmission manager 935 as described with reference to FIG. 9.

Figure 17:
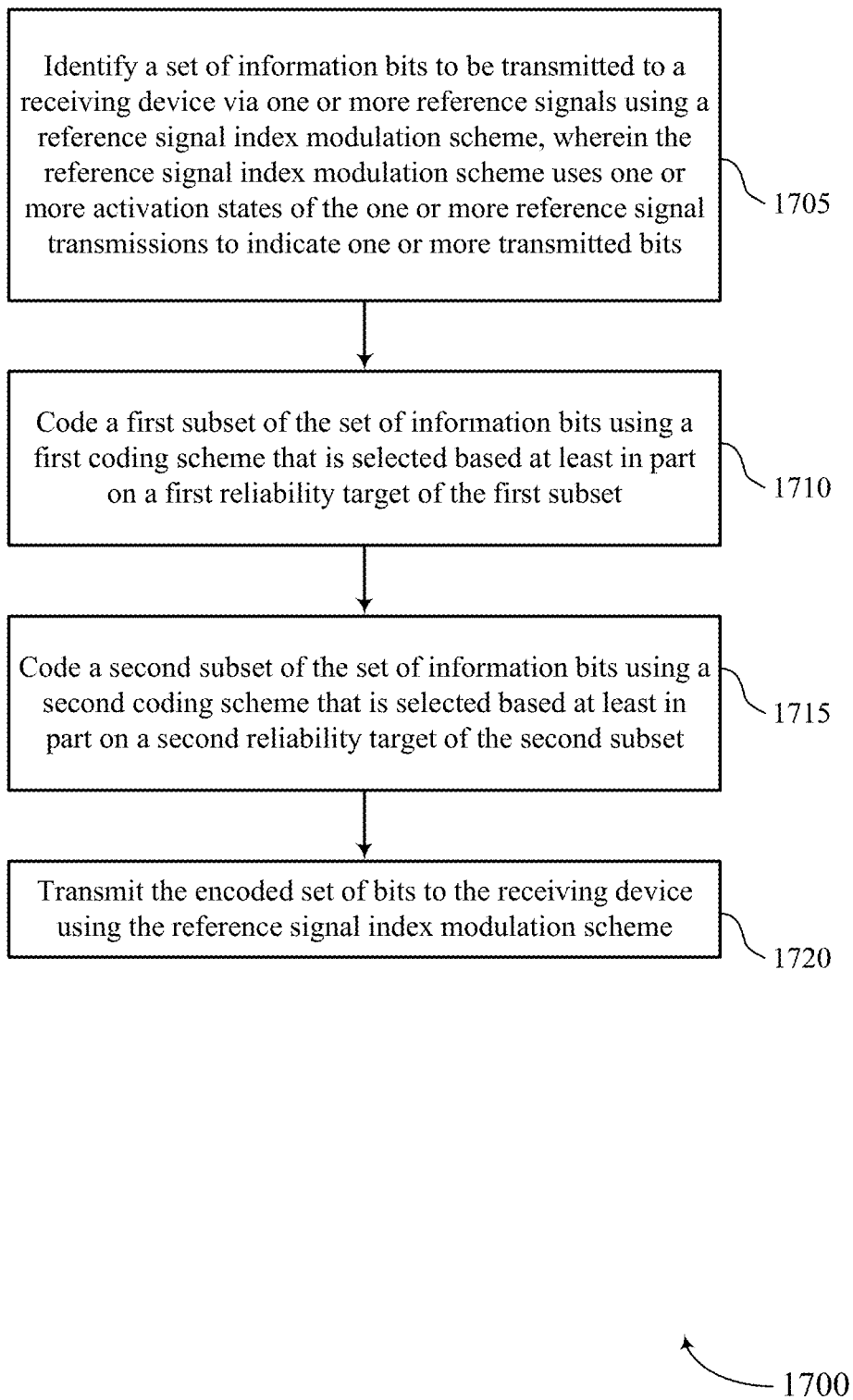

FIG. 17 shows a flowchart illustrating a method 1700 that supports coding techniques for reference signal index modulation communications in accordance with aspects of the present disclosure. The operations of the method 1700 may be implemented by a UE or a base station or its components as described herein. For example, the operations of the method 1700 may be performed by a UE 115 or a base station 105 as described with reference to FIGS. 1 through 11. In some examples, a UE or a base station may execute a set of instructions to control the functional elements of the UE or the base station to perform the described functions. Additionally or alternatively, the UE or the base station may perform aspects of the described functions using special-purpose hardware.

At 1705, the method may include identifying a set of information bits to be transmitted to a receiving device via one or more reference signals using a reference signal index modulation scheme, where the reference signal index modulation scheme uses one or more activation states of the one or more reference signal transmissions to indicate one or more transmitted bits. The operations of 1705 may be performed in accordance with examples as disclosed herein. In some examples, aspects of the operations of 1705 may be performed by an RS-IM manager 925 as described with reference to FIG. 9.

At 1710, the method may include coding a first subset of the set of information bits using a first coding scheme that is selected based on a first reliability target of the first subset. The operations of 1710 may be performed in accordance with examples as disclosed herein. In some examples, aspects of the operations of 1710 may be performed by an RS-IM encoder 930 as described with reference to FIG. 9.

At 1715, the method may include coding a second subset of the set of information bits using a second coding scheme that is selected based on a second reliability target of the second subset. The operations of 1715 may be performed in accordance with examples as disclosed herein. In some examples, aspects of the operations of 1715 may be performed by an RS-IM encoder 930 as described with reference to FIG. 9.

At 1720, the method may include transmitting the encoded first and second subsets of bits to the receiving device using the reference signal index modulation scheme. The operations of 1720 may be performed in accordance with examples as disclosed herein. In some examples, aspects of the operations of 1720 may be performed by a reference signal transmission manager 935 as described with reference to FIG. 9.

Figure 18:
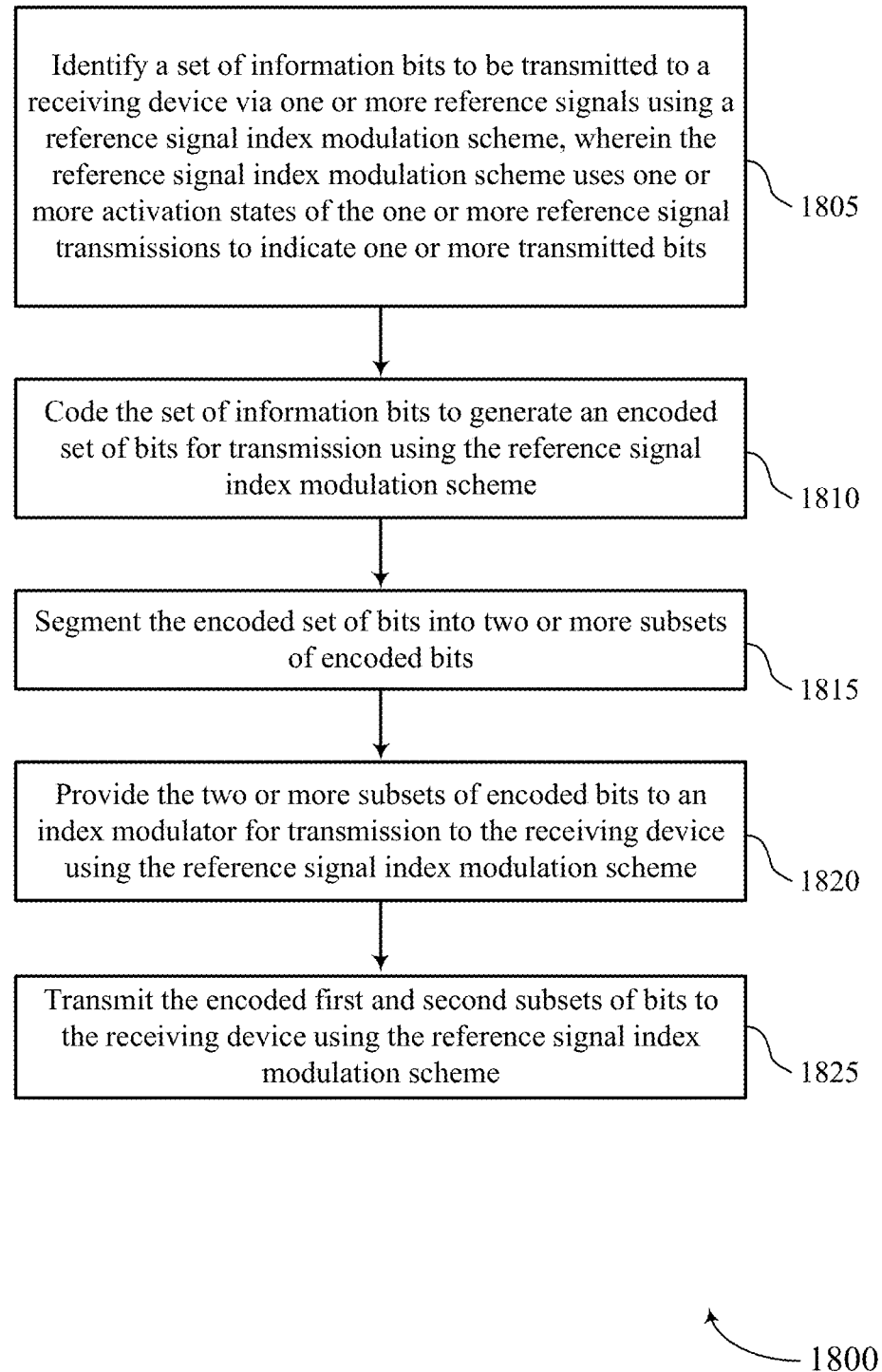

FIG. 18 shows a flowchart illustrating a method 1800 that supports coding techniques for reference signal index modulation communications in accordance with aspects of the present disclosure. The operations of the method 1800 may be implemented by a UE or a base station or its components as described herein. For example, the operations of the method 1800 may be performed by a UE 115 or a base station 105 as described with reference to FIGS. 1 through 11. In some examples, a UE or a base station may execute a set of instructions to control the functional elements of the UE or the base station to perform the described functions. Additionally or alternatively, the UE or the base station may perform aspects of the described functions using special-purpose hardware.

At 1805, the method may include identifying a set of information bits to be transmitted to a receiving device via one or more reference signals using a reference signal index modulation scheme, where the reference signal index modulation scheme uses one or more activation states of the one or more reference signal transmissions to indicate one or more transmitted bits. The operations of 1805 may be performed in accordance with examples as disclosed herein. In some examples, aspects of the operations of 1805 may be performed by an RS-IM manager 925 as described with reference to FIG. 9.

At 1810, the method may include coding the set of information bits to generate an encoded set of bits for transmission using the reference signal index modulation scheme. The operations of 1810 may be performed in accordance with examples as disclosed herein. In some examples, aspects of the operations of 1810 may be performed by an RS-IM encoder 930 as described with reference to FIG. 9.

At 1815, the method may include segmenting the encoded set of bits into two or more subsets of encoded bits. The operations of 1815 may be performed in accordance with examples as disclosed herein. In some examples, aspects of the operations of 1815 may be performed by an RS-IM encoder 930 as described with reference to FIG. 9.

At 1820, the method may include providing the two or more subsets of encoded bits to an index modulator for transmission to the receiving device using the reference signal index modulation scheme. The operations of 1820 may be performed in accordance with examples as disclosed herein. In some examples, aspects of the operations of 1820 may be performed by an RS-IM encoder 930 as described with reference to FIG. 9.

At 1825, the method may include transmitting the encoded set of bits to the receiving device using the reference signal index modulation scheme. The operations of 1825 may be performed in accordance with examples as disclosed herein. In some examples, aspects of the operations of 1825 may be performed by a reference signal transmission manager 935 as described with reference to FIG. 9.

Figure 19:
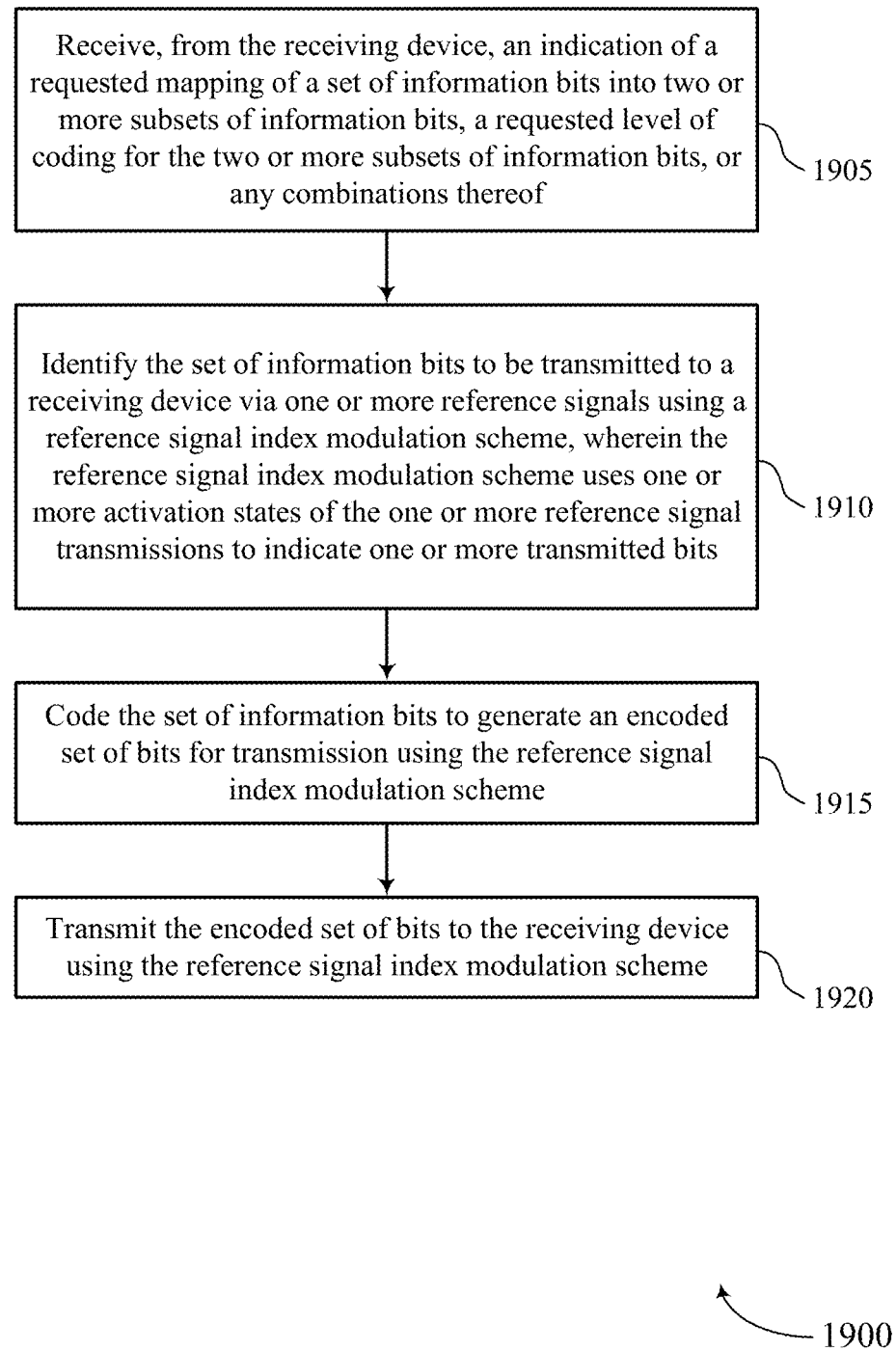

FIG. 19 shows a flowchart illustrating a method 1900 that supports coding techniques for reference signal index modulation communications in accordance with aspects of the present disclosure. The operations of the method 1900 may be implemented by a UE or a base station or its components as described herein. For example, the operations of the method 1900 may be performed by a UE 115 or a base station 105 as described with reference to FIGS. 1 through 11. In some examples, a UE or a base station may execute a set of instructions to control the functional elements of the UE or the base station to perform the described functions. Additionally or alternatively, the UE or the base station may perform aspects of the described functions using special-purpose hardware.

At 1905, the method may include receiving, from the receiving device, an indication of a requested mapping of a set of information bits into two or more subsets of information bits, a requested level of coding for the two or more subsets of information bits, or any combinations thereof. The operations of 1905 may be performed in accordance with examples as disclosed herein. In some examples, aspects of the operations of 1905 may be performed by a mapping manager 950 as described with reference to FIG. 9.

At 1910, the method may include identifying the set of information bits to be transmitted to a receiving device via one or more reference signals using a reference signal index modulation scheme, where the reference signal index modulation scheme uses one or more activation states of the one or more reference signal transmissions to indicate one or more transmitted bits. The operations of 1910 may be performed in accordance with examples as disclosed herein. In some examples, aspects of the operations of 1910 may be performed by an RS-IM manager 925 as described with reference to FIG. 9.

At 1915, the method may include coding the set of information bits to generate an encoded set of bits for transmission using the reference signal index modulation scheme. The operations of 1915 may be performed in accordance with examples as disclosed herein. In some examples, aspects of the operations of 1915 may be performed by an RS-IM encoder 930 as described with reference to FIG. 9.

At 1920, the method may include transmitting the encoded set of bits to the receiving device using the reference signal index modulation scheme. The operations of 1920 may be performed in accordance with examples as disclosed herein. In some examples, aspects of the operations of 1920 may be performed by a reference signal transmission manager 935 as described with reference to FIG. 9.

Figure 20:
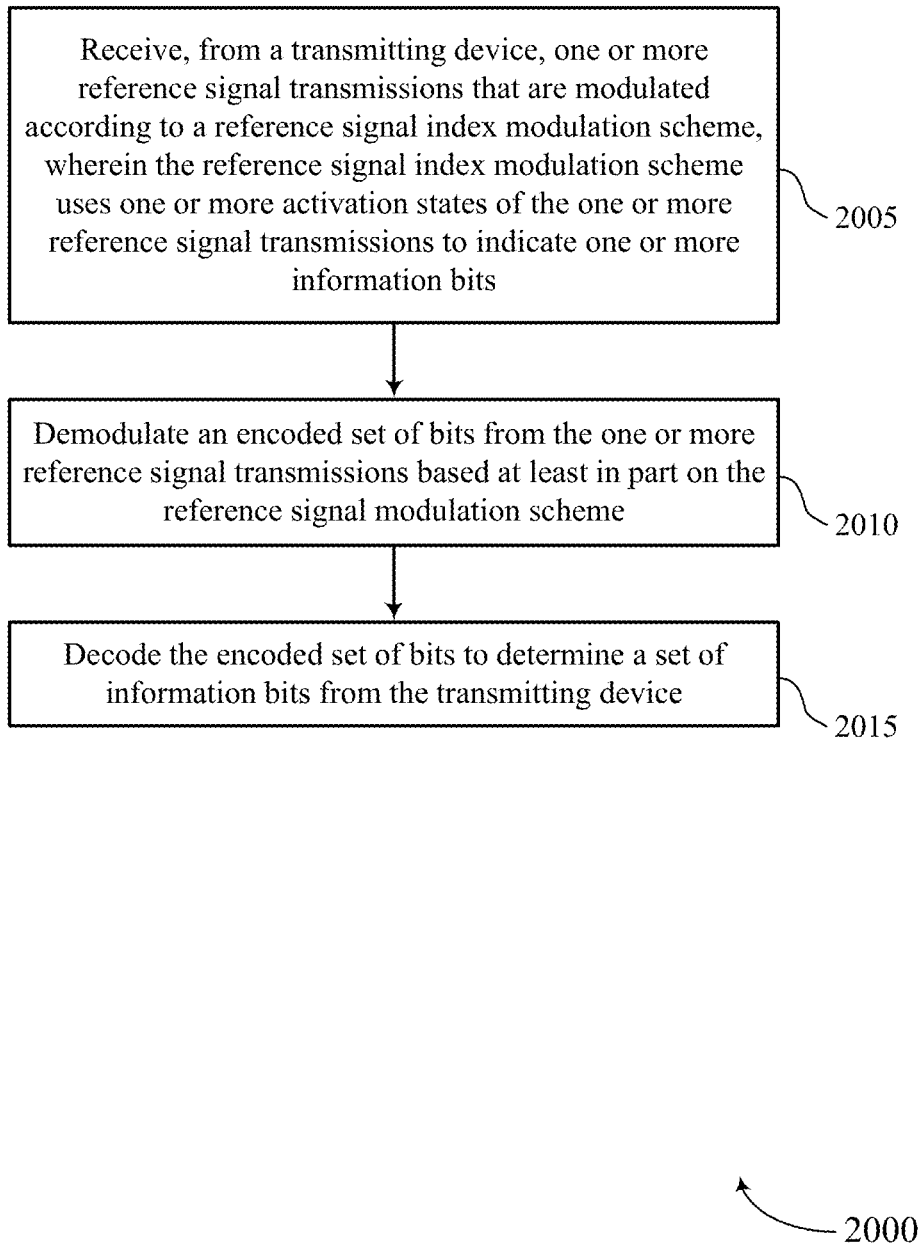

FIG. 20 shows a flowchart illustrating a method 2000 that supports coding techniques for reference signal index modulation communications in accordance with aspects of the present disclosure. The operations of the method 2000 may be implemented by a base station or a UE or its components as described herein. For example, the operations of the method 2000 may be performed by a base station 105 or a UE 115 as described with reference to FIGS. 1 through 11. In some examples, a base station or a UE may execute a set of instructions to control the functional elements of the base station or the UE to perform the described functions. Additionally or alternatively, the base station or the UE may perform aspects of the described functions using special-purpose hardware.

At 2005, the method may include receiving, from a transmitting device, one or more reference signal transmissions that are modulated according to a reference signal index modulation scheme, where the reference signal index modulation scheme uses one or more activation states of the one or more reference signal transmissions to indicate one or more information bits. The operations of 2005 may be performed in accordance with examples as disclosed herein. In some examples, aspects of the operations of 2005 may be performed by an RS-IM manager 925 as described with reference to FIG. 9.

At 2010, the method may include demodulating an encoded set of bits from the one or more reference signal transmissions based on the reference signal index modulation scheme. The operations of 2010 may be performed in accordance with examples as disclosed herein. In some examples, aspects of the operations of 2010 may be performed by a demodulation manager 940 as described with reference to FIG. 9.

At 2015, the method may include decoding the encoded set of bits to determine a set of information bits from the transmitting device. The operations of 2015 may be performed in accordance with examples as disclosed herein. In some examples, aspects of the operations of 2015 may be performed by an RS-IM decoder 945 as described with reference to FIG. 9.

Figure 21:
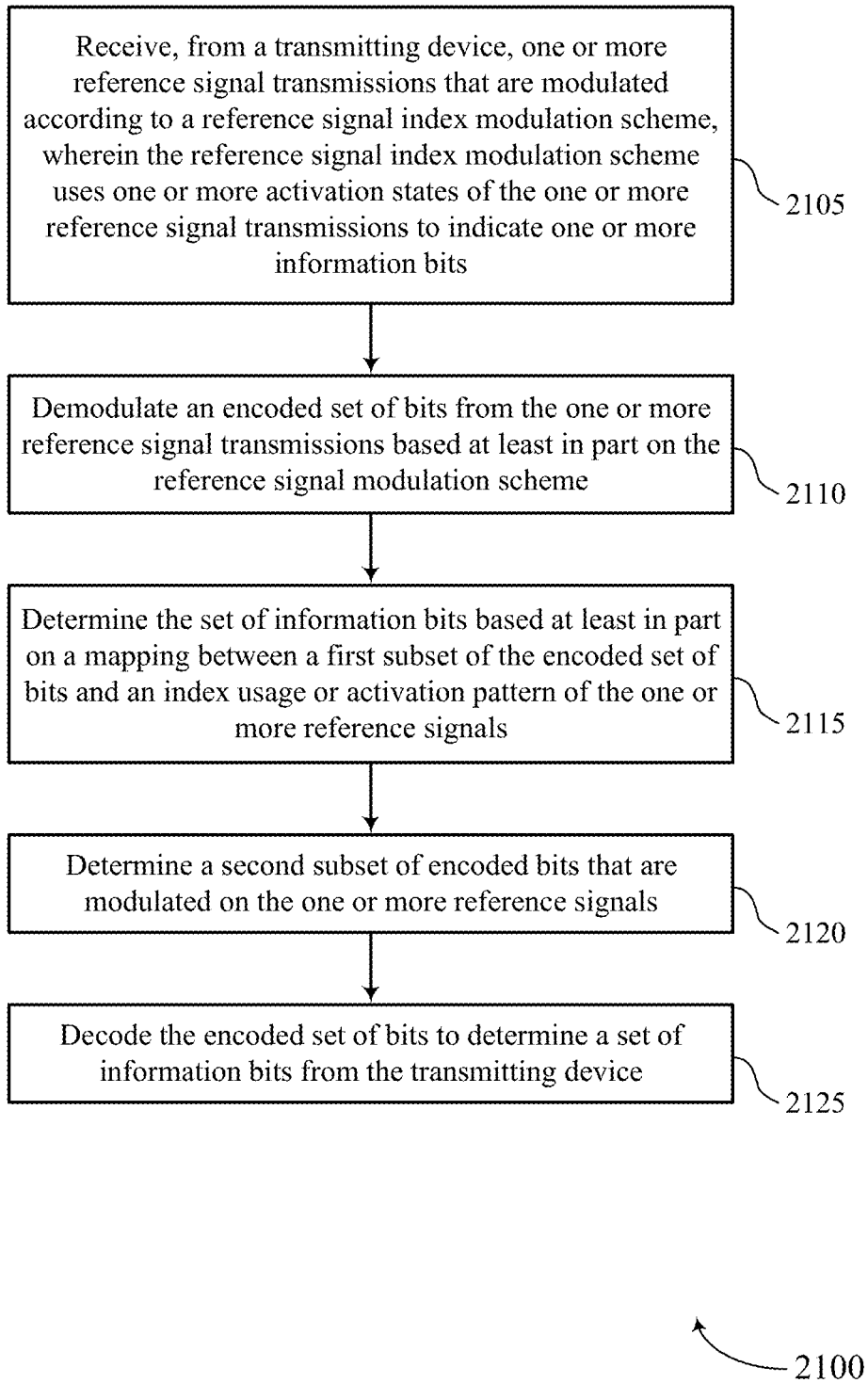

FIG. 21 shows a flowchart illustrating a method 2100 that supports coding techniques for reference signal index modulation communications in accordance with aspects of the present disclosure. The operations of the method 2100 may be implemented by a base station or a UE or its components as described herein. For example, the operations of the method 2100 may be performed by a base station 105 or a UE 115 as described with reference to FIGS. 1 through 11. In some examples, a base station or a UE may execute a set of instructions to control the functional elements of the base station or the UE to perform the described functions. Additionally or alternatively, the base station or the UE may perform aspects of the described functions using special-purpose hardware.

At 2105, the method may include receiving, from a transmitting device, one or more reference signal transmissions that are modulated according to a reference signal index modulation scheme, where the reference signal index modulation scheme uses one or more activation states of the one or more reference signal transmissions to indicate one or more information bits. The operations of 2105 may be performed in accordance with examples as disclosed herein. In some examples, aspects of the operations of 2105 may be performed by an RS-IM manager 925 as described with reference to FIG. 9.

At 2110, the method may include demodulating an encoded set of bits from the one or more reference signal transmissions based on the reference signal index modulation scheme. The operations of 2110 may be performed in accordance with examples as disclosed herein. In some examples, aspects of the operations of 2110 may be performed by a demodulation manager 940 as described with reference to FIG. 9.

At 2115, the method may include determining the set of information bits based on a mapping between a first subset of the encoded set of bits and an index usage or activation pattern of the one or more reference signals. The operations of 2115 may be performed in accordance with examples as disclosed herein. In some examples, aspects of the operations of 2115 may be performed by a mapping manager 950 as described with reference to FIG. 9.

At 2120, the method may include determining a second subset of encoded bits that are modulated on the one or more reference signals. The operations of 2120 may be performed in accordance with examples as disclosed herein. In some examples, aspects of the operations of 2120 may be performed by a mapping manager 950 as described with reference to FIG. 9.

At 2125, the method may include decoding the encoded set of bits to determine a set of information bits from the transmitting device. The operations of 2125 may be performed in accordance with examples as disclosed herein. In some examples, aspects of the operations of 2125 may be performed by an RS-IM decoder 945 as described with reference to FIG. 9.

Figure 22:
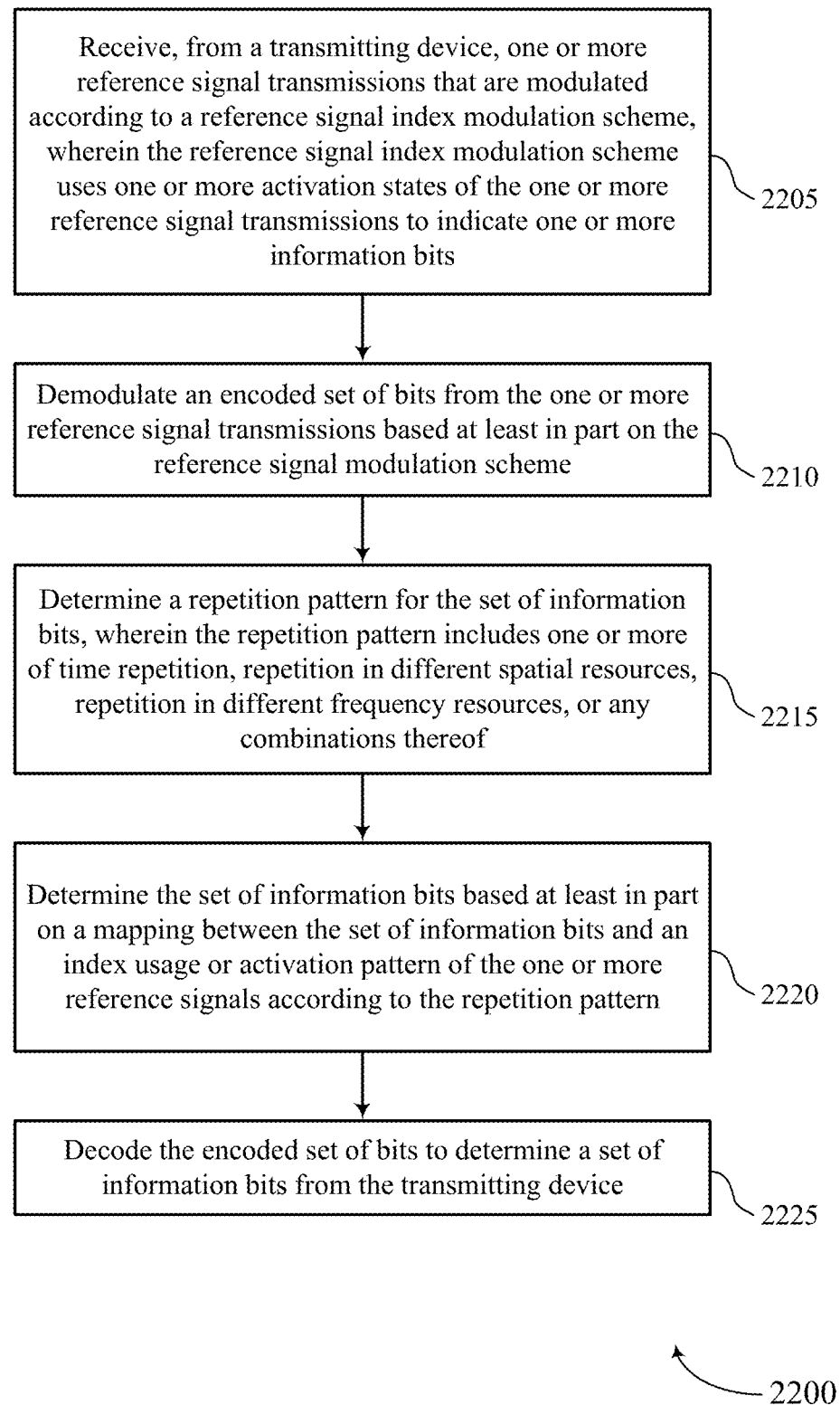

FIG. 22 shows a flowchart illustrating a method 2200 that supports coding techniques for reference signal index modulation communications in accordance with aspects of the present disclosure. The operations of the method 2200 may be implemented by a base station or a UE or its components as described herein. For example, the operations of the method 2200 may be performed by a base station 105 or a UE 115 as described with reference to FIGS. 1 through 11. In some examples, a base station or a UE may execute a set of instructions to control the functional elements of the base station or the UE to perform the described functions. Additionally or alternatively, the base station or the UE may perform aspects of the described functions using special-purpose hardware.

At 2205, the method may include receiving, from a transmitting device, one or more reference signal transmissions that are modulated according to a reference signal index modulation scheme, where the reference signal index modulation scheme uses one or more activation states of the one or more reference signal transmissions to indicate one or more information bits. The operations of 2205 may be performed in accordance with examples as disclosed herein. In some examples, aspects of the operations of 2205 may be performed by an RS-IM manager 925 as described with reference to FIG. 9.

At 2210, the method may include demodulating an encoded set of bits from the one or more reference signal transmissions based on the reference signal index modulation scheme. The operations of 2210 may be performed in accordance with examples as disclosed herein. In some examples, aspects of the operations of 2210 may be performed by a demodulation manager 940 as described with reference to FIG. 9.

At 2215, the method may include determining a repetition pattern for the set of information bits, where the repetition pattern includes one or more of time repetition, repetition in different spatial resources, repetition in different frequency resources, or any combinations thereof. The operations of 2215 may be performed in accordance with examples as disclosed herein. In some examples, aspects of the operations of 2215 may be performed by a mapping manager 950 as described with reference to FIG. 9.

At 2220, the method may include determining the set of information bits based on a mapping between the set of information bits and an index usage or activation pattern of the one or more reference signals according to the repetition pattern. The operations of 2220 may be performed in accordance with examples as disclosed herein. In some examples, aspects of the operations of 2220 may be performed by a mapping manager 950 as described with reference to FIG. 9.

At 2225, the method may include decoding the encoded set of bits to determine a set of information bits from the transmitting device. The operations of 2225 may be performed in accordance with examples as disclosed herein. In some examples, aspects of the operations of 2225 may be performed by an RS-IM decoder 945 as described with reference to FIG. 9.

Figure 23:
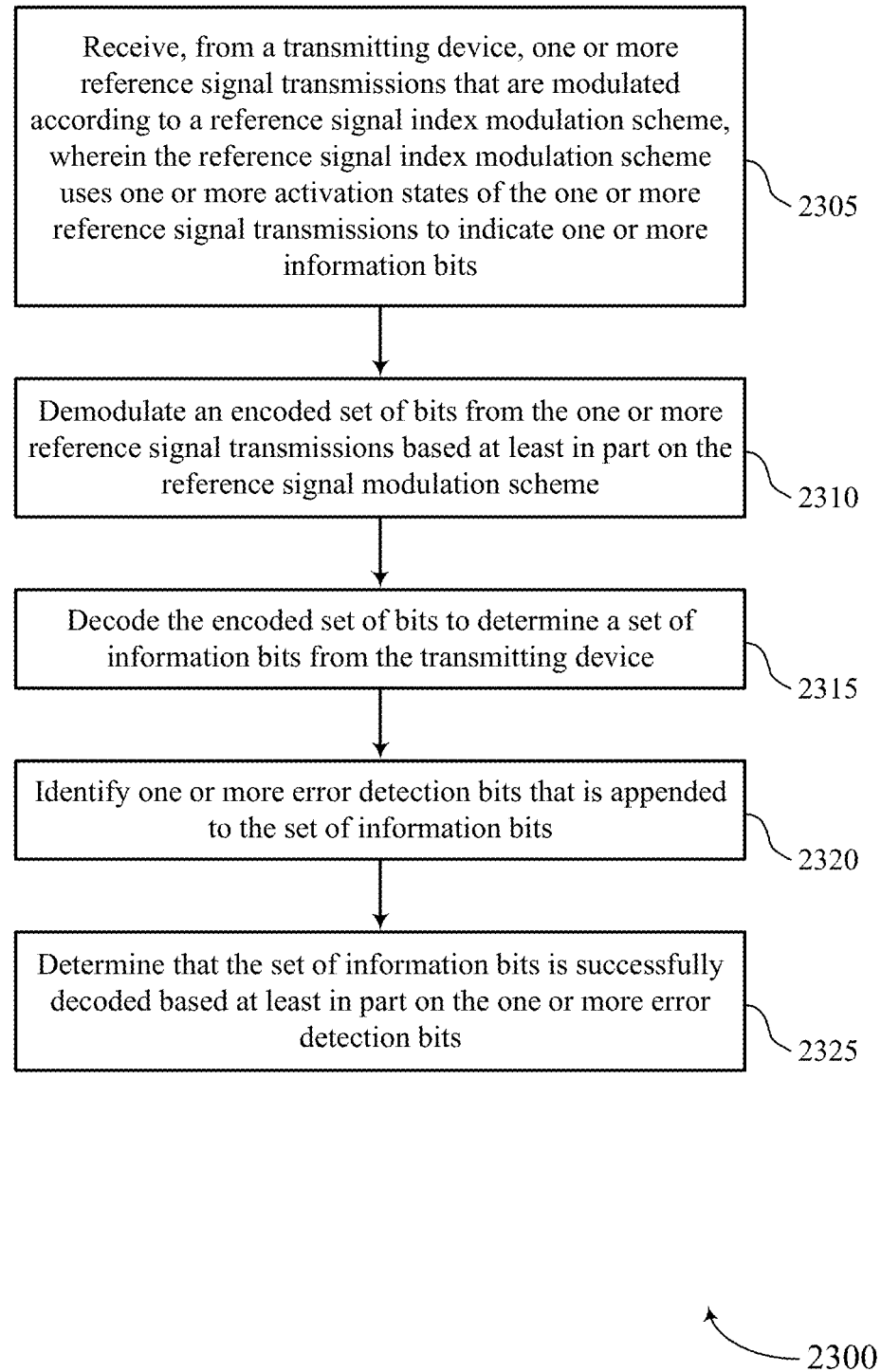

FIG. 23 shows a flowchart illustrating a method 2300 that supports coding techniques for reference signal index modulation communications in accordance with aspects of the present disclosure. The operations of the method 2300 may be implemented by a base station or a UE or its components as described herein. For example, the operations of the method 2300 may be performed by a base station 105 or a UE 115 as described with reference to FIGS. 1 through 11. In some examples, a base station or a UE may execute a set of instructions to control the functional elements of the base station or the UE to perform the described functions. Additionally or alternatively, the base station or the UE may perform aspects of the described functions using special-purpose hardware.

At 2305, the method may include receiving, from a transmitting device, one or more reference signal transmissions that are modulated according to a reference signal index modulation scheme, where the reference signal index modulation scheme uses one or more activation states of the one or more reference signal transmissions to indicate one or more information bits. The operations of 2305 may be performed in accordance with examples as disclosed herein. In some examples, aspects of the operations of 2305 may be performed by an RS-IM manager 925 as described with reference to FIG. 9.

At 2310, the method may include demodulating an encoded set of bits from the one or more reference signal transmissions based on the reference signal index modulation scheme. The operations of 2310 may be performed in accordance with examples as disclosed herein. In some examples, aspects of the operations of 2310 may be performed by a demodulation manager 940 as described with reference to FIG. 9.

At 2315, the method may include decoding the encoded set of bits to determine a set of information bits from the transmitting device. The operations of 2315 may be performed in accordance with examples as disclosed herein. In some examples, aspects of the operations of 2315 may be performed by an RS-IM decoder 945 as described with reference to FIG. 9.

At 2320, the method may include identifying one or more error detection bits that is appended to the set of information bits. The operations of 2320 may be performed in accordance with examples as disclosed herein. In some examples, aspects of the operations of 2320 may be performed by an error detection manager 960 as described with reference to FIG. 9.

At 2325, the method may include determining that the set of information bits is successfully decoded based on the one or more error detection bits. The operations of 2325 may be performed in accordance with examples as disclosed herein. In some examples, aspects of the operations of 2325 may be performed by an error detection manager 960 as described with reference to FIG. 9.

Figure 24:
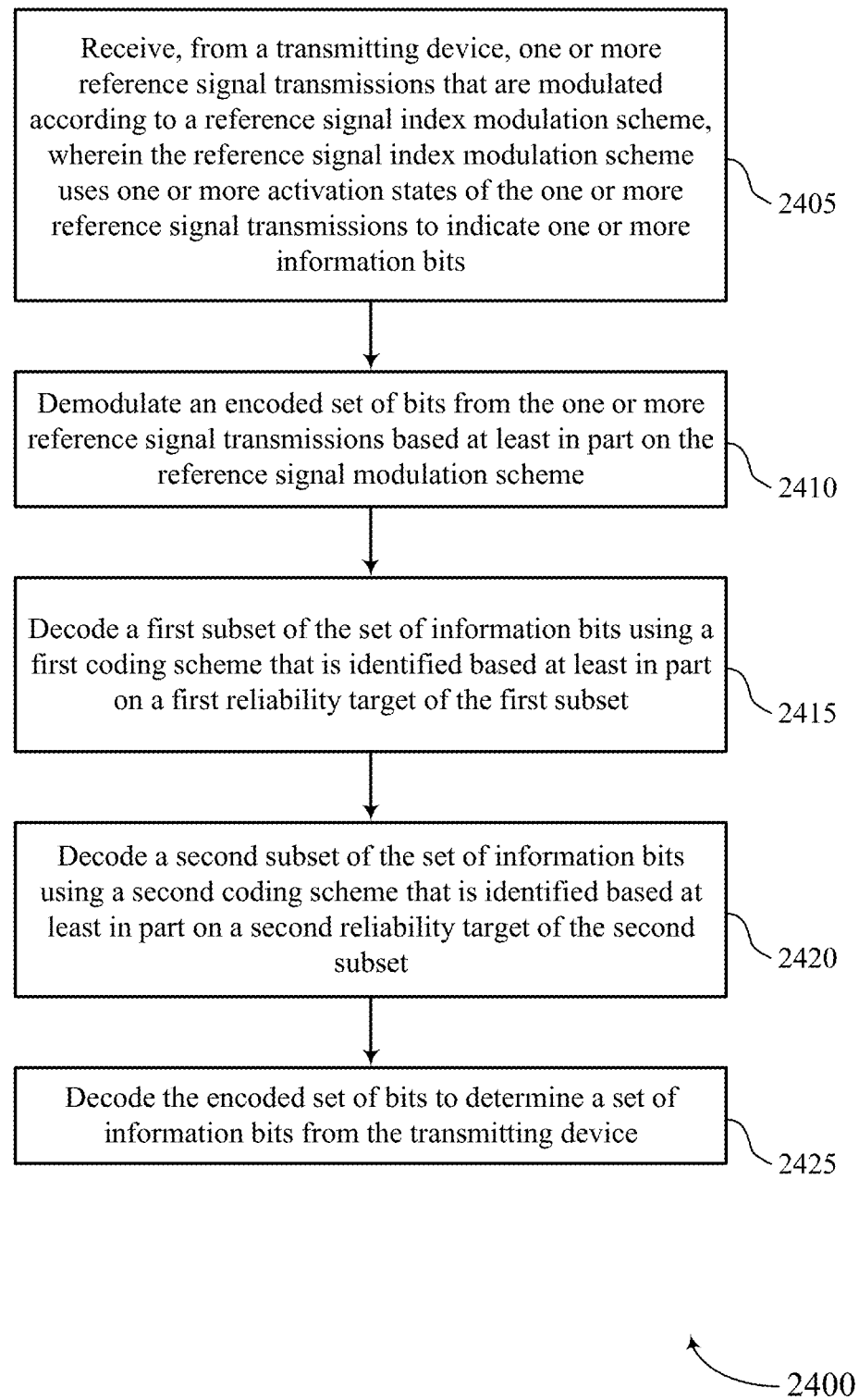

FIG. 24 shows a flowchart illustrating a method 2400 that supports coding techniques for reference signal index modulation communications in accordance with aspects of the present disclosure. The operations of the method 2400 may be implemented by a base station or a UE or its components as described herein. For example, the operations of the method 2400 may be performed by a base station 105 or a UE 115 as described with reference to FIGS. 1 through 11. In some examples, a base station or a UE may execute a set of instructions to control the functional elements of the base station or the UE to perform the described functions. Additionally or alternatively, the base station or the UE may perform aspects of the described functions using special-purpose hardware.

At 2405, the method may include receiving, from a transmitting device, one or more reference signal transmissions that are modulated according to a reference signal index modulation scheme, where the reference signal index modulation scheme uses one or more activation states of the one or more reference signal transmissions to indicate one or more information bits. The operations of 2405 may be performed in accordance with examples as disclosed herein. In some examples, aspects of the operations of 2405 may be performed by an RS-IM manager 925 as described with reference to FIG. 9.

At 2410, the method may include demodulating an encoded set of bits from the one or more reference signal transmissions based on the reference signal index modulation scheme. The operations of 2410 may be performed in accordance with examples as disclosed herein. In some examples, aspects of the operations of 2410 may be performed by a demodulation manager 940 as described with reference to FIG. 9.

At 2415, the method may include decoding a first subset of the set of information bits using a first coding scheme that is identified based on a first reliability target of the first subset. The operations of 2415 may be performed in accordance with examples as disclosed herein. In some examples, aspects of the operations of 2415 may be performed by an RS-IM decoder 945 as described with reference to FIG. 9.

At 2420, the method may include decoding a second subset of the set of information bits using a second coding scheme that is identified based on a second reliability target of the second subset. The operations of 2420 may be performed in accordance with examples as disclosed herein. In some examples, aspects of the operations of 2420 may be performed by an RS-IM decoder 945 as described with reference to FIG. 9.

At 2425, the method may include decoding the encoded set of bits to determine a set of information bits from the transmitting device. The operations of 2425 may be performed in accordance with examples as disclosed herein. In some examples, aspects of the operations of 2425 may be performed by an RS-IM decoder 945 as described with reference to FIG. 9.

Figure 25:
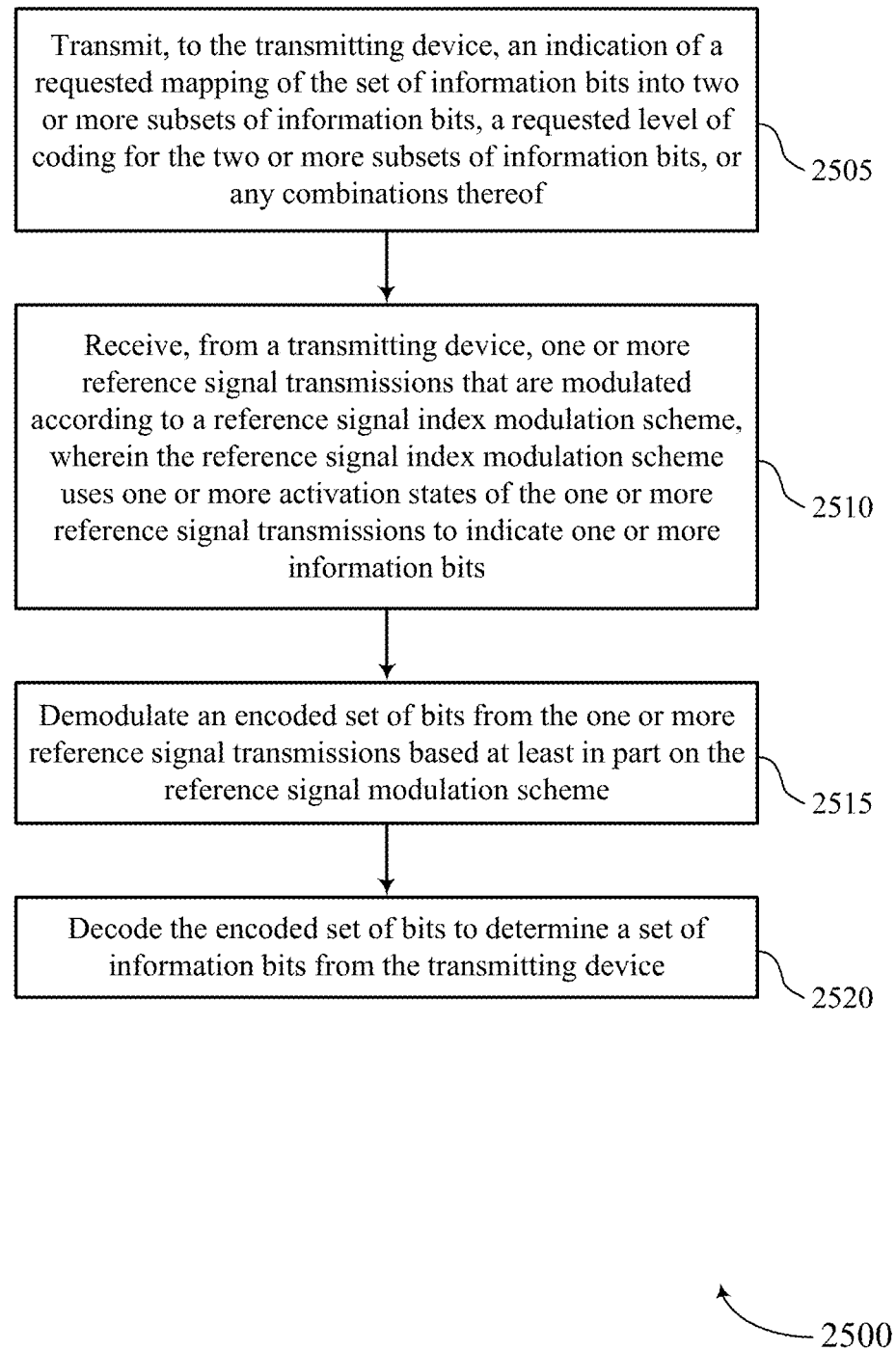

FIG. 25 shows a flowchart illustrating a method 2500 that supports coding techniques for reference signal index modulation communications in accordance with aspects of the present disclosure. The operations of the method 2500 may be implemented by a base station or a UE or its components as described herein. For example, the operations of the method 2500 may be performed by a base station 105 or a UE 115 as described with reference to FIGS. 1 through 11. In some examples, a base station or a UE may execute a set of instructions to control the functional elements of the base station or the UE to perform the described functions. Additionally or alternatively, the base station or the UE may perform aspects of the described functions using special-purpose hardware.

At 2505, the method may include transmitting, to the transmitting device, an indication of a requested mapping of the set of information bits into two or more subsets of information bits, a requested level of coding for the two or more subsets of information bits, or any combinations thereof. The operations of 2505 may be performed in accordance with examples as disclosed herein. In some examples, aspects of the operations of 2505 may be performed by a mapping manager 950 as described with reference to FIG. 9.

At 2510, the method may include receiving, from a transmitting device, one or more reference signal transmissions that are modulated according to a reference signal index modulation scheme, where the reference signal index modulation scheme uses one or more activation states of the one or more reference signal transmissions to indicate one or more information bits. The operations of 2510 may be performed in accordance with examples as disclosed herein. In some examples, aspects of the operations of 2510 may be performed by an RS-IM manager 925 as described with reference to FIG. 9.

At 2515, the method may include demodulating an encoded set of bits from the one or more reference signal transmissions based on the reference signal index modulation scheme. The operations of 2515 may be performed in accordance with examples as disclosed herein. In some examples, aspects of the operations of 2515 may be performed by a demodulation manager 940 as described with reference to FIG. 9.

At 2520, the method may include decoding the encoded set of bits to determine a set of information bits from the transmitting device. The operations of 2520 may be performed in accordance with examples as disclosed herein. In some examples, aspects of the operations of 2520 may be performed by an RS-IM decoder 945 as described with reference to FIG. 9.

It should be noted that the methods described herein describe possible implementations, and that the operations and the steps may be rearranged or otherwise modified and that other implementations are possible. Further, aspects from two or more of the methods may be combined.

The following provides an overview of aspects of the present disclosure:

Aspect 1: A method for wireless communication at a transmitting device, comprising: identifying a set of information bits to be transmitted to a receiving device via one or more reference signals using a reference signal index modulation scheme, wherein the reference signal index modulation scheme uses one or more activation states of the one or more reference signal transmissions to indicate one or more transmitted bits; coding the set of information bits to generate an encoded set of bits for transmission using the reference signal index modulation scheme; and transmitting the encoded set of bits to the receiving device using the reference signal index modulation scheme.

Aspect 2: The method of aspect 1, wherein the coding comprises: channel coding the set of information bits to generate the encoded set of bits; and providing the encoded set of bits to a reference signal index modulator to generate the one or more reference signal transmissions that indicate the encoded set of bits.

Aspect 3: The method of aspect 2, wherein the channel coding includes polar coding, convolutional coding, block coding, repetition coding, or any combinations thereof.

Aspect 4: The method of any of aspects 1 through 3, wherein the coding further comprises: mapping the encoded set of bits into two or more subsets of encoded bits including a first subset of encoded bits that are conveyed implicitly based on an index usage or activation pattern of the one or more reference signals, and a second subset of encoded bits that are modulated on the one or more reference signals.

Aspect 5: The method of any of aspects 1 through 4, wherein the coding comprises: determining a repetition pattern for the set of information bits, wherein the repetition pattern includes one or more of time repetition, repetition in different spatial resources, repetition in different frequency resources, or any combinations thereof; and mapping the set of information bits to an index usage or activation pattern of the one or more reference signals according to the repetition pattern.

Aspect 6: The method of aspect 5, wherein the one or more reference signals are transmitted using a set of reference signal resources, and wherein a first instance of a first subset of the set of information bits is transmitted using a first subset of the set of reference signal resources and a second instance of the first subset of the set of information bits is transmitted using a second subset of the set of reference signal resources.

Aspect 7: The method of any of aspects 1 through 6, wherein the coding further comprises: interleaving the encoded set of bits across a set of reference signal resources.

Aspect 8: The method of any of aspects 1 through 7, wherein the coding further comprises: appending one or more error detection bits to the set of information bits.

Aspect 9: The method of any of aspects 1 through 8, wherein the coding further comprises: coding a first subset of the set of information bits using a first coding scheme that is selected based at least in part on a first reliability target of the first subset; and coding a second subset of the set of information bits using a second coding scheme that is selected based at least in part on a second reliability target of the second subset.

Aspect 10: The method of aspect 9, wherein the first subset of the set of information bits further include one or more error detection bits that are determined based at least in part on the first reliability target, and the second subset of the set of information bits further include one or more error detection bits that are determined based at least in part on the second reliability target.

Aspect 11: The method of any of aspects 1 through 10, wherein the coding further comprises: segmenting the encoded set of bits into two or more subsets of encoded bits; and providing the two or more subsets of encoded bits to an index modulator for transmission to the receiving device using the reference signal index modulation scheme.

Aspect 12: The method of any of aspects 1 through 11, further comprising: receiving, from the receiving device, an indication of a requested mapping of the set of information bits into two or more subsets of information bits, a requested level of coding for the two or more subsets of information bits, or any combinations thereof.

Aspect 13: A method for wireless communication at a receiving device, comprising: receiving, from a transmitting device, one or more reference signal transmissions that are modulated according to a reference signal index modulation scheme, wherein the reference signal index modulation scheme uses one or more activation states of the one or more reference signal transmissions to indicate one or more information bits; demodulating an encoded set of bits from the one or more reference signal transmissions based at least in part on the reference signal index modulation scheme; and decoding the encoded set of bits to determine a set of information bits from the transmitting device.

Aspect 14: The method of aspect 13, wherein the decoding is based at least in part on a channel coding scheme applied to the set of information bits prior to being modulated according to the reference signal index modulation scheme.

Aspect 15: The method of aspect 14, wherein the channel coding scheme includes polar coding, convolutional coding, block coding, repetition coding, or any combinations thereof.

Aspect 16: The method of any of aspects 13 through 15, wherein the decoding further comprises: determining the set of information bits based at least in part on a mapping between a first subset of the encoded set of bits and an index usage or activation pattern of the one or more reference signals; and determining a second subset of encoded bits that are modulated on the one or more reference signals.

Aspect 17: The method of any of aspects 13 through 16, wherein the decoding comprises: determining a repetition pattern for the set of information bits, wherein the repetition pattern includes one or more of time repetition, repetition in different spatial resources, repetition in different frequency resources, or any combinations thereof; and determining the set of information bits based at least in part on a mapping between the set of information bits and an index usage or activation pattern of the one or more reference signals according to the repetition pattern.

Aspect 18: The method of aspect 17, wherein the one or more reference signals are transmitted using a set of reference signal resources, and wherein a first instance of a first subset of the set of information bits is transmitted using a first subset of the set of reference signal resources and a second instance of the first subset of the set of information bits is transmitted using a second subset of the set of reference signal resources.

Aspect 19: The method of any of aspects 13 through 18, wherein the decoding further comprises: deinterleaving the encoded set of bits that are interleaved across a set of reference signal resources.

Aspect 20: The method of any of aspects 13 through 19, wherein the decoding further comprises: identifying one or more error detection bits that is appended to the set of information bits; and determining that the set of information bits is successfully decoded based at least in part on the one or more error detection bits.

Aspect 21: The method of any of aspects 13 through 20, wherein the decoding further comprises: decoding a first subset of the set of information bits using a first coding scheme that is identified based at least in part on a first reliability target of the first subset; and decoding a second subset of the set of information bits using a second coding scheme that is identified based at least in part on a second reliability target of the second subset.

Aspect 22: The method of aspect 21, wherein the first subset of the set of information bits further include one or more error detection bits that are based at least in part on the first reliability target, and the second subset of the set of information bits further include one or more error detection bits that are based at least in part on the second reliability target.

Aspect 23: The method of any of aspects 13 through 22, wherein the encoded set of bits are segmented into two or more subsets of encoded bits that are modulated according to the reference signal index modulation scheme.

Aspect 24: The method of any of aspects 13 through 23, further comprising: transmitting, to the transmitting device, an indication of a requested mapping of the set of information bits into two or more subsets of information bits, a requested level of coding for the two or more subsets of information bits, or any combinations thereof.

Aspect 25: An apparatus for wireless communication at a transmitting device, comprising a processor; memory coupled with the processor; and instructions stored in the memory and executable by the processor to cause the apparatus to perform a method of any of aspects 1 through 12.

Aspect 26: An apparatus for wireless communication at a transmitting device, comprising at least one means for performing a method of any of aspects 1 through 12.

Aspect 27: A non-transitory computer-readable medium storing code for wireless communication at a transmitting device, the code comprising instructions executable by a processor to perform a method of any of aspects 1 through 12.

Aspect 28: An apparatus for wireless communication at a receiving device, comprising a processor; memory coupled with the processor; and instructions stored in the memory and executable by the processor to cause the apparatus to perform a method of any of aspects 13 through 24.

Aspect 29: An apparatus for wireless communication at a receiving device, comprising at least one means for performing a method of any of aspects 13 through 24.

Aspect 30: A non-transitory computer-readable medium storing code for wireless communication at a receiving device, the code comprising instructions executable by a processor to perform a method of any of aspects 13 through 24.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method for wireless communication at a transmitting device, comprising:
   identifying a set of information bits to be transmitted to a receiving device via one or more reference signals using a reference signal index modulation scheme, wherein the reference signal index modulation scheme uses one or more activation states of the one or more reference signal transmissions to indicate one or more transmitted bits;
   coding the set of information bits to generate an encoded set of bits for transmission using the reference signal index modulation scheme, the encoded set of bits including two or more subsets of encoded bits; and
   transmitting the encoded set of bits to the receiving device using the reference signal index modulation scheme.

2. The method of claim 1, wherein the coding comprises:
   channel coding the set of information bits to generate the encoded set of bits; and
   providing the encoded set of bits to a reference signal index modulator to generate the one or more reference signal transmissions that indicate the encoded set of bits.

3. The method of claim 2, wherein the channel coding includes polar coding, convolutional coding, block coding, repetition coding, or any combinations thereof.

4. The method of claim 1, wherein the coding further comprises:
   mapping the encoded set of bits into the two or more subsets of encoded bits, the two or more subsets of encoded bits including a first subset of encoded bits that are conveyed implicitly based on an index usage or activation pattern of the one or more reference signals, and a second subset of encoded bits that are modulated on the one or more reference signals.

5. The method of claim 1, wherein the coding comprises:
   determining a repetition pattern for the set of information bits, wherein the repetition pattern includes one or more of time repetition, repetition in different spatial resources, repetition in different frequency resources, or any combinations thereof; and
   mapping the set of information bits to an index usage or activation pattern of the one or more reference signals according to the repetition pattern.

6. The method of claim 5, wherein the one or more reference signals are transmitted using a set of reference signal resources, and wherein a first instance of a first subset of the set of information bits is transmitted using a first subset of the set of reference signal resources and a second instance of the first subset of the set of information bits is transmitted using a second subset of the set of reference signal resources.

7. The method of claim 1, wherein the coding further comprises:
   interleaving the encoded set of bits across a set of reference signal resources.

8. The method of claim 1, wherein the coding further comprises:
   appending one or more error detection bits to the set of information bits.

9. The method of claim 1, wherein the coding further comprises:
   coding a first subset of the set of information bits using a first coding scheme that is selected based at least in part on a first reliability target of the first subset; and
   coding a second subset of the set of information bits using a second coding scheme that is selected based at least in part on a second reliability target of the second subset.

10. The method of claim 9, wherein:
    the first subset of the set of information bits further include one or more error detection bits that are determined based at least in part on the first reliability target, and
    the second subset of the set of information bits further include one or more error detection bits that are determined based at least in part on the second reliability target.

11. The method of claim 1, wherein the coding further comprises:
    segmenting the encoded set of bits into the two or more subsets of encoded bits; and
    providing the two or more subsets of encoded bits to an index modulator for transmission to the receiving device using the reference signal index modulation scheme.

12. The method of claim 1, further comprising:
    receiving, from the receiving device, an indication of a requested mapping of the set of information bits into two or more subsets of information bits, a requested level of coding for the two or more subsets of information bits, or any combinations thereof.

13. A method for wireless communication at a receiving device, comprising:
    receiving, from a transmitting device, one or more reference signal transmissions that are modulated according to a reference signal index modulation scheme, wherein the reference signal index modulation scheme uses one or more activation states of the one or more reference signal transmissions to indicate one or more information bits;
    demodulating an encoded set of bits from the one or more reference signal transmissions based at least in part on the reference signal index modulation scheme, the encoded set of bits including two or more subsets of encoded bits; and
    decoding the encoded set of bits to determine a set of information bits from the transmitting device.

14. The method of claim 13, wherein the decoding is based at least in part on a channel coding scheme applied to the set of information bits prior to being modulated according to the reference signal index modulation scheme.

15. The method of claim 14, wherein the channel coding scheme includes polar coding, convolutional coding, block coding, repetition coding, or any combinations thereof.

16. The method of claim 13, wherein the decoding further comprises:
    determining the set of information bits based at least in part on a mapping between a first subset of the two or more subsets of encoded set of bits and an index usage or activation pattern of the one or more reference signals; and determining a second subset of the two or more subsets of encoded bits that are modulated on the one or more reference signals.

17. The method of claim 13, wherein the decoding comprises:
determining a repetition pattern for the set of information bits, wherein the repetition pattern includes one or more of time repetition, repetition in different spatial resources, repetition in different frequency resources, or any combinations thereof; and
determining the set of information bits based at least in part on a mapping between the set of information bits and an index usage or activation pattern of the one or more reference signals according to the repetition pattern.

18. The method of claim 17, wherein the one or more reference signals are transmitted using a set of reference signal resources, and wherein a first instance of a first subset of the set of information bits is transmitted using a first subset of the set of reference signal resources and a second instance of the first subset of the set of information bits is transmitted using a second subset of the set of reference signal resources.

19. The method of claim 13, wherein the decoding further comprises:
deinterleaving the encoded set of bits that are interleaved across a set of reference signal resources.

20. The method of claim 13, wherein the decoding further comprises:
identifying one or more error detection bits that is appended to the set of information bits; and
determining that the set of information bits is successfully decoded based at least in part on the one or more error detection bits.

21. The method of claim 13, wherein the decoding further comprises:
decoding a first subset of the set of information bits using a first coding scheme that is identified based at least in part on a first reliability target of the first subset; and
decoding a second subset of the set of information bits using a second coding scheme that is identified based at least in part on a second reliability target of the second subset.

22. The method of claim 21, wherein:
the first subset of the set of information bits further include one or more error detection bits that are based at least in part on the first reliability target, and
the second subset of the set of information bits further include one or more error detection bits that are based at least in part on the second reliability target.

23. The method of claim 13, wherein the two or more subsets of encoded bits are modulated according to the reference signal index modulation scheme.

24. The method of claim 13, further comprising:
transmitting, to the transmitting device, an indication of a requested mapping of the set of information bits into two or more subsets of information bits, a requested level of coding for the two or more subsets of information bits, or any combinations thereof.

25. An apparatus for wireless communication at a transmitting device, comprising:
a processor;
memory coupled with the processor; and
instructions stored in the memory and executable by the processor to cause the apparatus to:
identify a set of information bits to be transmitted to a receiving device via one or more reference signals using a reference signal index modulation scheme, wherein the reference signal index modulation scheme uses one or more activation states of the one or more reference signal transmissions to indicate one or more transmitted bits;
code the set of information bits to generate an encoded set of bits for transmission using the reference signal index modulation scheme, the encoded set of bits including two or more subsets of encoded bits; and
transmit the encoded set of bits to the receiving device using the reference signal index modulation scheme.

26. The apparatus of claim 25, wherein the instructions are further executable by the processor to cause the apparatus to:
channel code the set of information bits to generate the encoded set of bits; and
provide the encoded set of bits to a reference signal index modulator to generate the one or more reference signal transmissions that indicate the encoded set of bits.

27. The apparatus of claim 25, wherein the instructions are further executable by the processor to cause the apparatus to:
map the encoded set of bits into the two or more subsets of encoded bits, the two or more subsets of encoded bits including a first subset of encoded bits that are conveyed implicitly based on an index usage or activation pattern of the one or more reference signals, and a second subset of encoded bits that are modulated on the one or more reference signals.

28. An apparatus for wireless communication at a receiving device, comprising:
a processor;
memory coupled with the processor; and
instructions stored in the memory and executable by the processor to cause the apparatus to:
receive, from a transmitting device, one or more reference signal transmissions that are modulated according to a reference signal index modulation scheme, wherein the reference signal index modulation scheme uses one or more activation states of the one or more reference signal transmissions to indicate one or more information bits;
demodulate an encoded set of bits from the one or more reference signal transmissions based at least in part on the reference signal index modulation scheme, the encoded set of bits including two or more subsets of encoded bits; and
decode the encoded set of bits to determine a set of information bits from the transmitting device.

29. The apparatus of claim 28, wherein the decoding is based at least in part on a channel coding scheme applied to the set of information bits prior to being modulated according to the reference signal index modulation scheme.

30. The apparatus of claim 28, wherein the instructions are further executable by the processor to cause the apparatus to:
transmit, to the transmitting device, an indication of a requested mapping of the set of information bits into two or more subsets of information bits, a requested level of coding for the two or more subsets of information bits, or any combinations thereof.

* * * * *